(12) United States Patent
Lee et al.

(10) Patent No.: US 11,730,031 B2
(45) Date of Patent: Aug. 15, 2023

(54) DISPLAY DEVICE

(71) Applicant: Samsung Display Co., Ltd., Yongin-si (KR)

(72) Inventors: Ji Hye Lee, Hwaseong-si (KR); Kyung Bae Kim, Seongnam-si (KR); No Kyung Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 17/243,544

(22) Filed: Apr. 28, 2021

(65) Prior Publication Data

US 2021/0376045 A1    Dec. 2, 2021

(30) Foreign Application Priority Data

May 29, 2020  (KR) .................. 10-2020-0065039

(51) Int. Cl.
*H01L 21/00*   (2006.01)
*H10K 59/131*  (2023.01)
*H10K 59/121*  (2023.01)
*H10K 59/122*  (2023.01)

(52) U.S. Cl.
CPC ......... *H10K 59/131* (2023.02); *H10K 59/121* (2023.02); *H10K 59/122* (2023.02)

(58) Field of Classification Search
CPC ................................................. H10K 59/131
See application file for complete search history.

(56) References Cited

U.S. PATENT DOCUMENTS

2020/0075667 A1\* 3/2020 Lee ................. H01L 27/156
2020/0403129 A1  12/2020 Lee et al.
2021/0335883 A1\* 10/2021 Park ................ H01L 25/0753
2021/0376281 A1\* 12/2021 Kim ................. H10K 59/131

FOREIGN PATENT DOCUMENTS

KR    10-2019-0121894 A    10/2019

\* cited by examiner

*Primary Examiner* — Douglas M Menz
(74) *Attorney, Agent, or Firm* — Lewis Roca Rothgerber Christie LLP

(57) ABSTRACT

A display device comprises a pixel which comprises emission areas, a first voltage wiring and a second voltage wiring, which are outside the emission areas of the pixel and extend in a first direction and a second direction crossing the first direction, first electrodes and second electrodes which are respectively in the emission areas and extend in one direction, light emitting elements which are on the first and second electrodes, first contact electrodes which contact the first electrodes and the light emitting elements, and second contact electrodes which contact the second electrodes and the light emitting elements, and a first electrode line which overlaps the first voltage wiring and is outside the emission areas and a second electrode line which overlaps the second voltage wiring and is outside the emission areas, wherein each of the first electrodes and the first electrode line is electrically connected to the first voltage wiring, and each of the second electrodes and the second electrode line is electrically connected to the second voltage wiring.

20 Claims, 27 Drawing Sheets

PX#A : PX#1,PX#3,PX#4,PX#6
PX#D : PX#2,PX#5

DISPLAY DEVICE

CROSS-REFERENCE TO RELATED APPLICATION

This application claims priority to and the benefit of Korean Patent Application No. 10-2020-0065039 filed on May 29, 2020 in the Korean Intellectual Property Office, the entire content of which is herein incorporated by reference.

BACKGROUND

1. Field

One or more embodiments of the present disclosure relate to a display device.

2. Description of the Related Art

Display devices are becoming increasingly important with the development of multimedia. Accordingly, various types of display devices, such as organic light emitting displays and/or liquid crystal displays, are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material, or may be inorganic LEDs using an inorganic material as the fluorescent material.

SUMMARY

One or more aspects of embodiments of the present disclosure provide a display device manufactured by a reduced number of processes by forming a wiring, to which a voltage is applied, using a conductive layer (positioned) under the wiring.

One or more aspects of embodiments of the present disclosure also provide a display device in which alignment of light emitting elements in an unwanted (undesirable) area during a manufacturing process can be prevented or reduced by placing the above wiring outside emission areas.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a display device comprises a pixel which comprises emission areas; a first voltage wiring and a second voltage wiring outside the emission areas of the pixel, and extending both in a first direction and a second direction crossing the first direction; first electrodes and second electrodes in the emission areas and extending in one direction; light emitting elements on the first electrodes and the second electrodes; first contact electrodes contacting the first electrodes and the light emitting elements; second contact electrodes contacting the second electrodes and the light emitting elements; a first electrode line overlapping the first voltage wiring and being outside the emission areas; and a second electrode line overlapping the second voltage wiring and being outside the emission areas, wherein the first electrodes and the first electrode line are electrically connected to the first voltage wiring, and the second electrodes and the second electrode line are electrically connected to the second voltage wiring.

The first voltage wiring may comprise a first wiring horizontal portion extending in the first direction, and a first wiring vertical portion extending in the second direction, and the second voltage wiring may comprise a second wiring horizontal portion extending in the first direction, and a second wiring vertical portion extending in the second direction.

The first wiring vertical portion may be on a different conductive layer than the first wiring horizontal portion, and the second wiring vertical portion may be on a different conductive layer than the second wiring horizontal portion.

The display device may further comprise a first wiring contact hole at an intersection of the first wiring horizontal portion and the first wiring vertical portion; and a second wiring contact hole at an intersection of the second wiring horizontal portion and the second wiring vertical portion.

The first wiring vertical portion may be on a side of the emission areas in the first direction, the second wiring vertical portion may be on another side of the emission areas in the first direction, the second wiring horizontal portion may be on a side of the emission areas in the second direction, and the first wiring horizontal portion may be on another side of the emission areas in the second direction.

The first electrode line may overlap the first wiring vertical portion in a thickness direction of the display device, the second electrode line may overlap the second wiring vertical portion in the thickness direction, and the second electrodes may be directly connected to the second electrode line.

The first electrodes and the second electrodes may extend in the first direction, and the first electrodes may be spaced apart from the first electrode line, and may be electrically connected to the first voltage wiring through a first electrode contact hole.

The display device may further comprise a first conductive pattern overlapping the first wiring vertical portion and connected to the first wiring vertical portion, and a second conductive pattern overlapping the second wiring vertical portion and connected to the second wiring vertical portion, wherein the second electrode line may contact the second conductive pattern through a second electrode contact hole overlapping the second conductive pattern, and the first electrode line may contact the first conductive pattern through a third electrode contact hole overlapping the first conductive pattern.

The first electrode line may comprise a first electrode stem portion extending in the second direction, and a first electrode branch portion branching from the first electrode stem portion in the first direction; the second electrode line may comprise a second electrode stem portion extending in the second direction, and a second electrode branch portion branching from the second electrode stem portion in the first direction; and the first electrode branch portion and the second electrode branch portion may respectively overlap the first wiring horizontal portion and the second wiring horizontal portion in the thickness direction.

The first electrodes and the second electrodes may extend in the second direction, the second electrodes may be directly connected to the second electrode branch portion, and the first electrodes may be spaced apart from the first electrode branch portion.

The display device may further comprise cut areas spaced apart from the emission areas in the one direction in which the first electrodes and the second electrodes extend, wherein the first electrodes and the first electrode line may be spaced apart with the cut areas therebetween.

The display device may further comprise first banks in the emission areas and extending in the one direction in which the first electrodes and the second electrodes extend; and a second bank surrounding the emission areas, wherein the first voltage wiring and the second voltage wiring may overlap the second bank in the thickness direction.

The emission areas may comprise a first emission area, a second emission area, and a third emission area spaced apart from each other, the first electrodes and the second electrodes may be respectively in the first emission area, the second emission area, and the third emission area, and the second electrodes that are respectively in the emission areas may be directly connected to the same second electrode line.

According to some embodiments of the present disclosure, a display device comprises pixels arranged in a first direction in pixel rows, and in a second direction in pixel columns, the second direction crossing the first direction, the pixels comprising emission areas; a first voltage wiring and a second voltage wiring between the pixel columns and the pixel rows, and extending in the first direction and the second direction; a first electrode line overlapping the first voltage wiring and connected to the first voltage wiring; and a second electrode line overlapping the second voltage wiring and connected to the second voltage wiring; first electrodes and second electrodes in the emission areas of the pixels and extending in one direction; and light emitting elements having first ends respectively on the first electrodes, and second ends respectively on the second electrodes, wherein the first electrodes are spaced apart from the first electrode line, the second electrodes are connected to the second electrode line, and the pixels comprise first type pixels in which the first ends of the light emitting elements face a first side of the first direction, and the first electrodes are spaced apart from the second electrodes in the first direction.

The first type pixels may be in the second direction in a first pixel column, and the pixels may further comprise second type pixels in a second pixel column, in which the first ends of the light emitting elements face a second side of the first direction, the second side facing oppositely away from the first side of the first direction, the second type pixels being symmetrical to the first type pixels in arrangement of the first electrodes and the second electrodes with respect to a first imaginary line extending in the second direction.

The pixels may further comprise third type pixels in which the first ends of the light emitting elements face the first side of the first direction, the third type pixels being symmetrical to the first type pixels in arrangement of the first electrodes and the second electrodes with respect to a second imaginary line extending in the first direction; and fourth type pixels in which the first ends of the light emitting elements face the second side of the first direction, the fourth type pixels being symmetrical to the second type pixels in arrangement of the first electrodes and the second electrodes with respect to the second imaginary line extending in the first direction.

The first electrodes of the first type pixels and of the second type pixels may be respectively side by side in the second direction with the first electrodes of the third type pixels and of the fourth type pixels.

The first type pixels and the third type pixels may alternate along the second direction in the first pixel column, and the second type pixels and the fourth type pixels may alternate along the second direction in the second pixel column.

The first type pixels and the fourth type pixels may alternate along the second direction in the first pixel column, and the second type pixels and the third type pixels may alternate along the second direction in the second pixel column.

The first type pixels and the fourth type pixels may alternate along the second direction in the first pixel column and the second pixel column.

BRIEF DESCRIPTION OF THE DRAWINGS

The above and other aspects and features of the present disclosure will become more apparent by describing in more detail some embodiments thereof with reference to the attached drawings, in which.

DETAILED DESCRIPTION

Figure 1:
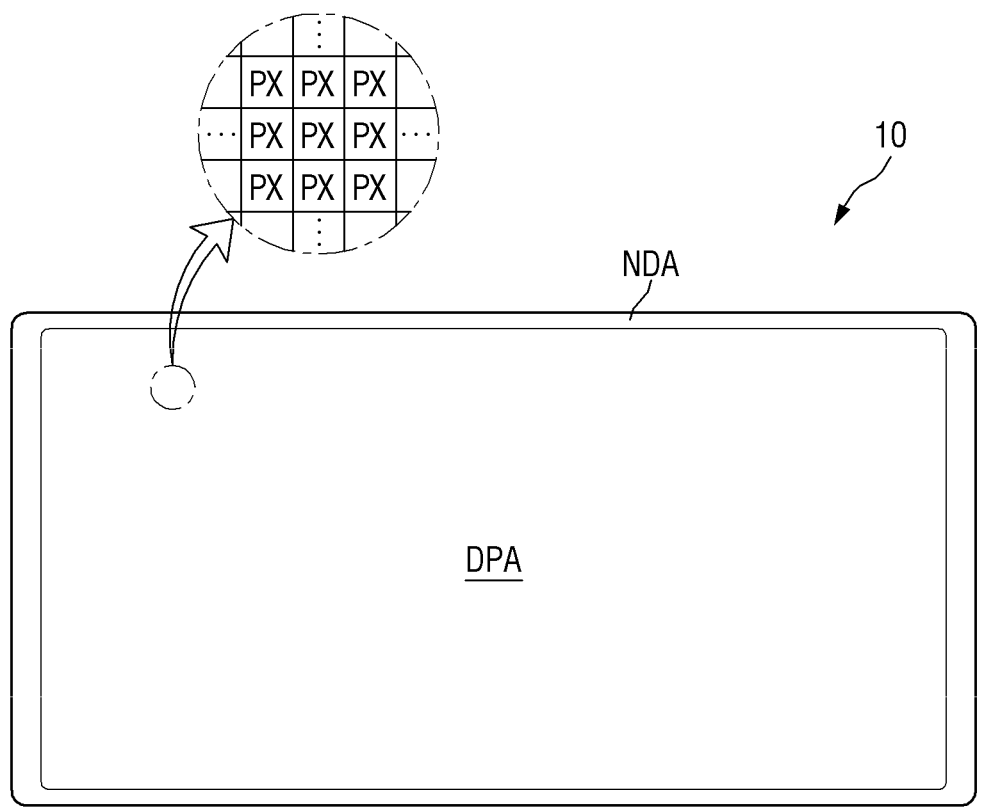
FIG. 1 is a schematic plan view of a display device according to some embodiments.
Figure 1:
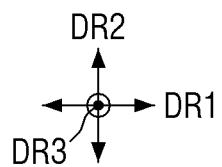

The present disclosure will now be described more fully hereinafter with reference to the accompanying drawings, in which some embodiments of the present disclosure are shown. The disclosed embodiments may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The device and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the disclosed embodiments.

Hereinafter, embodiments will be described with reference to the attached drawings.

FIG. 1 is a schematic plan view of a display device 10 according to some embodiments.

In the present specification, "above," "top," and "upper surface" indicate an upward direction from the display device 10, that is, a direction along a third direction DR3; and "under," "bottom," and "lower surface" indicate a downward direction from the display device 10, that is, a direction opposite of the third direction DR3. In some embodiments, "left," "right," "upper," and "lower" indicate directions when the display device 10 is seen in plan view. For example, "left" indicates a direction along a first direction DR1, "right" indicates a direction opposite of the first direction DR1, "upper" indicates a direction along a second direction DR2, and "lower" indicates a direction opposite of the second direction DR2.

Referring to FIG. 1, the display device 10 can display moving images and/or still images. The display device 10 may refer to any suitable electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode display panels, organic light emitting display panels, quantum dot light emitting display panels, plasma display panels, and field emission display panels, without limitation. Some embodiments in which an inorganic light emitting diode display panel is applied as an example of the display panel will be described below, but the present disclosure is not limited to this example, and other display panels can also be applied as long as the same technical spirit is applicable.

The shape of the display device 10 can be variously suitably modified. For example, the display device 10 may have various suitable shapes such as a horizontally long rectangle, a vertically long rectangle, a square, a quadrangle with rounded corners (vertices), other polygons, and/or a circle. The shape of a display area DPA of the display device 10 may also be similar to the overall shape of the display device 10. In FIG. 1, each of the display device 10 and the display area DPA is in the shape of a horizontally long rectangle.

The display device 10 may include the display area DPA and a non-display area NDA. The display area DPA may be an area where a screen (image) can be displayed, and the non-display area NDA may be an area where no screen (image) is displayed. The display area DPA may also be referred to as an active area, and the non-display area NDA may also be referred to as an inactive area. The display area DPA may generally (substantially) occupy a center of the display device 10.

The display area DPA may include a plurality of pixels PX. The pixels PX may be arranged in a matrix orientation. Each of the pixels PX may be rectangular or square in plan view. However, the present disclosure is not limited thereto, and each of the pixels PX may have a rhombic planar shape having each side inclined with respect to a direction (e.g., with respect to DR1 and/or DR2 directions). The pixels PX may be alternately arranged in either a stripe or PenTile®/ PENTILE® fashion or pattern (PENTILE® is a registered trademark owned by Samsung Display Co., Ltd.). In some embodiments, each of the pixels PX may include one or more light emitting elements ED which emit light of a specific (or set) wavelength band to display a specific (or set) color.

The non-display area NDA may be provided around the display area DPA. The non-display area NDA may entirely or partially surround the display area DPA. The display area DPA may be rectangular, and the non-display area NDA may be adjacent to four sides of the display area DPA. The non-display area NDA may form a bezel of the display device 10. In each non-display area NDA, wirings or circuit drivers included in the display device 10 may be provided, and/or external devices may be mounted.

Figure 2:
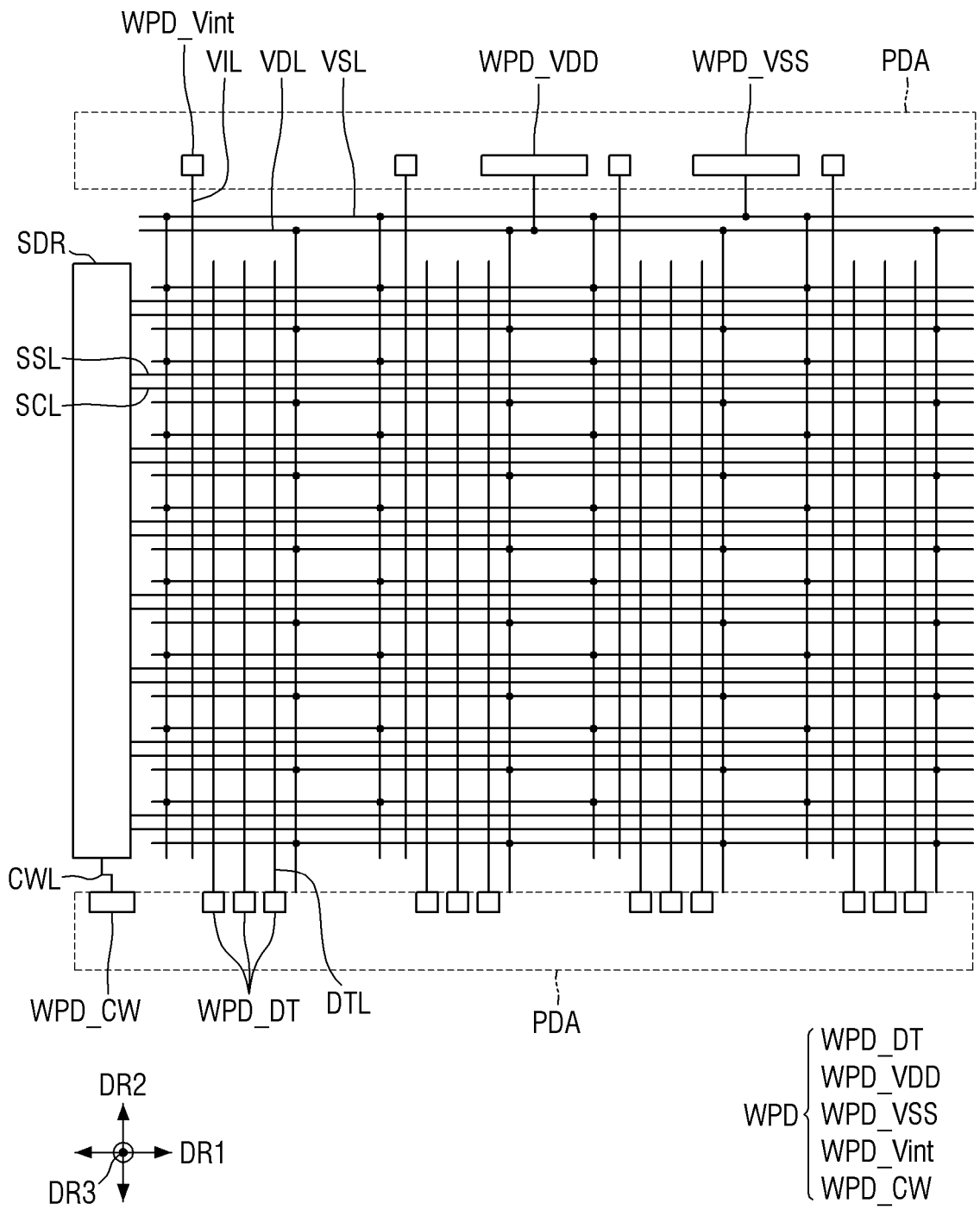
FIG. 2 is a schematic layout view of wirings included in the display device according to some embodiments.

FIG. 2 is a schematic layout view of wirings included in the display device 10 according to some embodiments.

Referring to FIG. 2, the display device 10 may include a plurality of wirings. The wirings may include scan lines SCL, sensing lines SSL, data lines DTL, initialization voltage wirings VIL, a first voltage wiring VDL, and a second voltage wiring VSL. In some embodiments, other wirings may be further included in the display device 10.

The scan lines SCL and the sensing lines SSL may extend in the first direction DR1. The scan lines SCL and the sensing lines SSL may be connected to a scan driver SDR. The scan driver SDR may include a driving circuit. The scan driver SDR may be on a side of the display area DPA in the first direction DR1, but the present disclosure is not limited thereto. The scan driver SDR may be connected to a signal wiring pattern CWL, and at least one end of the signal wiring pattern CWL may form a pad WPD_CW in the non-display area NDA to be connected to an external device.

In the present specification, the term "connect" may mean that any one member and another member are connected (e.g., coupled) to each other either through direct physical contact or through another member. In addition, it can be understood that any one portion (or member) and another portion (or member) may be connected to each other as one integrated member. Further, when any one member and another member are connected, it can be interpreted to include electrical connection through another member and/ or connection through direct contact.

The data lines DTL and the initialization voltage wirings VIL may extend in the second direction DR2 intersecting the first direction DR1. The first voltage wiring VDL and the second voltage wiring VSL extend in the first direction DR1 and the second direction DR2. As will be described hereinbelow, each of the first voltage wiring VDL and the second voltage wiring VSL may have a portion extending in the first direction DR1 and a portion extending in the second direction DR2, which are made of conductive layers positioned on different layers (or levels), and may have a mesh structure in the entire display area DPA. However, the present disclosure is not limited thereto. Each pixel PX of the display device 10 may be connected to at least one data line DTL, an initialization voltage wiring VIL, the first voltage wiring VDL, and the second voltage wiring VSL.

Each of the data lines DTL, the initialization voltage wirings VIL, the first voltage wiring VDL and the second voltage wiring VSL may be electrically connected to at least one wiring pad WPD. Each wiring pad WPD may be provided in the non-display area NDA. In some embodiments, wiring pads WPD_DT (hereinafter, referred to as 'data pads') of the data lines DTL may be in a pad area PDA on one side of the display area DPA in the second direction DR2, and wiring pads WPD_Vint (hereinafter, referred to as 'initialization voltage pads') of the initialization voltage wirings VIL, a wiring pad WPD_VDD (hereinafter, referred to as a 'first power pad') of the first voltage wiring VDL and a wiring pad WPD_VSS (hereinafter, referred to as a 'second power pad') of the second voltage wiring VSL may be in the pad area PDA located on the other side of the display area DPA in the second direction DR2. In some embodiments, the data pads WPD_DT, the initialization voltage pads WPD_Vint, the first power pad WPD_VDD, and the second power pad WPD_VSS may all be in the same area, for example, in the non-display area NDA located on an upper side of the display area DPA. An external device may be mounted on the wiring pads WPD. For example, the external device may be mounted on the wiring pads WPD through an anisotropic conductive film, ultrasonic bonding, and/or the like.

Each pixel PX or subpixel PXn (where n is an integer of 1 to 3) of the display device 10 includes a pixel driving circuit. The above-described wirings may transmit a driving signal to each pixel driving circuit while passing through and/or around each pixel PX. The pixel driving circuit may include a transistor and a capacitor. The number of transistors and capacitors in each pixel driving circuit can be variously suitably changed. According to some embodiments, each subpixel PXn of the display device 10 may have a 3T1C structure, in which the pixel driving circuit includes three transistors and one capacitor. Although the pixel driving circuit will be described below using the 3T1C structure as an example, the present disclosure is not limited thereto, and other various modified pixel structures (such as a 2T1C structure, a 7T1C structure, and/or a 6T1C structure) are also applicable.

Figure 3:
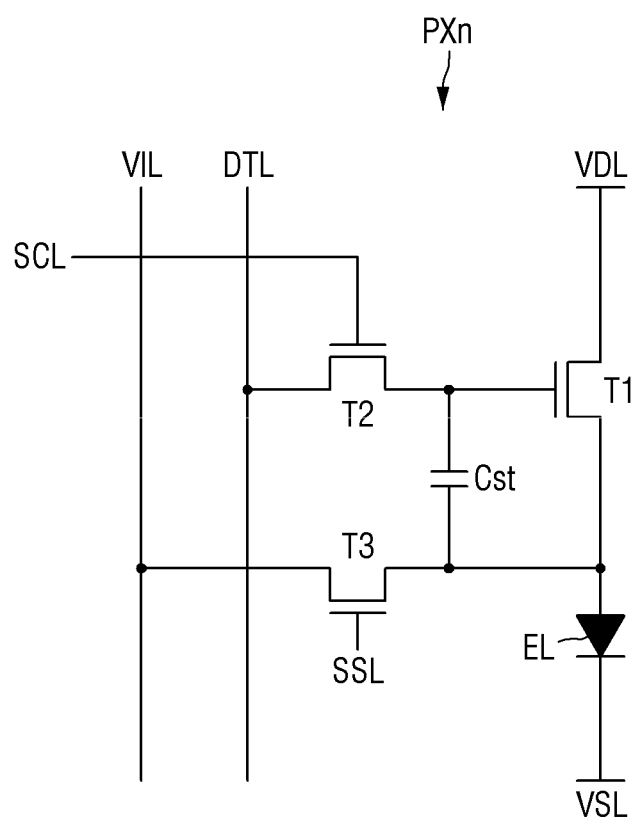
FIG. 3 is an equivalent circuit diagram of one subpixel according to some embodiments.

FIG. 3 is an equivalent circuit diagram of one subpixel PXn according to some embodiments.

Referring to FIG. 3, each subpixel PXn of the display device 10 according to some embodiments includes three transistors T1 through T3 and one storage capacitor Cst, in addition to a light emitting diode EL.

The light emitting diode EL emits light according to a current supplied through a first transistor T1. The light emitting diode EL includes a first electrode, a second electrode, and at least one light emitting element between them. The light emitting element may emit light of a specific (or set) wavelength band in response to electrical signals received from the first electrode and the second electrode.

A first end of the light emitting diode EL may be connected to a source electrode of the first transistor T1, and a second end of the light emitting diode EL may be connected to the second voltage wiring VSL to which a low potential voltage (hereinafter, referred to as a second power supply voltage), lower than a high potential voltage (hereinafter, referred to as a first power supply voltage), is supplied. In addition, the second end of the light emitting diode EL may be connected to a source electrode of a second transistor T2.

The first transistor T1 adjusts a current flowing from the first voltage wiring VDL, to which the first power supply voltage is supplied, to the light emitting diode EL according to a voltage difference between a gate electrode and the source electrode. For example, the first transistor T1 may be a driving transistor for driving the light emitting diode EL. The first transistor T1 may have the gate electrode connected to the source electrode of the second transistor T2, the source electrode connected to the first electrode of the light emitting diode EL, and a drain electrode connected to the first voltage wiring VDL to which the first power supply voltage is applied.

The second transistor T2 is turned on by a scan signal of a scan line SCL to connect a data line DTL to the gate electrode of the first transistor T1. The second transistor T2 may have a gate electrode connected to the scan line SCL, the source electrode connected to the gate electrode of the first transistor T1, and a drain electrode connected to the data line DTL.

A third transistor T3 is turned on by a sensing signal of a sensing line SSL to connect an initialization voltage wiring VIL to the first end of the light emitting diode EL. The third transistor T3 may have a gate electrode connected to the sensing line SSL, a drain electrode connected to the initialization voltage wiring VIL, and a source electrode connected to the first end of the light emitting diode EL or the source electrode of the first transistor T1.

In some embodiments, the source electrode and the drain electrode of each of the transistors T1 through T3 are not limited to the above description, and may be reversed. In addition, each of the transistors T1 through T3 may be formed as a thin-film transistor. Although each of the transistors T1 through T3 is mainly described as an N-type metal oxide semiconductor field effect transistor (MOSFET) in FIG. 3, the present disclosure is not limited thereto. For example, each of the transistors T1 through T3 may also be formed as a P-type MOSFET, or some of the transistors T1 through T3 may be formed as N-type MOSFETs, and the other may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of one pixel PX of the display device 10 according to some embodiments will now be described in more detail by further referring to another drawing.

Figure 4:
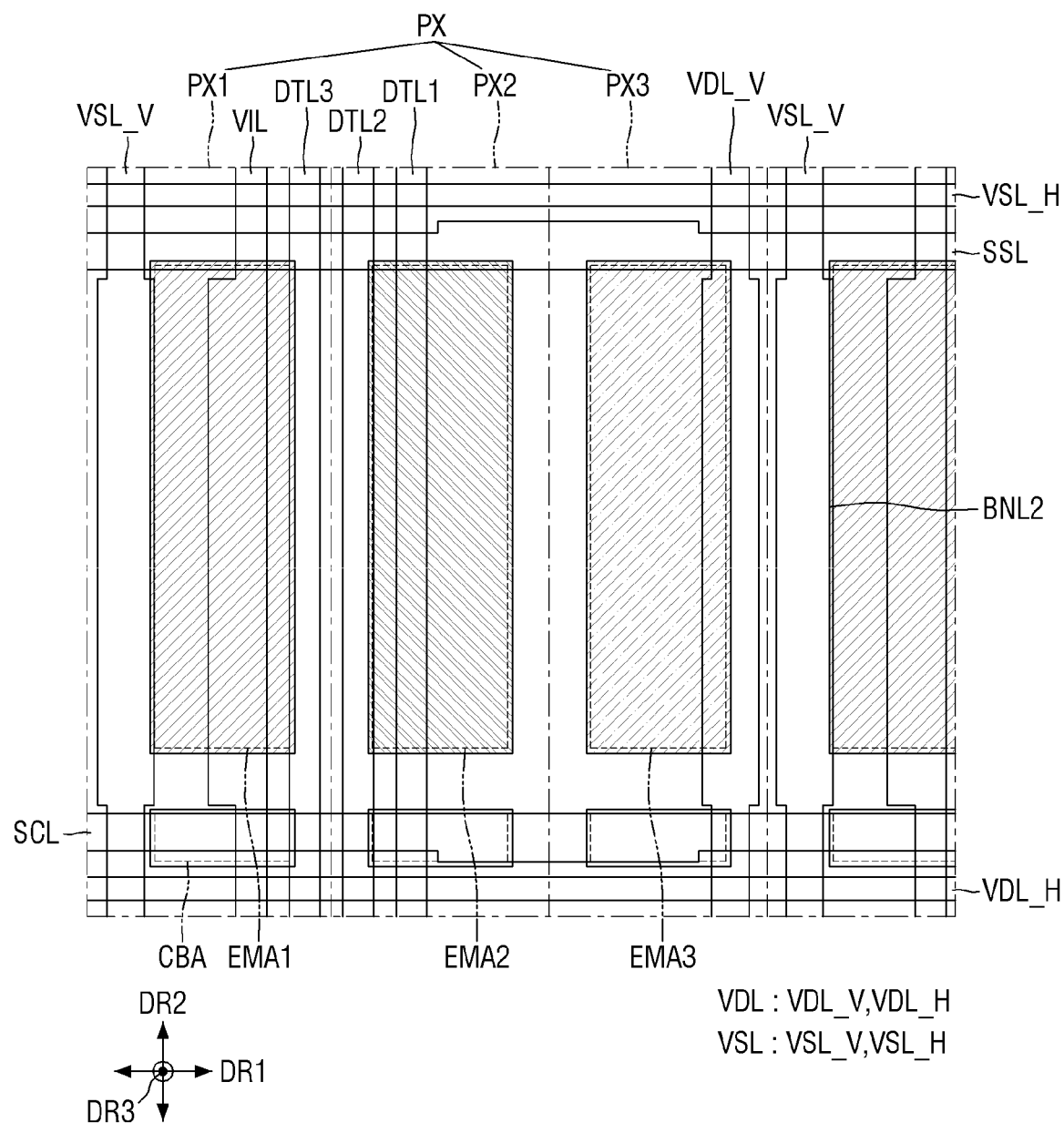
FIG. 4 is a schematic plan view of wirings in one pixel of the display device according to some embodiments.

FIG. 4 is a schematic plan view of wirings in one pixel PX of the display device 10 according to some embodiments. In FIG. 4, schematic shapes of a plurality of wirings and a second bank BNL2 in each pixel PX of the display device 10 are illustrated. For ease of description, some members positioned in emission areas EMA1, EMA2 or EMA3 of each subpixel PXn and some conductive layers under the members are not illustrated. In each of the following drawings, both sides of the first direction DR1 may be referred to as a left side and a right side, respectively, and both sides of the second direction DR2 may be referred to as an upper side and a lower side, respectively. In FIG. 4, one pixel PX and a portion of another pixel PX adjacent to the one pixel PX in the first direction DR1 are illustrated together.

Referring to FIG. 4, each of the pixels PX of the display device 10 may include a plurality of subpixels PXn (where n is an integer of 1 to 3). For example, one pixel PX may include a first subpixel PX1, a second subpixel PX2, and a third subpixel PX3.

One pixel PX of the display device 10 may include a plurality of emission areas EMA1 through EMA3, and each subpixel PXn may include an emission area EMA1, EMA2 or EMA3 and a non-emission area. Each emission area EMA1, EMA2 or EMA3 may be an area in which light emitting elements ED (see FIG. 13) are provided to output light of a specific (or set) wavelength band, and the non-emission area may be an area in which the light emitting elements ED are not provided and from which no light is output because light emitted from the light emitting elements ED does not reach this area. Each emission area EMA1, EMA2 or EMA3 may include an area where the light emitting elements ED are positioned and where light emitted from the light emitting elements ED is output to an area adjacent to the light emitting elements ED.

However, the present disclosure is not limited thereto, and any of the emission area EMA1, EMA2 or EMA3 may also include an area from which light emitted from the light emitting elements ED is output after being reflected or refracted by other members. A plurality of light emitting elements ED may be provided in each subpixel PXn, and an area where the light emitting elements ED are provided, and an area adjacent to this area, may form the emission area EMA1, EMA2 or EMA3.

A first emission area EMA1 of the pixel PX is in the first subpixel PX1, a second emission area EMA2 is in the second subpixel PX2, and a third emission area EMA3 is in the third subpixel PX3. The subpixels PXn include different types (or kinds) of light emitting elements ED so that lights of different colors are emitted from the first through third emission areas EMA1 through EMA3. For example, the first subpixel PX1 may emit light of a first color, the second subpixel PX2 may emit light of a second color, and the third subpixel PX3 may emit light of a third color. The first color may be blue, the second color may be green, and the third color may be red. However, the present disclosure is not limited thereto, and the subpixels PXn may also include the same type (or kind) of light emitting elements ED so that light of the same color is emitted from each of the emission areas EMA1 through EMA3 or one pixel PX.

In some embodiments, the pixel PX may include a plurality of cut areas CBA spaced apart from the emission areas EMA1 through EMA3. The cut area CBA may be on a side of the emission area EMA1, EMA2 or EMA3 of each subpixel PXn in the second direction DR2, and may be between the emission areas EMA1, EMA2 or EMA3 of subpixels PXn neighboring each other in the second direction DR2. The emission areas EMA1 through EMA3 and the cut areas CBA may each be repeatedly arranged in the first direction DR1, but may be alternately arranged with each other in the second direction DR2. Light might not be output from the cut areas CBA because the light emitting elements ED are not provided in the cut areas CBA, but a portion of an electrode RME1 or RME2 (see FIG. 7) in each subpixel PXn may be positioned in the cut area CBA. Some of the electrodes RME1 and RME2 in each subpixel PXn may be split in the cut area CBA.

The second bank BNL2 may include portions extending in the first direction DR1 and the second direction DR2 in plan view to form a lattice pattern over the entire display area DPA. The second bank BNL2 may be at the boundary of each subpixel PXn, to separate neighboring subpixels PXn. In some embodiments, the second bank BNL2 may surround the emission area EMA1, EMA2 or EMA3 and the cut area CBA in each subpixel PXn to separate them from each other. The second bank BNL2 will be described in more detail hereinbelow.

The above-described wirings may be provided in each pixel PX of the display device 10. For example, the display device 10 includes wiring horizontal portions VDL_H and VSL_H of the first voltage wiring VDL and the second voltage wiring VSL, in addition to the scan lines SCL and the sensing lines SSL extending in the first direction DR1. In addition, the display device 10 includes the data lines DTL, the initialization voltage wirings VIL, and wiring vertical portions VDL_V and VSL_V of the voltage wirings VDL and VSL extending in the second direction DR2.

Wirings and circuit elements of a circuit layer provided in each pixel PX and connected to the light emitting diode EL may be connected to each of the first through third subpixels PX1 through PX3. However, the wirings and the circuit elements are not placed to correspond to an area occupied by each subpixel PXn but may be positioned regardless (or irrespective) of the position of each subpixel PXn in one pixel PX. For example, in the display device 10 according to some embodiments, circuit layers for driving the light emitting diode EL of each subpixel PXn may be positioned regardless of the positions of the subpixels PXn in the pixels PX.

One pixel PX may include the first through third subpixels PX1 through PX3, and a circuit layer connected to the pixel PX may be in a specific pattern. The patterns may be repeatedly arranged not on a subpixel-by-subpixel basis, but on a pixel-by-pixel basis. The subpixels PXn in one pixel PX are areas distinguished by the emission areas EMA1 through EMA3, and the circuit layer connected to the subpixels PXn may be positioned regardless of (e.g., not corresponding to) the areas of the subpixels PXn. In the display device 10, because the wirings and elements of the circuit layer are placed repeatedly on a unit pixel-by-unit pixel basis (e.g., are patterned for each of the pixels PX), the area occupied by the wirings and elements connected to each subpixel PXn can be minimized (or reduced), and a large number of pixels PX and subpixels PXn can be included per unit area. Therefore, an ultra-high resolution display device can be implemented.

A plurality of data lines DTL1 through DTL3 may extend in the second direction DR2 across a plurality of pixels PX arranged in the second direction DR2. In the display area DPA, the data lines DTL1 through DTL3 may be in the pixels PX arranged in the second direction DR2 and may be spaced apart from each other in the first direction DR1. First through third data lines DTL1 through DTL3 may be in one pixel PX and may be connected to each subpixel PXn, for example, the first through third subpixels PX1 through PX3. The first data line DTL1, the second data line DTL2, and the third data line DTL3 may be sequentially arranged along the first direction DR1. For example, while the first subpixel PX1, the subpixel PX2, and the third subpixel PX3 are sequentially arranged toward a first side (e.g., right side) of the first direction DR1, the first data line DTL1, the second data line DTL2, and the third data line DTL3 may be sequentially arranged toward a second side (e.g., left side) of the first direction DR1. Each of the data lines DTL1 through DTL3 may be connected to the second transistor T2 through a conductive pattern positioned in another conductive layer and may transmit a data signal to the second transistor T2. However, as described above, the first through third data lines DTL1 through DTL3 might not be positioned to respectively correspond to areas occupied by the first through third subpixels PX1 through PX3, but instead may be placed at one or more specific (or set) positions in one pixel PX. Although the first through third data lines DTL1 through DTL3 are arranged across the first subpixel PX1 and the second subpixel PX2 in the drawing (e.g., in FIG. 4), the present disclosure is not limited thereto.

The initialization voltage wirings VIL extend in the second direction DR2 across the pixels PX arranged in the second direction DR2. In the display area DPA, the initialization voltage wirings VIL may be spaced apart from each other in the first direction DR1, and each of the initialization voltage wirings VIL may be arranged across a plurality of pixels PX arranged in the same column (along the second direction DR2). An initialization voltage wiring VIL may be positioned on a left side of the first data line DTL1 in plan view. One initialization voltage wiring VIL may be provided per one pixel PX in the first direction DR1 and may be connected to each subpixel PXn by being connected to a conductive pattern in another conductive layer. Each initialization voltage wiring VIL may be electrically connected to the drain electrode of the third transistor T3 and may apply an initialization voltage to the third transistor T3.

The first voltage wiring VDL and the second voltage wiring VSL may extend in the first direction DR1 and the second direction DR2. In some embodiments, the first voltage wiring VDL and the second voltage wiring VSL may respectively include the wiring vertical portions VDL_V and VSL_V extending in the second direction DR2. The wiring vertical portions VDL_V and VSL_V extend in the second direction DR2 across a plurality of pixels PX neighboring in the second direction DR2. A first wiring vertical portion VDL_V of the first voltage wiring VDL may be on a right side of a center of each pixel PX, which is the first side of the first direction DR1, and a second wiring vertical portion VSL_V of the second voltage wiring VSL may be on a left side, which is the second side of the first direction DR1. Each of the wiring vertical portions VDL_V and VSL_V may intersect the wiring horizontal portion VDL_H or VSL_H to be described hereinbelow, and may be connected to the wiring horizontal portion VDL_H or VSL_H through a contact hole at the intersection with the wiring horizontal portion VDL_H or VSL_H to form one voltage wiring VDL or VSL.

The data lines DTL1 through DTL3, the initialization voltage wirings VIL, and the wiring vertical portions VDL_V and VSL_V of the voltage wirings VDL and VSL may each be made of a first conductive layer. The first conductive layer may include another conductive layer in addition to the above-described wirings and lines.

The scan lines SCL and the sensing lines SSL may extend in the first direction DR1 across a plurality of pixels PX arranged in the first direction DR1. For example, the scan lines SCL and the sensing lines SSL may be spaced apart from each other in the second direction DR2, and each of the scan lines SCL and each of the sensing lines SSL may be provided across a plurality of pixels PX arranged in the same row in the first direction DR1. A scan line SCL may be on a lower side of the center of each pixel PX in plan view, and a sensing line SSL may be on an upper side of the center of each pixel PX in plan view. The scan line SCL and the sensing line SSL may be in the non-emission area located outside the emission areas EMA1 through EMA3, but a portion of the sensing line SSL may also be positioned across the emission areas EMA1 through EMA3. In some embodiments, the scan line SCL and the sensing line SSL may be connected to a gate pattern, which is in a second conductive layer provided on the first conductive layer and which extends in the second direction DR2, and the gate pattern may form the gate electrode of the second transistor T2 or the third transistor T3.

The wiring horizontal portions VDL_H and VSL_H of the first voltage wiring VDL and the second voltage wiring VSL may extend in the first direction DR1 across a plurality of pixels PX neighboring in the first direction DR1. The wiring horizontal portions VDL_H and VSL_H may be spaced apart from each other in the second direction DR2, and each of the wiring horizontal portions VDL_H and VSL_H may be provided across a plurality of pixels PX arranged in the same row in the first direction DR1. A first wiring horizontal portion VDL_H of the first voltage wiring VDL may be on the lower side of the center of each pixel PX, which is a second side of the second direction DR2, and a second wiring horizontal portion VSL_H of the second voltage wiring VSL may be on the upper side, which is a first side of the second direction DR2. The wiring vertical portions VDL_V and VSL_V and the wiring horizontal portions VDL_H and VSL_H may be made of conductive layers provided on different layers (different levels) and may be connected to each other through contact holes. For example, the first wiring horizontal portion VDL_H may be on the lower side of the pixel PX and may be connected to the first wiring vertical portion VDL_V through a contact hole at an intersection with the first wiring vertical portion VDL_V, but might not be connected to the second wiring vertical portion VSL_V at an intersection with the second wiring vertical portion VSL_V. Similarly, the second wiring horizontal portion VSL_H may be on the upper side of the pixel PX and may be connected to the second wiring vertical portion VSL_V through a contact hole at an intersection with the second wiring vertical portion VSL_V, but might not be connected to the first wiring vertical portion VDL_V at an intersection with the first wiring vertical portion VDL_V.

In some embodiments, the first voltage wiring VDL and the second voltage wiring VSL may be outside the emission areas EMA1 through EMA3 of each pixel PX to extend in the first direction DR1 and the second direction DR2. The first voltage wiring VDL and the second voltage wiring VSL may be in a mesh structure in the entire display area DPA, to surround the emission areas EMA1 through EMA3, and may be electrically connected to electrode lines RM1 and RM2 positioned outside the emission areas EMA1 through EMA3.

In some embodiments, the first through third subpixels PX1 through PX3 of each pixel PX may share the same first voltage wiring VDL and second voltage wiring VSL. As described above, a plurality of subpixels PXn in each pixel PX may share the first voltage wiring VDL and the second voltage wiring VSL to which the same signal is transmitted. Therefore, the number of wirings per unit area can be reduced.

The first voltage wiring VDL may be electrically connected to the drain electrode of the first transistor T1 of each subpixel PXn and may apply the first power supply voltage to the first transistor T1. The second voltage wiring VSL may be electrically connected to the second electrode of the light emitting diode EL and may apply the second power supply voltage to the light emitting element.

Although one each of the wiring vertical portions VDL_V and VSL_V and the wiring horizontal portions VDL_H and VSL_H is in one pixel PX in the drawing (e.g., in FIG. 4), the present disclosure is not limited thereto. The respective wiring vertical portions VDL_V and VSL_V and wiring horizontal portions VDL_H and VSL_H of the first voltage wiring VDL and the second voltage wiring VSL may be placed to correspond to one pixel PX, and may also be shared with pixels PX adjacent to the one pixel PX in the first direction DR1 and the second direction DR2. In this case, the wiring vertical portions VDL_V and VSL_V need not be repeatedly arranged along the first direction DR1 on a pixel-by-pixel basis (e.g., might not be repeatedly arranged to be included in every pixel PX along the first direction DR1), but may be alternately arranged (e.g., may be arranged in every other pixel PX, or every third or more, along the first direction DR1), and the wiring horizontal portions VDL_H and VSL_H need not be repeatedly arranged along the second direction DR2 (e.g., might not be repeatedly arranged to be included in every pixel PX along the second direction DR2), but may be alternately arranged (e.g., may be arranged in every other pixel PX, or every third or more, along the second direction DR2). Accordingly, in some of the pixels PX, the wirings and elements of a circuit layer connected to the light emitting diodes EL may be positioned symmetrically to each other with respect to a boundary between respective ones of the pixels PX (which are not necessarily directly adjacent one another). In some embodiments, the light emitting elements ED, electrodes RME1 and RME2, and the electrode lines RM1 and RM2 to be described hereinbelow may have a specific (or set) direction, and the light emitting elements ED and the electrodes RME1 and RME2 may be positioned symmetrically to each other in the pixels PX. This will be described in more detail hereinbelow.

The scan lines SCL, the sensing lines SSL, and the wiring horizontal portions VDL_H and VSL_H may be made of a third conductive layer provided on the second conductive layer. The third conductive layer may include other conductive patterns, in addition to the above wirings and lines.

In the display device 10 according to some embodiments, a circuit layer that transmits a signal for driving the light emitting diode EL may include the first through third conductive layers. For example, each of the first voltage wiring VDL and the second voltage wiring VSL, which apply power supply voltages to the light emitting diode EL, may be composed of wirings in the first conductive layer and the third conductive layer and may be positioned on the same layer (e.g., same level) as the data lines DTL, the initialization voltage wirings VIL, and/or other conductive patterns. Because the display device 10 can reduce the number of conductive layers constituting the circuit layer, it is advantageous in terms of a manufacturing process. The structure of each subpixel PXn will now be described in more detail by further referring to other drawings.

Figure 5:
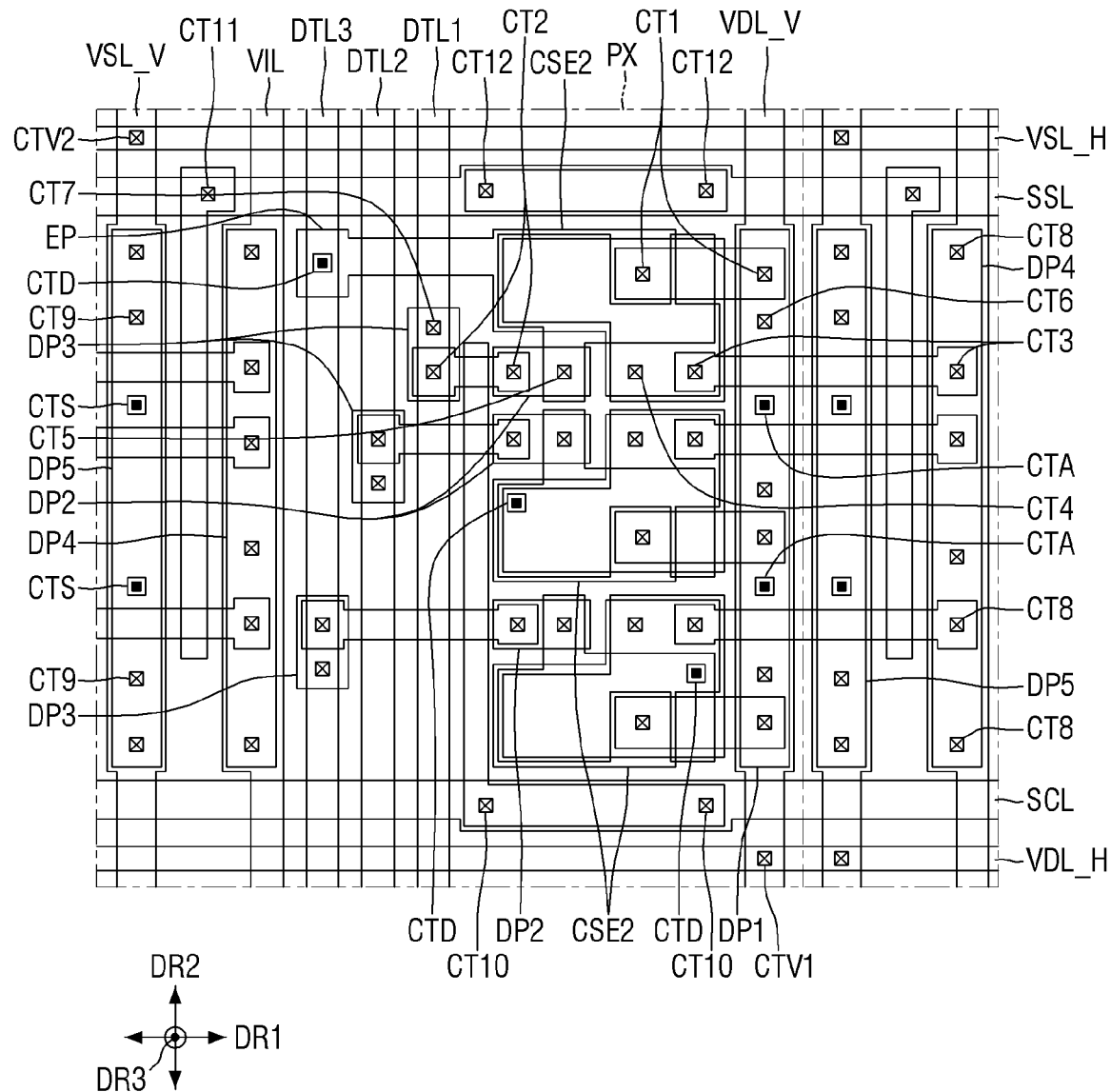
FIG. 5 is a layout view of a plurality of conductive layers included in one pixel of the display device according to some embodiments.
Figure 6:
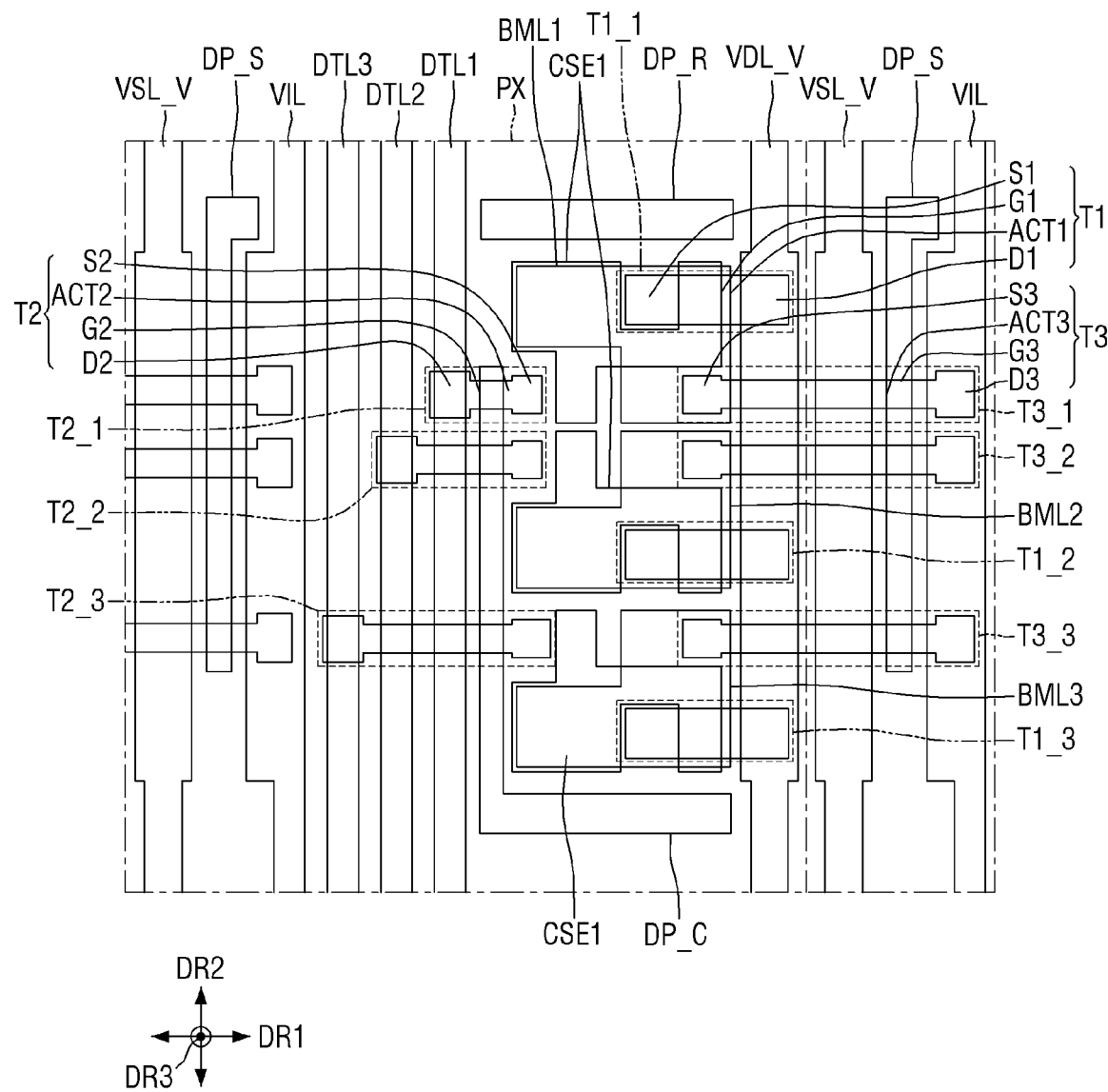
FIG. 6 is a layout view illustrating the arrangement of a first conductive layer, a second conductive layer, and a semiconductor layer included in one pixel of the display device according to some embodiments.
Figure 7:
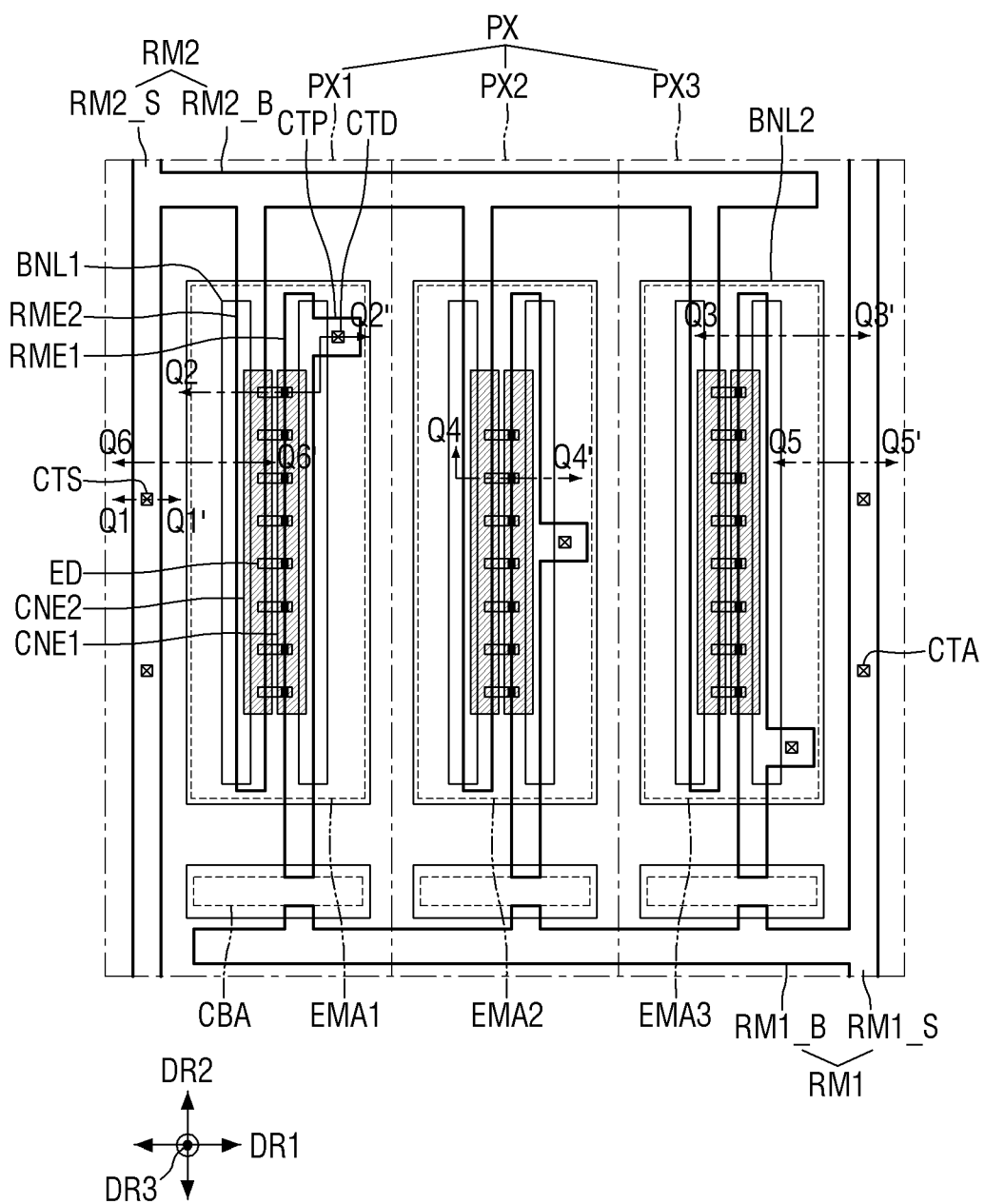
FIG. 7 is a schematic plan view of a plurality of electrodes and a plurality of banks included in one pixel of the display device according to some embodiments.
Figure 8:
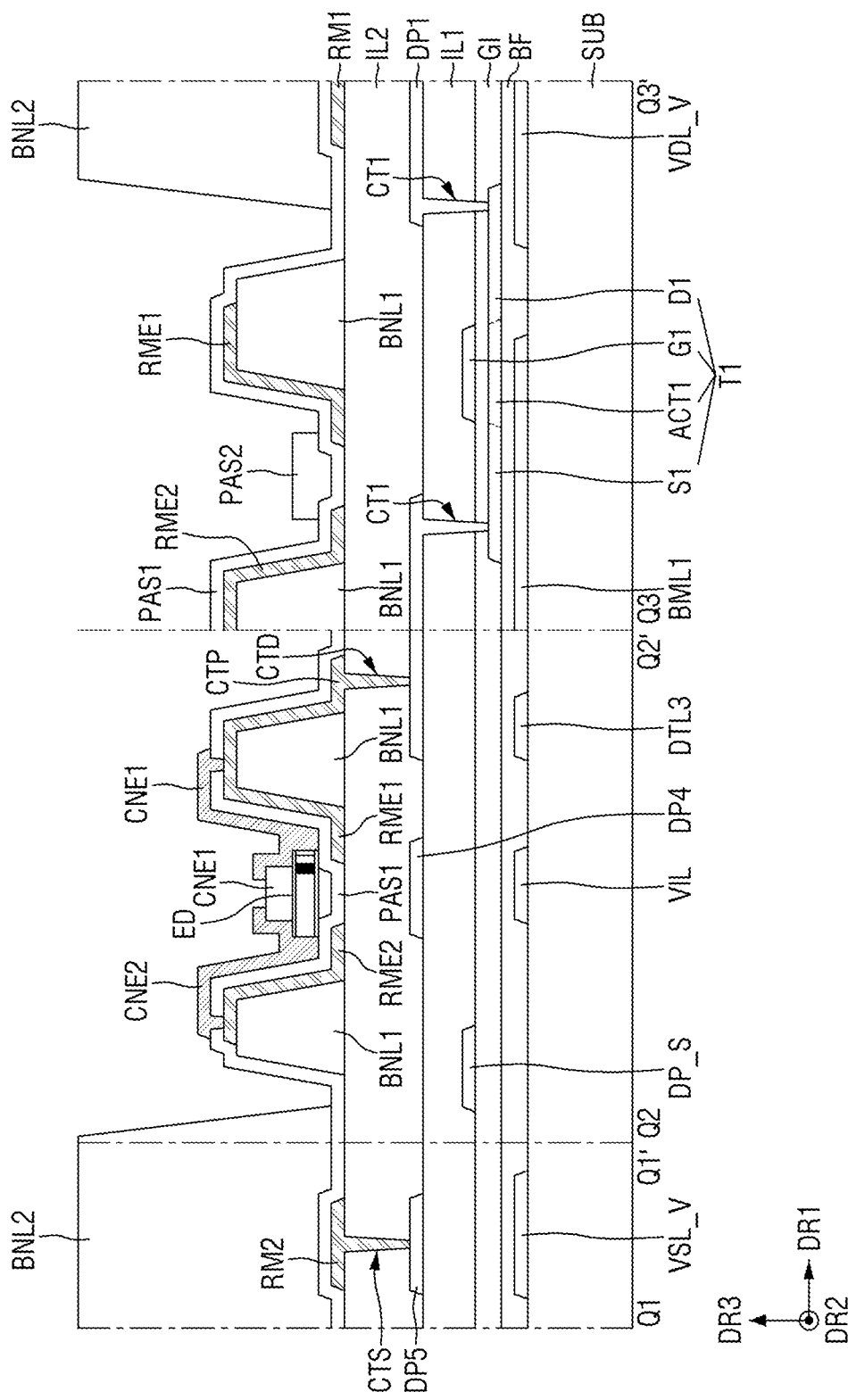
FIG. 8 is a cross-sectional view taken along lines Q1-Q1', Q2-Q2' and Q3-Q3' of FIG. 7.
Figure 9:
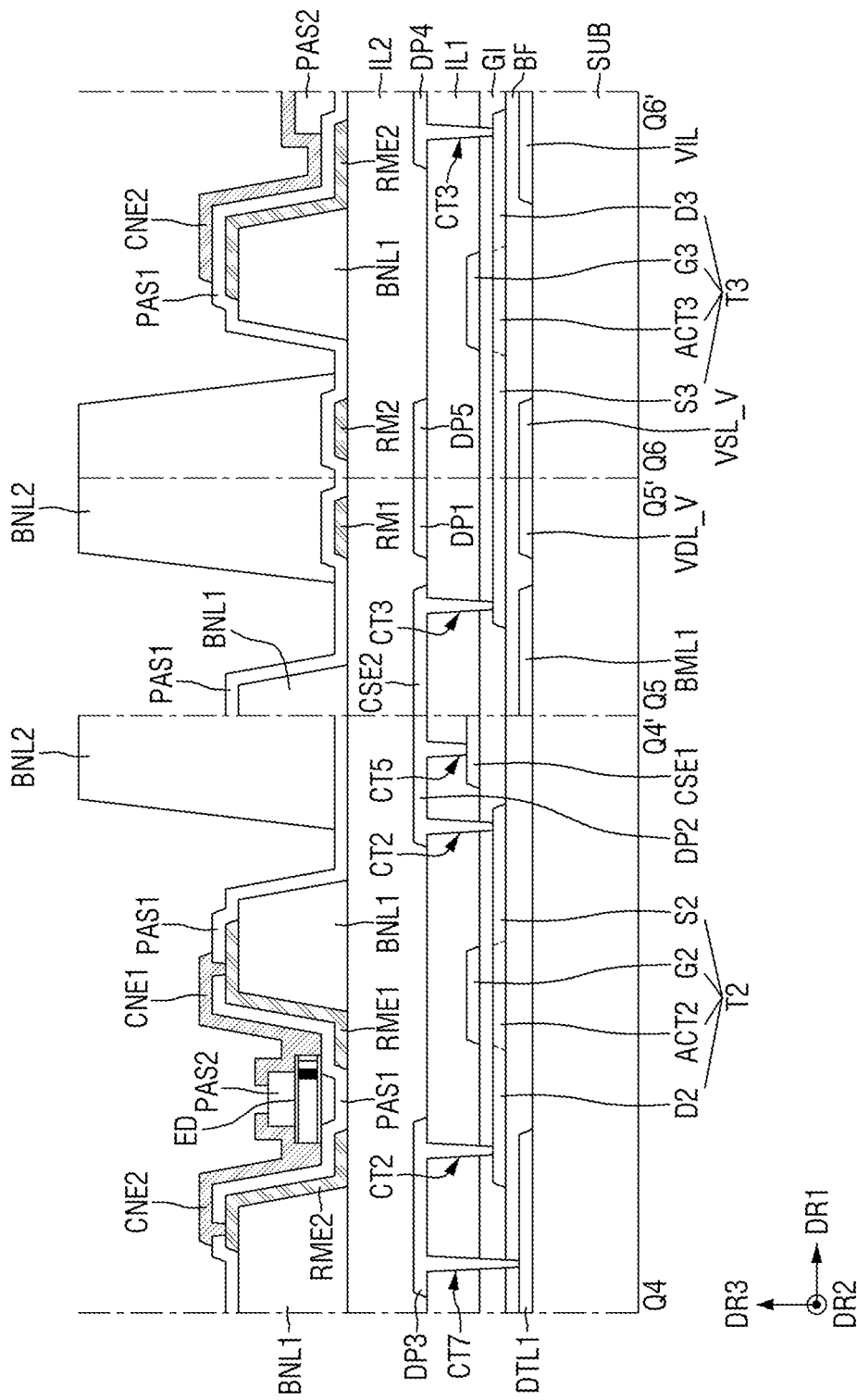
FIG. 9 is a cross-sectional view taken along lines Q4-Q4', Q5-Q5' and Q6-Q6' of FIG. 7.

FIG. 5 is a layout view of a plurality of conductive layers included in one pixel PX of the display device 10 according to some embodiments. FIG. 6 is a layout view illustrating the arrangement of the first conductive layer, the second conductive layer, and a semiconductor layer included in one pixel PX of the display device 10 according to some embodiments. FIG. 7 is a schematic plan view of a plurality of electrodes and a plurality of banks included in one pixel PX of the display device 10 according to some embodiments. FIG. 8 is a cross-sectional view taken along lines Q1-Q1', Q2-Q2' and Q3-Q3' of FIG. 7. FIG. 9 is a cross-sectional view taken along lines Q4-Q4', Q5-Q5' and Q6-Q6' of FIG. 7.

In FIG. 5, the planar arrangement of wirings and elements of a circuit layer connected to one pixel PX is illustrated. In FIG. 6, the planar arrangement of the first conductive layer, the second conductive layer and an active layer of the circuit layer of FIG. 5 is illustrated. In FIGS. 5 and 6, the conductive layers of the circuit layer in one pixel PX are illustrated, and some of the elements of a circuit layer in another pixel PX neighboring to the one pixel PX in the first direction DR1 are also illustrated.

FIG. 7 illustrates a display element layer in each pixel PX, based on each subpixel PXn defined by the second bank BNL2. FIG. 7 illustrates the arrangement of a plurality of electrode lines RM1 and RM2, a plurality of banks BNL1 and BNL2, and contact electrodes CNE1 and CNE2, in addition to the electrodes RME1 and RME2 and the light emitting elements ED constituting each light emitting diode EL. FIGS. 8 and 9 illustrate cross-sections of a first transistor T1, a second transistor T2, and a third transistor T3.

Referring to FIGS. 5 through 9 in connection with FIG. 4, the display device 10 may include the circuit layer and the display element layer. The display element layer may be a layer in which the electrode lines RM1 and RM2 and first and second electrodes RME1 and RME2, as well as the light emitting elements ED of each light emitting diode EL, are provided, and the circuit layer may be a layer in which a plurality of wirings, as well as pixel circuit elements for driving each light emitting diode EL, are provided. For example, the circuit layer may include the transistors T1 through T3, in addition to a scan line SCL, a sensing line SSL, data lines DTL, an initialization voltage line VIL, the first voltage wiring VDL, and the second voltage wiring VSL.

In some embodiments, the display device 10 includes a first substrate SUB on which the circuit layer and the display element layer are positioned. The first substrate SUB may be an insulating substrate and may be made of an insulating material such as glass, quartz, and/or polymer resin. In some embodiments, the first substrate SUB may be a rigid substrate, but may also be a flexible substrate that can be bent, folded, and/or rolled.

The first conductive layer may be on the first substrate SUB. The first conductive layer includes the wiring vertical portions VDL_V and VSL_V of the voltage wirings VDL and VSL, the initialization voltage wring VIL, the data lines DTL1 through DTL3, and a plurality of light blocking layers BML1 through BML3.

The wiring vertical portions VDL_V and VSL_V of the voltage wirings VDL and VSL extend in the second direction DR2. The wiring vertical portions VDL_V and VSL_V of the voltage wirings VDL and VSL are in the non-emission area at positions overlapping the second bank BNL2 in the third direction DR3, which is a thickness direction, so as not to overlap the emission areas EMA1 through EMA3. They may be connected to the pads WPD_VDD and WPD_VSS of the pad area PDA and may receive the first power supply voltage and the second power supply voltage.

The first wiring vertical portion VDL_V of the first voltage wiring VDL may be connected to the drain electrodes of the first transistors T1 through a first conductive pattern DP1 of the third conductive layer. In some embodiments, the first wiring vertical portion VDL_V may be connected to the first wiring horizontal portion VDL_H through a first wiring contact hole CTV1 at an intersection with the first wiring horizontal portion VDL_H. The second wiring vertical portion VSL_V of the second voltage wiring VSL may be connected to the second electrodes RME2 through a fifth conductive pattern DP5 of the third conductive layer. The second wiring vertical portion VSL_V may be connected to the second wiring horizontal portion VSL_H through a second wiring contact hole CTV2 at an intersection with the second wiring horizontal portion VSL_H.

The initialization voltage wiring VIL may extend in the second direction DR2 and may be between the wiring vertical portions VDL_V and VSL_V. The initialization voltage wiring VIL may be connected to the drain electrodes of the third transistors T3 through a fourth conductive pattern DP4 of the third conductive layer and may deliver the initialization voltage to the third transistor T3 of each subpixel PXn.

The light blocking layers BML1 through BML3 may be on the first substrate SUB. The light blocking layers BML1 through BML3 overlap first active layers ACT1 of the semiconductor layer and first capacitive electrodes CSE1 of the second conductive layer, which will be described in more detail hereinbelow. A first light blocking layer BML1 overlaps the first active layer ACT1 of a first transistor T1_1 connected to the first subpixel PX1. A second light blocking layer BML2 overlaps the first active layer ACT1 of a first transistor T1_2 connected to the second subpixel PX2, and a third light blocking layer BML3 overlaps the first active layer ACT1 of a first transistor T1_3 connected to the third subpixel PX3. The first through third light blocking layers BML1 through BML3 are spaced apart from each other in the second direction DR2 and may be on a right side of and adjacent to the center of each pixel PX in plan view. The light blocking layers BML1 through BML3 include a light blocking material and prevent (or reduce) light from entering the first active layers ACT1 of the first transistors T1. For example, the light blocking layers BML1 through BML3 may be made of an opaque metal material that blocks (or substantially reduces) transmission of light. However, the present disclosure is not limited thereto. In some embodiments, the light blocking layers BML1 through BML3 may be omitted or may overlap active layers of other transistors T1 through T3.

The data lines DTL1 through DTL3 extend in the second direction DR2 between the initialization voltage wiring VIL and the light blocking layers BML1 through BML3. The data lines DTL1 through DTL3 may be connected to third conductive patterns DP3 of the third conductive layer and connected to the drain electrodes of the second transistors T2 through the third conductive patterns DP3. The first data line DTL1 may be connected to a second transistor T2_1 of the first subpixel PX1, the second data line DTL2 may be connected to a second transistor T2_2 of the second subpixel PX2, and the third data line DTL3 may be connected to a second transistor T2_3 of the third subpixel PX3.

A buffer layer BF may be entirely on the first substrate SUB having the first conductive layer. The buffer layer BF may be formed on the first substrate SUB to protect the transistors T1 through T3 from moisture introduced through the first substrate SUB, which may be vulnerable to moisture penetration, and may perform a surface planarization function.

The semiconductor layer may be on the buffer layer BF. The semiconductor layer may include the respective active layers ACT1 through ACT3 of the transistors T1 through T3.

One pixel PX may include a plurality of first active layers ACT1 included in the first transistors T1_1 through T1_3 connected to the subpixels PX1 through PX3, respectively. The first active layer ACT1 of each first transistor T1 may be adjacent to and on the right side of the center of each pixel PX. A first drain region D1 is formed on a side of the first active layer ACT1, and a first source region S1 is formed on the other side of the first active layer ACT1. The first active layers ACT1 may be spaced apart from each other in the second direction DR2, and the first drain regions D1 and the first source regions S1 may overlap the first wiring vertical portion VDL_V and the light blocking layers BML1 through BML3. The first drain regions D1 may be on the first wiring vertical portion VDL_V, and the first source regions S1 may overlap second capacitive electrodes CSE2 of the third conductive layer. The first drain regions D1 of the first transistors T1 may be connected to the first voltage wiring VDL through the first conductive pattern DP1, and the first source regions S1 may be connected to the second capacitive electrodes CSE2.

One pixel PX may include a plurality of second active layers ACT2 included in the second transistors T2_1 through T2_3 connected to the subpixels PX1 through PX3, respectively. The second active layer ACT2 of each second transistor T2 may be adjacent to and on a left side of the center of each pixel PX. A second drain region D2 is formed on a side of the second active layer ACT2, and a second source region S2 is formed on the other side of the second active layer ACT2. The second active layers ACT2 may be spaced apart from each other in the second direction DR2, and the second drain regions D2 and the second source regions S2 may overlap the data lines DTL1 through DTL3 and the third conductive patterns DP3 and second conductive patterns DP2 of the third conductive layer. The second drain regions D2 may be connected to the third conductive patterns DP3, and thus connected to the data lines DTL through the third conductive patterns DP3, and the second source regions S2 may be connected to the second conductive patterns DP2, and thus connected to the gate electrodes of the first transistors T1 through the second conductive patterns DP2.

The second active layers ACT2 of the second transistors T2 may have different widths measured in the first direction DR1. The second source regions S2 formed on one side of the second active layers ACT2 may overlap the second conductive patterns DP2 arranged in the second direction DR2, and the second drain regions D2 formed on the other side of the second active layers ACT2 may overlap different data lines DTL1 through DTL3 arranged in the first direction DR1. The first data line DTL1 may be closest to the second source regions S2 of the second transistors T2, and the third data line DTL3 may be farthest from the second source regions S2 of the second transistors T2. Accordingly, the second active layer ACT2 of the second transistor T2_1 connected to the first subpixel PX1 may be shorter than the second active layer ACT2 of the second transistor T2_2 connected to the second subpixel PX2 and the second active layer ACT2 of the second transistor T2_3 connected to the third subpixel PX3. In addition, the second active layer ACT2 of the second transistor T2_2 connected to the second subpixel PX2 may be shorter than the second active layer ACT2 of the second transistor T2_3 connected to the third subpixel PX3. However, the present disclosure is not limited thereto.

One pixel PX may include a plurality of third active layers ACT3 included in third transistors T3_1 through T3_3 connected to the subpixels PX1 through PX3, respectively. The third active layer ACT3 of each third transistor T3 may be on the right side of each pixel PX to extend to another pixel PX adjacent in the first direction DR1. A third drain region D3 is formed on a side of the third active layer ACT3, and a third source region S3 is formed on the other side of the third active layer ACT3. The third active layers ACT3 may be spaced apart from each other in the second direction DR2, and the third drain regions D3 and the third source regions S3 may overlap the initialization voltage wiring VIL and the second capacitive electrodes CSE2 of the third conductive layer located in different pixels PX. The third drain regions D3 may be connected to the fourth conductive pattern DP4 and thus connected to the initialization voltage wiring VIL through the fourth conductive pattern DP4, and the third source regions S3 may be connected to the second capacitive electrodes CSE2.

In some embodiments, the semiconductor layer may include polycrystalline silicon, monocrystalline silicon, an oxide semiconductor, and/or the like. The polycrystalline silicon may be formed by crystallizing amorphous silicon. When the semiconductor layer includes an oxide semiconductor, each of the active layers ACT1 through ACT3 may include a plurality of conducting regions and a channel region between them. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), and/or indium gallium zinc tin oxide (IGZTO).

In some embodiments, the semiconductor layer may include polycrystalline silicon. The polycrystalline silicon may be formed by crystallizing amorphous silicon. In this case, each of the conducting regions of the active layers ACT1 though ACT3 may be, but is not limited to, a doping region doped with impurities.

A first gate insulating layer GI is on the semiconductor layer and the buffer layer BF. The first gate insulating layer GI may be on the buffer layer BF having the semiconductor layer. The first gate insulating layer GI may function as a gate insulating film of each transistor.

The second conductive layer is on the first gate insulating layer GI. The second conductive layer may include the first capacitive electrodes CSE1 of storage capacitors, a first gate pattern DP_C, a second gate pattern DP_S, and a third gate pattern DP_R constituting respective gate electrodes G1 through G3 of the transistors T1 through T3.

A plurality of first capacitive electrodes CSE1 may be provided in one pixel PX. Each of the first capacitive electrodes CSE1 may overlap the first active layer ACT1 of the first transistor T1, and a portion overlapping the first active layer ACT1 may form a first gate electrode G1 of the first transistor T1. In some embodiments, the first capacitive electrodes CSE1 may overlap the light blocking layers BML1 through BML3 and the second capacitive electrodes CSE2 of the third conductive layer. The first capacitive electrodes CSE1 may be electrically connected to the source electrodes of the second transistors T2. For example, the first capacitive electrodes CSE1 may be integrated with the first gate electrodes G1 and may be connected to the second conductive patterns DP2, which are connected to the second source regions S2 of the second transistors T2, through contact holes.

The first gate pattern DP_C may include a portion extending in the first direction DR1 and a portion connected to the above portion and extending in the second direction DR2. The portion of the first gate pattern DP_C extending in the first direction DR1 may be on the lower side of each pixel PX to overlap the scan line SCL. The first gate pattern DP_C may overlap the second active layers ACT2 and may form second gate electrodes G2 of the second transistors T2. The first gate pattern DP_C may be electrically connected to the scan line SCL, and a scan signal may be transmitted to the second transistors T2.

The second gate pattern DP_S may extend in the second direction DR2. The second gate pattern DP_S may be on an upper left side of each pixel PX to overlap the sensing line SSL. In the drawings, the second gate pattern DP_S is in each of one pixel PX and another adjacent pixel PX neighboring the pixel PX. The second gate pattern DP_S may overlap the third active layers ACT3 and may form third gate electrodes G3 of the third transistors T3. The second gate pattern DP_S may be electrically connected to the sensing line SSL, and a sensing signal may be transmitted to the third transistors T3.

The third gate pattern DP_R may be above the first capacitive electrodes CSE1 to overlap the sensing line SSL. The third gate pattern DP_R may be connected to the sensing line SSL to lower (e.g., reduce) wiring resistance of the sensing line SSL extending in the first direction DR1.

A first interlayer insulating layer IL1 is on the second conductive layer. The first interlayer insulating layer IL1 may cover the second conductive layer to protect the second conductive layer.

The third conductive layer is on the first interlayer insulating layer IL1. The third conductive layer includes the scan line SCL, the sensing line SSL, the wiring horizontal portions VDL_H and VSL_H, and the second capacitive electrodes CSE2. In some embodiments, the third conductive layer may include a plurality of conductive patterns DP1 through DP5 connected to the source regions S1 through S3 and the drain regions D1 through D3 of the transistors T1 through T3, or connected to the wiring vertical portions VDL_V and VSL_V, or the initialization voltage wiring VIL.

The scan line SCL and the sensing line SSL extend in the first direction DR1 and are on the upper and lower sides of each pixel PX. The scan line SCL may be on the lower side of each pixel PX to overlap the first gate pattern DP_C and may be connected to the first gate pattern DP_C through tenth contact holes CT10 penetrating the first interlayer insulating layer IL1. The sensing line SSL may be on the upper side of each pixel PX to overlap the second gate pattern DP_S and the third gate pattern DP_R and may be connected to the second gate pattern DP_S and the third gate pattern DP_R through an eleventh contact hole CT11 and twelfth contact holes CT12, respectively, penetrating the first interlayer insulating layer IL1.

A plurality of second capacitive electrodes CSE2 are in one pixel PX. The second capacitive electrodes CSE2 may overlap the first capacitive electrodes CSE1, the first source regions S1 of the first transistors T1, and the third source regions S3 of the third transistors T3, respectively. The second capacitive electrodes CSE2 may overlap the first capacitive electrodes CSE1 in the thickness direction, with the first interlayer insulating layer IL1 interposed between them, and the storage capacitors Cst may be formed between them. In some embodiments, a portion of each second capacitive electrode CSE2 may be connected to the first source region S1 of a first transistor T1 through a first contact hole CT1 penetrating the first gate insulating layer GI and the first interlayer insulating layer IL1, and may form the source electrode of the first transistor T1. The second capacitive electrodes CSE2 may be connected to the light blocking layers BML1 through BML3 through fourth contact holes CT4 penetrating the buffer layer BF, the first gate insulating layer GI and the first interlayer insulating layer IL1, and the source electrodes of the first transistors T1 may be connected to the light blocking layers BML1 through BML3. Another portion of each second capacitive electrode CSE2 may be connected to the third source region S3 of a third transistor T3 through a third contact hole CT3 penetrating the first gate insulating layer GI and the first interlayer insulating layer IL1, and may form the source electrode of the third transistor T3.

In some embodiments, the second capacitive electrodes CSE2 may be connected to the first electrodes RME1 and may transmit electrical signals received through the first transistors T1 to the first electrodes RME1. Of the second capacitive electrodes CSE2, a second capacitive electrode CSE2 connected to the first subpixel PX1 may further include an extension electrode portion EP extending in the first direction DR1, and the extension electrode portion EP may directly contact the first electrode RME1. Second capacitive electrodes CSE2 connected to the second subpixel PX2 and the third subpixel PX3 may be connected to the first electrodes RME1 in portions overlapping the first capacitive electrodes CSE1 without including the extension electrode portion EP.

The first conductive pattern DP1 may be on the right side of each pixel PX to extend in the second direction DR2. The first conductive pattern DP1 may overlap the first wiring vertical portion VDL_V in the thickness direction and may be connected to the first wiring vertical portion VDL_V through sixth contact holes CT6 penetrating the buffer layer BF, the first gate insulating layer GI and the first interlayer insulating layer IL1. In some embodiments, the first conductive pattern DP1 may be connected to the first drain region D1 of each first transistor T1 through the first contact hole CT1 penetrating the first gate insulating layer GI and the first interlayer insulating layer IL1, and may form the drain electrode of each first transistor T1. The first transistors T1 may be connected to the first voltage wiring VDL through the first conductive pattern DP1 and may receive the first power supply voltage.

The second conductive patterns DP2 may be at the center of each pixel PX and may overlap the first capacitive electrodes CSE1 and the second source regions S2 of the second transistors T2 in the thickness direction (e.g., in the third direction DR3). Each of the second conductive patterns DP2 may contact the second source region S2 through a second contact hole CT2 penetrating the first gate insulating layer GI and the first interlayer insulating layer IL1. Each of the second conductive patterns DP2 may form the source electrode of a second transistor T2. In some embodiments, the second conductive patterns DP2 may be connected to the first capacitive electrodes CSE1 through fifth contact holes CT5 penetrating the first interlayer insulating layer IL1 and may be connected to the first gate electrodes G1 of the first transistors T1.

The third conductive patterns DP3 may be at the center of each pixel PX to overlap the data lines DTL1 through DTL3 and the second drain regions D2 of the second transistors T2 in the thickness direction. The third conductive patterns DP3 may overlap the second drain regions D2 of the second transistors T2_1 through T2_3 respectively connected to the subpixels PX1 through PX3, and the data lines DTL1 through DTL3, respectively. The third conductive patterns DP3 may contact the second drain regions D2 through the second contact holes CT2 penetrating the first gate insulating layer GI and the first interlayer insulating layer IL1. In some embodiments, the third conductive patterns DP3 may be connected to the data lines DTL1 through DTL3 through seventh contact holes CT7 penetrating the buffer layer BF, the first gate insulating layer GI and the first interlayer insulating layer IL1. Different third conductive patterns DP3 may form the drain electrodes of the second transistors T2, and the second transistors T2 may be connected to the data lines DTL1 through DTL3 through the third conductive patterns DP3.

The fourth conductive pattern DP4 may be on the left side of each pixel PX to extend in the second direction DR2. The fourth conductive pattern DP4 may overlap the initialization voltage wiring VIL in the thickness direction and may be connected to the initialization voltage wiring VIL through eighth contact holes CT8 penetrating the buffer layer BF, the first gate insulating layer GI and the first interlayer insulating layer IL1. In some embodiments, the fourth conductive pattern DP4 may be connected to the third drain region D3 of each third transistor T3 through the third contact hole CT3 penetrating the first gate insulating layer GI and the first interlayer insulating layer IL1, and may form the drain electrode of each third transistor T3. The third transistors T3 may be connected to the initialization voltage wiring VIL through the fourth conductive pattern DP4 and may receive the initialization voltage.

The fifth conductive pattern DP5 may be on the left side of each pixel PX to extend in the second direction DR2. The fifth conductive pattern DP5 may overlap the second wiring vertical portion VSL_V in the thickness direction and may be connected to the second wiring vertical portion VSL_V through ninth contact holes CT9 penetrating the buffer layer BF, the first gate insulating layer GI and the first interlayer insulating layer IL1. In some embodiments, the fifth conductive pattern DP5 may be connected to a second electrode line RM2 to be described hereinbelow in more detail, and may apply the second power supply voltage to the second electrode line RM2 and the second electrodes RME2.

The wiring horizontal portions VDL_H and VSL_H of the voltage wirings VDL and VSL may be on the lower and upper sides of each pixel PX, respectively. The first wiring horizontal portion VDL_H may be connected to the first wiring vertical portion VDL_V through the first wiring contact hole CTV1, which penetrates the buffer layer BF, the first gate insulating layer GI and the first interlayer insulating layer IL1, at the intersection with the first wiring vertical portion VDL_V. Similarly, the second wiring horizontal portion VSL_H may be connected to the second wiring vertical portion VSL_V through the second wiring contact hole CTV2, which penetrates the buffer layer BF, the first gate insulating layer GI and the first interlayer insulating layer IL1, at the intersection with the second wiring vertical portion VSL_V.

A second interlayer insulating layer IL2 may be on the third conductive layer. The second interlayer insulating layer IL2 may function as an insulating film between the third conductive layer and other layers on the third conductive layer. In some embodiments, the second interlayer insulating layer IL2 may cover the third conductive layer and protect the third conductive layer. In some embodiments, the second interlayer insulating layer IL2 may perform a surface planarization function.

Each of the first through third conductive layers described above may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

In some embodiments, each of the buffer layer BF, the first gate insulating layer GI, the first interlayer insulating layer IL1 and the second interlayer insulating layer IL2 described above may be an inorganic layer including an inorganic material such as silicon oxide (SiOx), silicon nitride (SiNx), and/or silicon oxynitride (SiOxNy), or may have a structure in which the above materials are stacked.

A plurality of first banks BNL1, the electrode lines RM1 and RM2, the electrodes RME1 and RME2, the light emitting element ED, the second bank BNL2 and the contact electrodes CNE1 and CNE2 may be on the second interlayer insulating layer IL2. In some embodiments, a plurality of insulating layers PAS1 and PAS2 may be further provided on the second interlayer insulating layer IL2.

The first banks BNL1 may be directly on the second interlayer insulating layer IL2. One subpixel PXn includes a plurality of first banks BNL1 in the emission area EMA1, EMA2 or EMA3 and spaced apart from each other. For example, in one subpixel PXn, two first banks BNL1 may be in the emission area EMA1, EMA2 or EMA3, and may be spaced apart from each other in the first direction DR1. The light emitting element ED may be between the first banks BNL1 spaced apart in the first direction DR1. Although two first banks BNL1 are illustrated in the drawings as being in the emission area EMA1, EMA2 or EMA3 of each subpixel PXn to form linear or stripe patterns, the present disclosure is not limited thereto. The number of the first banks BNL1 in the emission area EMA1, EMA2 or EMA3 of each subpixel PXn may vary according to the number of the electrodes RME1 and RME2, and/or the arrangement of the light emitting elements ED.

Lengths of the first banks BNL1 measured in the second direction DR2 may be smaller than lengths of the emission areas EMA1 through EMA3 measured in the second direction DR2. Therefore, each first bank BNL1 might not overlap the second bank BNL2 of the non-emission area.

At least a portion of each first bank BNL1 may protrude from an upper surface of the second interlayer insulating layer IL2. The protruding portion of each first bank BNL1 may have inclined side surfaces, and light emitted from the light emitting elements ED may be reflected by the electrodes RME1 and RME2 on the first banks BNL1 to travel toward above the second interlayer insulating layer IL2. The first banks BNL1 may provide an area where the light emitting elements ED are positioned, while functioning as reflective barriers that can reflect light emitted from the light emitting elements ED in an upward direction (here, upward direction may refer to DR3 direction, or thickness direction). The side surfaces of the first banks BNL1 may be inclined in a linear shape (e.g., may be inclined lines). However, the present disclosure is not limited thereto, and outer surfaces of the first banks BNL1 may have a curved semi-circular and/or semi-elliptical shape. The first banks BNL1 may include an organic insulating material such as polyimide (PI), but the present disclosure is not limited thereto.

The electrodes RME1 and RME2 extend in a direction and are provided in each subpixel PXn. For example, the electrodes RME1 and RME2 may extend in the second direction DR2, may be spaced apart from each other in the first direction DR1, and may be provided in each subpixel PXn. The electrodes RME1 and RME2 may include the first electrode RME1 and the second electrode RME2, and a plurality of light emitting elements ED may be provided on the first and second electrodes RME1 and RME2. Although one first electrode RME1 and one second electrode RME2 in each subpixel PXn are illustrated in the drawings, the present disclosure is not limited thereto. The arrangement of the electrodes RME1 and RME2 in each subpixel PXn may vary according to the number of the electrodes RME1 and RME2, and/or the number of the light emitting elements ED in each subpixel PXn.

The electrodes RME1 and RME2 in each subpixel PXn may be respectively positioned on the first banks BNL1 spaced apart from each other. Each of the electrodes RME1 and RME2 may be on a side of a first bank BNL1 in the first direction DR1 and may be on an inclined side surface of the first bank BNL1. In some embodiments, widths of the electrodes RME1 and RME2 measured in the first direction DR1 may be smaller than widths of the first banks BNL1 measured in the first direction DR1. Each of the electrodes RME1 and RME2 may cover at least one side surface of the first bank BNL1 to reflect light emitted from the light emitting elements ED.

In some embodiments, a gap between the electrodes RME1 and RME2 in the first direction DR1 may be smaller than a gap between the first banks BNL1. At least a portion of each of the electrodes RME1 and RME2 may be directly on the second interlayer insulating layer IL2, and thus the portions may lie in the same plane.

The display device 10 according to some embodiments may include the electrode lines RM1 and RM2 outside the emission areas EMA1 through EMA3 of each pixel PX to surround the emission areas EMA1 through EMA3. The electrode lines RM1 and RM2 may include a first electrode line RM1 extending in the second direction DR2 on the right side of each pixel PX and overlapping the first wiring vertical portion VDL_V of the first voltage wiring VDL and the second electrode line RM2 extending in the second direction DR2 on the left side of each pixel PX and overlapping the second wiring vertical portion VSL_V of the second voltage wiring VSL. Each of the electrode lines RM1 and RM2 may partially overlap the first voltage wiring VDL or the second voltage wiring VSL and may be connected to the first voltage wiring VDL or the second voltage wiring VSL.

In some embodiments, each of the first electrode line RM1 and the second electrode line RM2 may further include a portion branching in the first direction DR1. For example, the first electrode line RM1 may include a first electrode stem portion RM1_S extending in the second direction DR2 and a first electrode branch portion RM1_B branching from the first electrode stem portion RM1_S in the first direction DR1. The second electrode line RM2 may include a second electrode stem portion RM2_S extending in the second direction DR2 and a second electrode branch portion RM2_B branching from the second electrode stem portion RM2_S in the first direction DR1. The first electrode branch portion RM1_B branches toward the second side of the first direction DR1, is spaced apart from the second electrode stem portion RM2_S, and overlaps the first wiring horizontal portion VDL_H. The second electrode branch portion RM2_B branches toward the first side of the first direction DR1, is spaced apart from the first electrode stem portion RM1_S, and overlaps the second wiring horizontal portion VSL_H.

In some embodiments, the electrode lines RM1 and RM2 may be utilized to generate an electric field for placing (arranging) the light emitting elements ED, by transmitting alignment signals to the electrodes RME1 and RME2 in each emission area EMA1, EMA2 or EMA3. The first electrode line RM1 and the second electrode line RM2 including the electrode stem portions RM1_S and RM2_S may be provided across a plurality of pixels PX. The electrode lines RM1 and RM2 may be connected to the first electrode RME1 and the second electrode RME2 of each subpixel PXn. When alignment signals are transmitted to the electrode lines RM1 and RM2, an electric field may be generated on the electrodes RME1 and RME2. The light emitting elements ED may be sprayed onto the electrode lines RM1 and RM2 through an inkjet printing process. When ink containing the light emitting elements ED is sprayed onto the electrode lines RM1 and RM2, alignment signals are transmitted to the electrode lines RM1 and RM2 to generate an electric field. The light emitting elements ED may be placed (arranged) on the electrodes RME1 and RME2 by the electric field formed between the electrode lines RM1 and RM2. For example, the light emitting elements ED dispersed in the ink may be aligned on the electrodes RME1 and RME2 by a dielectrophoretic force due to the generated electric field.

In some embodiments in which each electrode line RM1 or RM2 includes the electrode stem portion RM1_S or RM2_S and the electrode branch portion RM1_B or RM2_B branching from the electrode stem portion RM1_S or RM2_S, the first electrodes RME1 and the second electrodes RME2 may be connected to the first electrode branch portion RM1_B and the second electrode branch portion RM2_B, respectively. During a manufacturing process of the display device 10, the alignment signals transmitted to the electrode lines RM1 and RM2 may be transmitted to the electrodes RME1 and RME2, and the light emitting elements ED may be placed (arranged) by the electric field generated on the electrodes RME1 and RME2. Then, a process of separating the first electrodes RME1 and the first electrode branch portion RM1_B may be performed, and thus the first electrode RME1 may be connected only to the first transistor T1 connected to each subpixel PXn. The second electrodes RME2 may remain connected to the second electrode branch portion RM2_B and may receive the second power supply voltage from the second electrode line RM2 connected to the second voltage wiring VSL.

For example, when alignment voltages applied to the electrode lines RM1 and RM2 are different from voltages applied to wirings under the electrode lines RM1 and RM2 (for example, the voltage wirings VDL and VSL of the third conductive layer), the intensity of an electric field generated by the alignment signals may be weak, and/or the direction of the electric field may be formed in an unwanted (or unsuitable/undesirable) area. This may increase the possibility that the light emitting elements ED will be lost without being aligned at a desired position. In the display device 10 according to some embodiments, the voltage wirings VDL and VSL may be outside the emission areas EMA1 through EMA3, and the light emitting elements ED may be aligned by utilizing the electrode lines RM1 and RM2 connected to the voltage wirings VDL and VSL. Because the voltage wirings VDL and VSL are outside the emission areas EMA1 through EMA3, the effect of the voltage wirings VDL and VSL on the direction or intensity of the electric field generated in the emission areas EMA1 through EMA3 can be reduced. In some embodiments, because the electrode lines RM1 and RM2 are connected to the voltage wirings VDL and VSL, an equipotential may be formed between them. Accordingly, the loss of the light emitting elements ED can be prevented or reduced. The electrode lines RM1 and RM2 will be described in more detail hereinbelow by further referring to the drawings.

The electrodes RME1 and RME2 may be electrically connected to the light emitting elements ED. In some embodiments, the electrodes RME1 and RME2 may be connected to the third conductive layer to receive signals that facilitate the light emitting elements ED to emit light.

The first electrodes RME1 and the second electrodes RME2 may be electrically connected to the third conductive layer respectively through first electrode contact holes CTD and second electrode contact holes CTS formed in the second electrode line RM2. For example, the first electrodes RME1 may include electrode contact portions CTP formed in portions where the first banks BNL1 are not provided in the emission areas EMA1 through EMA3, and the electrode contact portions CTP may contact the second capacitive electrodes CSE2 through the first electrode contact holes CTD penetrating the second interlayer insulating layer IL2. The second electrodes RME2 may be formed in areas where the second electrode line RM2 in the non-emission area overlaps the second bank BNL2 and may contact the fifth conductive pattern DP5 through the second electrode contact holes CTS penetrating the second interlayer insulating layer IL2. The first electrodes RME1 may be electrically connected to the first transistors T1 through the second capacitive electrodes CSE2 to receive the first power supply voltage, and the second electrodes RME2 may be electrically connected to the second voltage wiring VSL through the second electrode line RM2 and the fifth conductive pattern DP5 to receive the second power supply voltage. Because the first electrode RME1 is provided separately in each pixel PX and each subpixel PXn, the light emitting elements ED of different subpixels PXn may emit light individually (e.g., independently).

Each of the electrodes RME1 and RME2 and the electrode lines RM1 and RM2 may include a conductive material having high reflectivity. For example, the electrodes RME1 and RME2 may each independently include a metal such as silver (Ag), copper (Cu) and/or aluminum (Al) as a material having high reflectivity, or may be an alloy including aluminum (Al), nickel (Ni) and/or lanthanum (La). Each of the electrodes RME1 and RME2 may reflect light, which travels toward a side surface of a first bank BNL1 after being emitted from the light emitting elements ED, toward above each subpixel PXn.

However, the present disclosure is not limited thereto, and each of the electrodes RME1 and RME2 may further include a transparent conductive material. For example, the electrodes RME1 and RME2 may each independently include a material such as ITO, IZO and/or ITZO. In some embodiments, each of the electrodes RME1 and RME2 may have a structure in which a transparent conductive material and a metal layer having high reflectivity are each stacked in one or more layers, or may be formed as a single layer including the transparent conductive material and the metal layer. For example, each of the electrodes RME1 and RME2 may have a stacked structure of ITO/Ag/ITO, ITO/Ag/IZO, or ITO/Ag/ITZO/IZO.

A first insulating layer PAS1 may be provided on the electrodes RME1 and RME2 and the first banks BNL1. The first insulating layer PAS1 may cover the first banks BNL1 and the first electrodes RME1 and the second electrodes RME2, but may partially expose upper surfaces of the first electrodes RME1 and the second electrodes RME2. Openings may be formed in the first insulating layer PAS1 to expose a portion of the upper surface of each electrode RME1 or RME2 which is on the first bank BNL1, and the contact electrodes CNE1 and CNE2 may contact the electrodes RME1 and RME2 through the formed openings.

In some embodiments, the first insulating layer PAS1 may be stepped, such that a portion of an upper surface of the first insulating layer PAS1 is recessed between the first and second electrodes RME1 and RME2. When the first insulating layer PAS1 covers the first electrodes RME1 and the second electrodes RME2, it may have a step between them. However, the present disclosure is not limited thereto. The first insulating layer PAS1 may protect the first electrodes RME1 and the second electrodes RME2 while insulating them from each other. In some embodiments, the first insulating layer PAS1 may prevent (or reduce) the light emitting elements ED on the first insulating layer PAS1 from directly contacting other members and thus being damaged.

The second bank BNL2 may be provided on the first insulating layer PAS1. The second bank BNL2 may include portions extending in the first direction DR1 and the second direction DR2 to form a lattice pattern in plan view. The second bank BNL2 may be at the boundary of each subpixel PXn to separate neighboring subpixels PXn. In some embodiments, the second bank BNL2 may surround the emission area EMA1, EMA2 or EMA3 and the cut area CBA in each subpixel PXn to separate them from each other. Of the portions of the second bank BNL2 extending in the second direction DR2, a portion between the emission areas EMA1 through EMA3 and a portion between the cut areas CBA may have the same width. Accordingly, a gap between the cut areas CBA may be, but is not limited to, equal to a gap between the emission areas EMA1 through EMA3.

The second bank BNL2 may be formed to have a greater height in the third direction DR3 than the first banks BNL1. The second bank BNL2 may prevent or reduce ink from overflowing to adjacent subpixels PXn in an inkjet printing process of the manufacturing process of the display device 10. Therefore, the second bank BNL2 may separate inks in which different light emitting elements ED are dispersed for different subpixels PXn, so that the inks are not mixed with each other. As one first bank BNL1 is provided over subpixels PXn neighboring in the first direction DR1, a portion among the portions of the second bank BNL2 extending the second direction DR2 may also be on the first bank BNL1. Like the first banks BNL1, the second bank BNL2 may include polyimide (PI), but the present disclosure is not limited thereto.

The light emitting elements ED may be on the first insulating layer PAS1. The light emitting elements ED may be spaced apart from each other along the second direction DR2 in which each electrode RME1 and RME2 extends, and may be aligned substantially parallel to each other. The light emitting elements ED may extend in a direction, and the direction in which each electrode RME1 and RME2 extends and the direction in which the light emitting elements ED extend may be substantially perpendicular to each other. However, the present disclosure is not limited thereto, and the light emitting elements ED may also extend obliquely to the direction in which each electrode RME1 and RME2 extends.

Each light emitting element ED may include semiconductor layers doped with different conductivity types (e.g., a p-type or an n-type). Each light emitting element ED including the semiconductor layers may be oriented such that an end of the light emitting element ED faces in a specific (or set) direction according to the direction of an electric field generated on the electrodes RME1 and RME2. In some embodiments, each light emitting element ED may include a light emitting layer 36 (see FIG. 13) to emit light of a specific (or set) wavelength band. The light emitting elements ED in each subpixel PXn may emit light of different wavelength bands according to the material that forms the light emitting layer 36. However, the present disclosure is not limited thereto, and the light emitting elements ED in each of the subpixels PXn may also emit light of the same color.

The light emitting elements ED may be on the electrodes RME1 and RME2 between the first banks BNL1. For example, a first end of each light emitting element ED may be on the first electrode RME1, and a second end may be on the second electrode RME2. A length of each light emitting element ED in the first direction DR1 may be greater than the gap between the first electrode RME1 and the second electrode RME2 in the first direction DR1, and both ends of the light emitting element ED may be on the first electrode RME1 and the second electrode RME2, respectively.

Each light emitting element ED may include a plurality of layers extending in a direction perpendicular to an upper surface of the first substrate SUB. The direction in which the light emitting elements ED of the display device 10 extend may be parallel to the first substrate SUB, and a plurality of semiconductor layers included in each light emitting element ED may be sequentially stacked along a direction parallel to the upper surface of the first substrate SUB. However, the present disclosure is not limited thereto. In some embodiments, when each light emitting element ED has a different structure, the semiconductor layers may be stacked in the direction perpendicular to the first substrate SUB.

Both ends of each light emitting element ED may contact the contact electrodes CNE1 and CNE2, respectively. For example, an insulating film 38 (see FIG. 13) might not be formed on end surfaces of each light emitting element ED in the direction in which each light emitting element ED extends, thereby partially exposing the semiconductor layers. The exposed semiconductor layers may contact the contact electrodes CNE1 and CNE2. However, the present disclosure is not limited thereto. In some embodiments, at least a portion of the insulating film 38 of each light emitting element ED may be removed to partially expose side surfaces of both ends of the semiconductor layers. The exposed side surfaces of the semiconductor layers may directly contact the contact electrodes CNE1 and CNE2.

A second insulating layer PAS2 may be partially on the light emitting elements ED. For example, the second insulating layer PAS2 may partially surround an outer surface of each light emitting element ED but not cover the first end and the second end of each light emitting element ED. The contact electrodes CNE1 and CNE2 may respectively contact both ends of each light emitting element ED not covered by the second insulating layer PAS2. Of the second insulating layer PAS2, a portion on the light emitting elements ED may extend in the second direction DR2 on the first insulating layer PAS1 in plan view to form a linear or island pattern in each subpixel PXn. The second insulating layer PAS2 may protect the light emitting elements ED while fixing (e.g., stabilizing) the light emitting elements ED in the manufacturing process of the display device 10.

During the manufacturing process of the display device 10, a cutting process for forming each electrode RME1 or RME2—by forming electrode lines and then separating the electrode lines—may be performed after the second insulating layer PAS2 is formed. The second insulating layer PAS2 may be omitted from the cut areas CBA but may be only in the emission areas EMA1 through EMA3. In the cut areas CBA, only the electrodes RME1 and RME2 and the first insulating layer PAS1 may be positioned. In the cut areas CBA, the electrodes RME1 and RME2 may be spaced apart to expose the second interlayer insulating layer IL2, and the first insulating layer PAS1 may be separately provided on the separated electrodes RME1 and RME2.

A plurality of contact electrodes CNE1 and CNE2 may be on the second insulating layer PAS2. A first contact electrode CNE1 and a second contact electrode CNE2 of the contact electrodes CNE1 and CNE2 may be on a portion of each first electrode RME1 and a portion of each second electrode RME2, respectively. The first contact electrode CNE1 may be on each first electrode RME1, and the second contact electrode CNE2 may be on each second electrode RME2. The first contact electrode CNE1 and the second contact electrode CNE2 may extend in the second direction DR2. The first contact electrode CNE1 and the second contact electrode CNE2 may be spaced apart from each other in the first direction DR1 to face each other, and may form linear patterns in the emission area EMA1, EMA2 or EMA3 of each subpixel PXn.

In some embodiments, widths of the first and second contact electrodes CNE1 and CNE2 measured in a direction (e.g., in the first direction DR1) may be smaller than widths of the first and second electrodes RME1 and RME2 measured in the direction (e.g., in the first direction DR1). The first contact electrode CNE1 and the second contact electrode CNE2 may respectively contact the first end and the second end of each light emitting element ED and may be only on a portion of the upper surfaces of the first and second electrodes RME1 and RME2.

The contact electrodes CNE1 and CNE2 may contact the light emitting elements ED and the electrodes RME1 and RME2. The semiconductor layers may be exposed on both end surfaces of each light emitting element ED in the direction in which each light emitting element ED extends, and the first contact electrode CNE1 and the second contact electrode CNE2 may contact each light emitting element ED at the end surfaces where the semiconductor layers are exposed. The first end of each light emitting element ED may be electrically connected to the first electrode RME1 through the first contact electrode CNE1, and the second end may be electrically connected to the second electrode RME2 through the second contact electrode CNE2.

Although one first contact electrode CNE1 and one second contact electrode CNE2 in one subpixel PXn are illustrated in the drawings, the present disclosure is not limited thereto. The number of the first contact electrodes CNE1 and the second contact electrodes CNE2 may vary according the number of the first electrodes RME1 and the second electrodes RME2 in each subpixel PXn.

The contact electrodes CNE1 and CNE2 may include a conductive material such as ITO, IZO, ITZO, and/or aluminum (Al). For example, the contact electrodes CNE1 and CNE2 may each independently include a transparent conductive material, and light emitted from the light emitting elements ED may pass through the contact electrodes CNE1 and CNE2 and proceed toward the electrodes RME1 and RME2, but the present disclosure is not limited thereto.

In some embodiments, an insulating layer may be further provided on the contact electrodes CNE1 and CNE2 and the second bank BNL2 to cover them. The insulating layer may be entirely on the first substrate SUB to protect members positioned on the first substrate SUB from the external environment.

Each of the first insulating layer PAS1 and the second insulating layer PAS2 described above may include an inorganic insulating material or an organic insulating material. In some embodiments, each of the first insulating layer PAS1 and the second insulating layer PAS2 may include an inorganic insulating material such as silicon oxide (SiOx), silicon nitride (SiNx), silicon oxynitride (SiOxNy), aluminum oxide ($Al_2O_3$), and/or aluminum nitride (AlN). In some embodiments, each of the first insulating layer PAS1 and the second insulating layer PAS2 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/ or polymethyl methacrylate-polycarbonate synthetic resin. However, the present disclosure is not limited thereto.

As described above, the display device 10 according to some embodiments may include the voltage wirings VDL and VSL outside the emission areas EMA1 through EMA3 of each pixel PX, and the electrode lines RM1 and RM2 overlapping the voltage wirings VDL and VSL.

Figure 10:
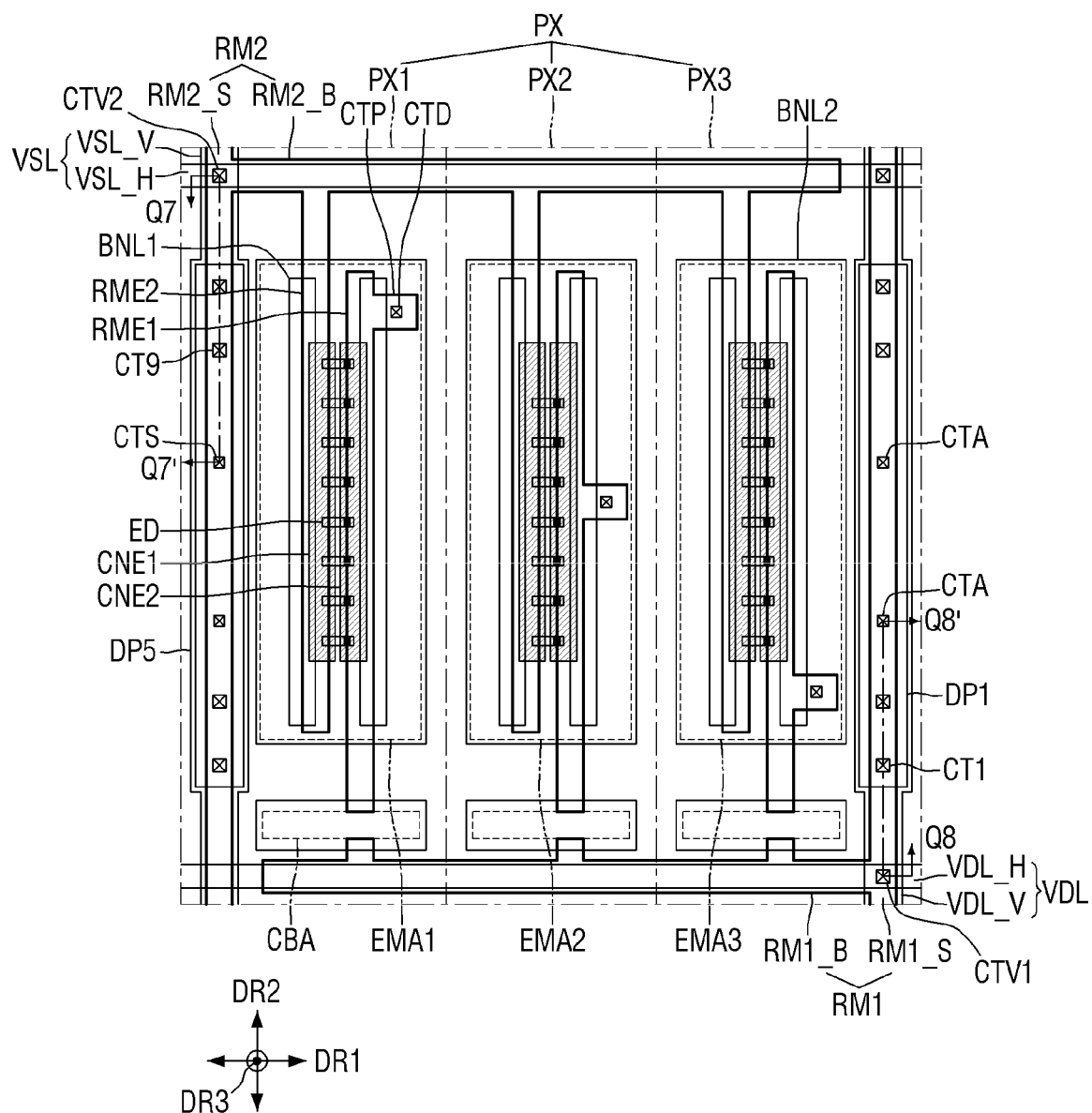
FIG. 10 is a schematic view illustrating the arrangement of voltage wirings, electrodes, and electrode lines in one pixel of the display device according to some embodiments.
Figure 11:
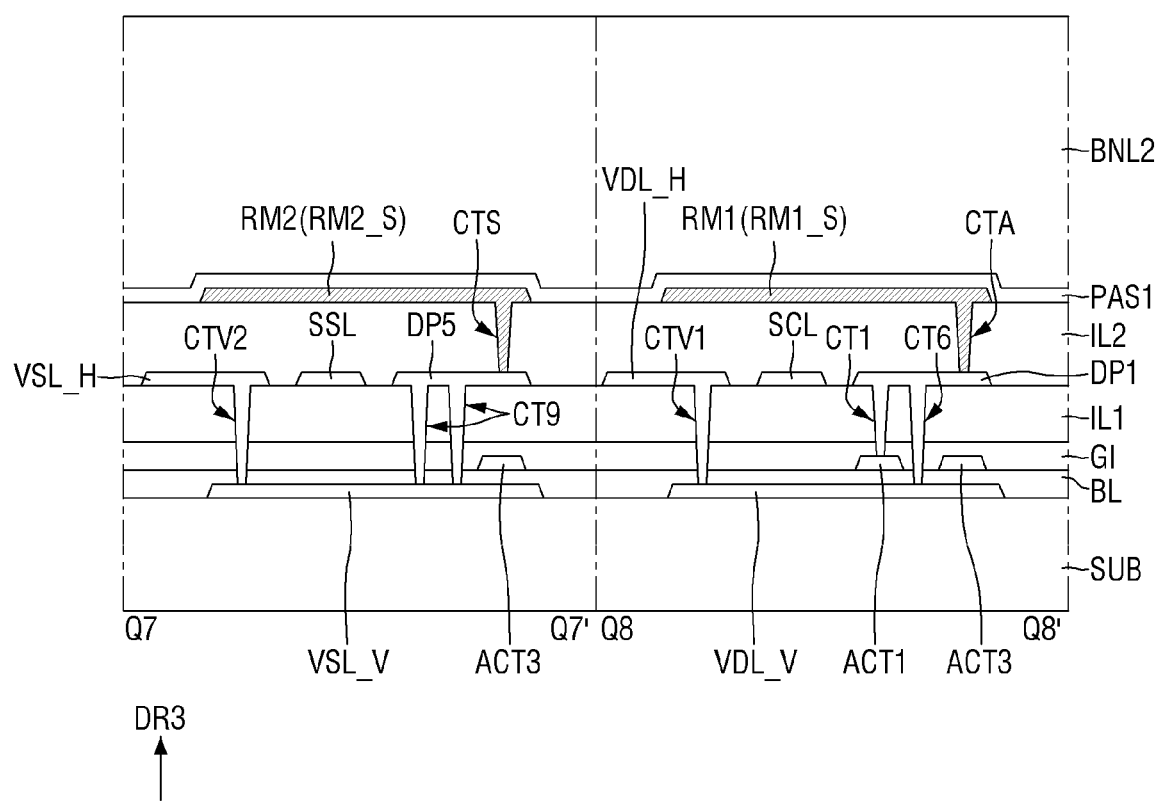
FIG. 11 is a cross-sectional view taken along lines Q7-Q7' and Q8-Q8' of FIG. 10.

FIG. 10 is a schematic view illustrating the arrangement of voltage wirings, electrodes, and electrode lines in one pixel PX of the display device 10 according to some embodiments. FIG. 11 is a cross-sectional view taken along lines Q7-Q7' and Q8-Q8' of FIG. 10. FIG. 11 illustrates a cross-section of portions where the voltage wirings VDL and VSL and the electrode lines RM1 and RM2 are connected.

Referring to FIGS. 10 and 11, in the display device 10, the voltage wirings VDL and VSL including the wiring vertical portions VDL_V and VSL_V and the wiring horizontal portions VDL_H and VSL_H may be outside the emission areas EMA1 through EMA3 of each pixel PX. The voltage wirings VDL and VSL may overlap the second bank BNL2 in the thickness direction and may be adjacent to a boundary between adjacent pixels PX. The voltage wirings VDL and VSL may be omitted from inside the emission areas EMA1 through EMA3 of the pixel PX, or between the emission areas EMA1 through EMA3, but may surround the emission areas EMA1 through EMA3. One voltage wiring VDL and/or VSL may be connected to at least one pixel PX, and the subpixels PXn of each pixel PX may share the same voltage wiring VDL and/or VSL.

The first electrode line RM1 and the second electrode line RM2 may also overlap the voltage wirings VDL and VSL and surround the emission areas EMA1 through EMA3. As described above, the electrode lines RM1 and RM2 may respectively include the electrode stem portions RM1_S and RM2_S overlapping the wiring vertical portions VDL_V and VSL_V in the thickness direction and the electrode branch portions RM1_B and RM2_B overlapping the wiring horizontal portions VDL_H and VSL_H in the thickness direction.

The first electrode stem portion RM1_S may contact the first conductive pattern DP1 through a plurality of third electrode contact holes CTA penetrating the second interlayer insulating layer IL2, and thus may be connected to the first voltage wiring VDL. The second electrode stem portion RM2_S may contact the fifth conductive pattern DP5 through a plurality of second electrode contact holes CTS penetrating the second interlayer insulating layer IL2, and thus may be connected to the second voltage wiring VSL.

During the manufacturing process of the display device 10, the first electrode branch portion RM1_B of the first electrode line RM1 may be connected to the first electrode RME1 in each subpixel PXn. Because the second electrodes RME2 are also connected to the second electrode branch portion RM2_B, the first electrode line RM1 and the second electrode line RM2 in one pixel PX may be substantially simultaneously (or concurrently) connected to the electrodes RME1 and RME2 in a plurality of subpixels PXn.

Alignment signals may be directly transmitted to the electrode stem portions RM1_S and RM2_S and then transmitted to the electrodes RME1 and RME2 through the electrode branch portions RM1_B and RM2_B to form electric fields on the electrodes RME1 and RME2. The subpixels PXn of each pixel PX may share the same electrode lines RM1 and RM2, and the electrodes RME1 and RME2 may be connected to the electrode lines RM1 and RM2. Thus, the electric fields may be substantially simultaneously (or concurrently) generated.

In some embodiments, the first voltage wiring VDL and the second voltage wiring VSL may be connected to the electrode stem portions RM1_S and RM2_S to receive the alignment signals. Accordingly, the same voltages may be applied to the electrode lines RM1 and RM2 and to the voltage wirings VDL and VSL under the electrode lines RM1 and RM2, to form an equipotential. When the voltage wirings VDL and VSL form an equipotential with the electrode lines RM1 and RM2 without being positioned across the inside of the emission areas EMA1 through EMA3, an electric field might not be generated in an unwanted (or undesirable) area by the voltage wirings VDL and VSL, and the movement of the light emitting elements ED out of place may be prevented or reduced.

After the placement of the light emitting elements ED, a process of separating the first electrodes RME1 from the first electrode line RM1 is performed to drive each subpixel PXn separately. In some embodiments, the first electrodes RME1 may be separated and spaced apart from the first electrode branch portion RM1_B in the cut areas CBA. When the first electrodes RME1 are separated from the first electrode line RM1, they may receive the first power supply voltage of the first voltage wiring VDL from the first transistors T1 connected through the first electrode contact holes CTD. On the other hand, the second electrodes RME2 might not be separated from the second electrode line RM2 and may receive the second power supply voltage of the second voltage wiring VSL connected through the second electrode contact holes CTS.

In the display device 10 according to some embodiments, the first electrode line RM1 and the first voltage wiring VDL may be electrically connected to each other, and the second electrode line RM2 and the second voltage wiring VSL may be electrically connected to each other during the manufacturing process. Because they are arranged in a mesh structure over the entire display area DPA, a voltage drop can be prevented or reduced. In some embodiments, the subpixels PXn included in each pixel PX may share the same voltage wirings VDL and VSL and the same electrode lines RM1 and RM2, and the display device 10 can reduce the number of wirings required per unit area. Therefore, an ultra-high resolution display device can be implemented.

When the voltage wirings VDL and VSL have a mesh structure, the voltage wirings VDL and VSL and the electrode lines RM1 and RM2 are provided at the boundaries of pixels PX adjacent in the first direction DR1 and the second direction DR2. When different voltage wirings VDL and VSL and different electrode lines RM1 and RM2 are included in one pixel PX, the arrangement structure of the subpixels PXn in each pixel PX may be the same.

Figure 12:
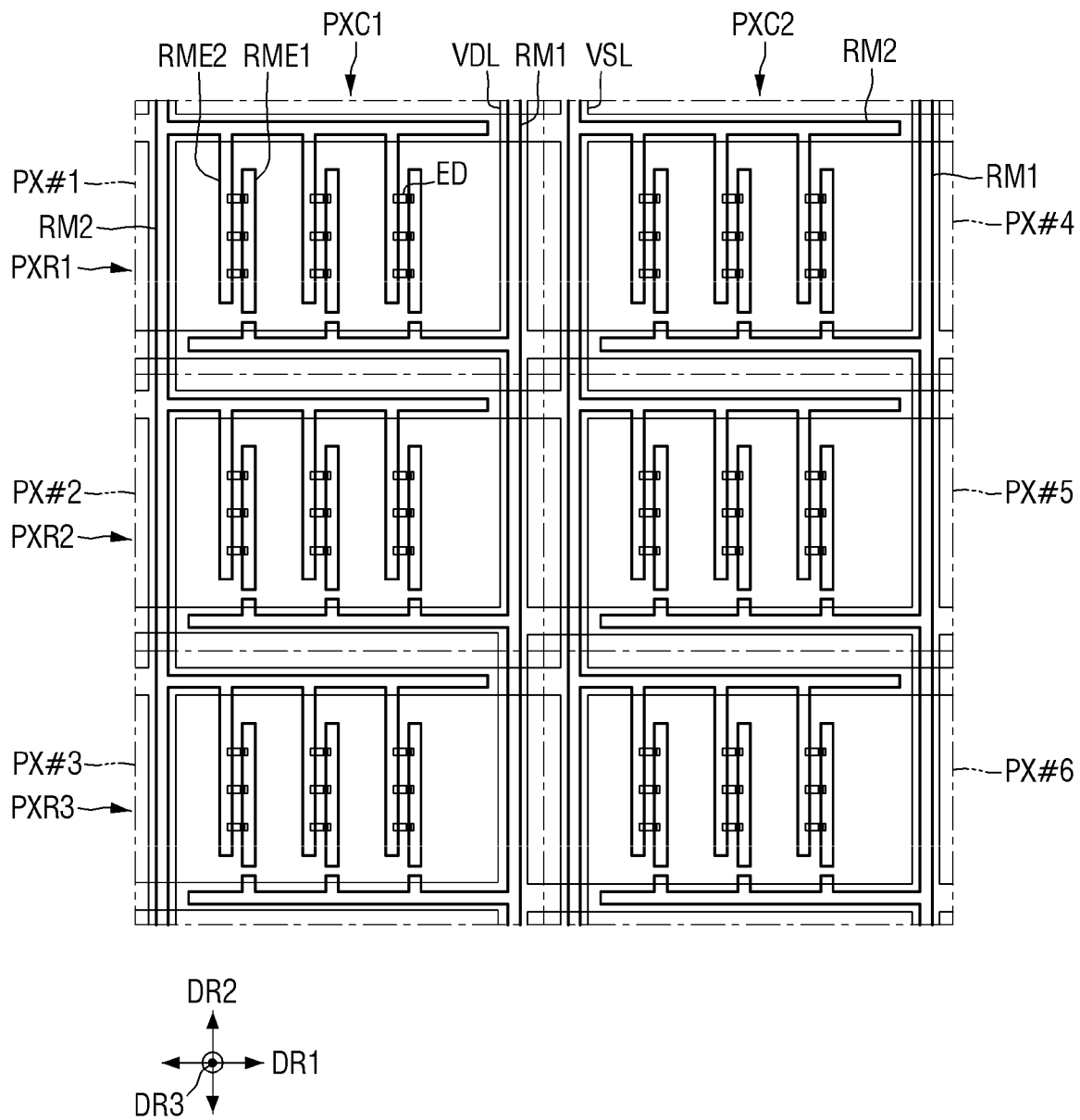
FIG. 12 is a schematic view illustrating the arrangement of the voltage wirings and the electrode lines in a plurality of pixels of the display device according to some embodiments.

FIG. 12 is a schematic view illustrating the arrangement of the voltage wirings VDL and VSL and the electrode lines RM1 and RM2 in a plurality of pixels PX of the display device 10 according to some embodiments. FIG. 12 schematically illustrates the pixels PX separated by the voltage wirings VDL and VSL and the electrode lines RM1 and RM2 and the arrangement of the electrodes RME1 and RME2 and the light emitting elements ED in the subpixels PXn of each pixel PX.

Referring to FIG. 12, the first voltage wiring VDL and the second voltage wiring VSL may extend in the first direction DR1 and the second direction DR2 and may be in each pixel PX. In the same way, the first electrode line RM1 and the second electrode line RM2 may include portions extending in the first direction DR1 and the second direction DR2 and may overlap the voltage wirings VDL and VSL in each pixel PX.

In the display area DPA, a plurality of pixel columns PXC1 and PXC2 and a plurality of pixel rows PXR1 through PXR3 may be arranged. In the drawing, the pixels PX in a first pixel column PXC1, a second pixel column PXC2, a first pixel row PXR1, a second pixel row PXR2, and a third pixel row PXR3 are illustrated. In the first pixel column PXC1, a first pixel PX #1 in the first pixel row PXR1, a second pixel PX #2 in the second pixel row PXR2, and a third pixel PX #3 in the third pixel row PXR3 are provided. In the second pixel column PXC2, a fourth pixel PX #4 in the first pixel row PXR1, a fifth pixel PX #5 in the second pixel row PXR2, and a sixth pixel PX #6 in the third pixel row PXR3 are provided.

In the current example, the structures of the voltage wirings VDL and VSL and the electrode lines RM1 and RM2 may be repeated on a pixel-by-pixel basis. As pixels in the same pixel column PXC, the first pixel PX #1, the second pixel PX #2 and the third pixel PX #3 of the first pixel column PXC1 may share the same wiring vertical portions VDL_V and VSL_V. Similarly, the fourth pixel PX #4, the fifth pixel PX #5 and the sixth pixel PX #6 of the second pixel column PXC2 may also share the same wiring vertical portions VDL_V and VSL_V. In some embodiments, as pixels in the same pixel row PXR, the first pixel PX #1 and the fourth pixel PX #4 of the first pixel row PXR1 may share the same wiring horizontal portions VDL_H and VSL_H. Similarly, the second pixel PX #2 and the fifth pixel PX #5 of the second pixel row PXR2, and the third pixel PX #3 and the sixth pixel PX #6 of the third pixel row PXR3, may share the same wiring horizontal portions VDL_H and VSL_H, respectively. However, different wiring vertical portions VDL_V and VSL_V and different wiring horizontal portions VDL_H and VSL_H may be in pixels PX that are both in different pixel columns PXC and in different pixel rows PXR.

In the case of the first electrode line RM1 and the second electrode line RM2, pixels in the same pixel column PXC may share the electrode stem portions RM1_S and RM2_S which are different from the electrode stem portions RM1_S and RM2_S shared by pixels in a different pixel column PXC. However, pixels in the same pixel row PXR may have different electrode branch portions RM1_B and RM2_B.

In some embodiments in which the voltage wirings VDL and VSL and the electrode lines RM1 and RM2 are in each pixel PX, the arrangement of the electrodes RME1 and RME2 and the arrangement of the light emitting elements ED may be the same in the first through sixth pixels PX #1 through PX #6. The second electrode line RM2 may be on the upper side of the center of each pixel PX, and the first electrode line RM1 may be on the lower side of the center of each pixel PX. In each subpixel PXn, the second electrode RME2 may be on the left side, and the first electrode RME1 may be on the right side. Each light emitting element ED may include a plurality of semiconductor layers and the light emitting layer 36 between them, and the first end of the light emitting element ED adjacent to the light emitting layer 36 may be defined. The light emitting elements ED may be placed such that their respective first ends lie on the first electrode RME1 to which the first power supply voltage is applied. As in the example shown in FIG. 12, the light emitting elements ED of the first through sixth pixels PX #1 through PX #6 may be placed such that their first ends face the first side of the direction DR1.

In the display device 10, because the voltage wirings VDL and VSL and the electrode lines RM1 and RM2 extending in the first direction DR1 and the second direction DR2 are in each pixel PX, the arrangement of the electrodes RME1 and RME2 and the arrangement of the light emitting elements ED may be the same in each pixel PX. However, the present disclosure is not limited thereto. In some embodiments, pixels PX adjacent to each other may share the voltage wirings VDL and VSL or the electrode lines RM1 and RM2, and a plurality of pixels PX may include different types (or kinds) of pixels which are different in the direction in which the light emitting elements ED of each subpixel PXn face. This will be described with reference to other embodiments.

Figure 13:
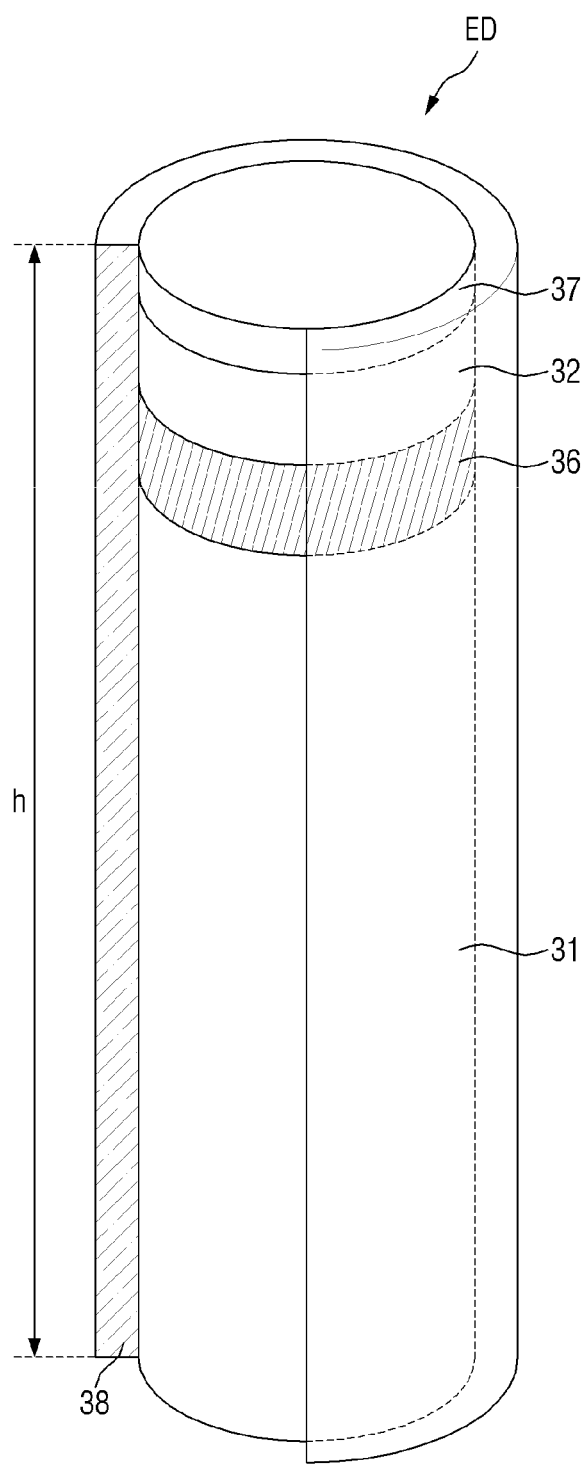
FIG. 13 is a schematic view of a light emitting element according to some embodiments.

FIG. 13 is a schematic view of a light emitting element ED according to some embodiments.

The light emitting element ED may be a light emitting diode. For example, the light emitting element ED may be an inorganic light emitting diode having a size of micrometers or nanometers and made of an inorganic material. When an electric field is formed in a specific (or set) direction between two electrodes facing each other, the inorganic light emitting diode may be aligned between the two electrodes in which polarities are formed. The light emitting element ED may be aligned between the electrodes by the electric field formed on the two electrodes.

The light emitting element ED according to some embodiments may extend in one direction. The light emitting element ED may be shaped like a rod, a wire, a tube, and/or the like. In some embodiments, the light emitting element ED may be shaped like a cylinder or a rod. However, the shape of the light emitting element ED is not limited thereto, and the light emitting element ED may have various suitable shapes including polygonal prisms, such as a cube, a rectangular parallelepiped and/or a hexagonal prism, and may have a shape extending in a direction and having a partially inclined outer surface. A plurality of semiconductors included in the light emitting element ED may be sequentially arranged or stacked along the one direction.

The light emitting element ED may include a semiconductor layer doped with impurities of any conductivity type (e.g., a p type or an n type). The semiconductor layer may receive an electrical signal from an external power source and emit light of a specific (or set) wavelength band.

Referring to FIG. 13, the light emitting element ED may include a first semiconductor layer 31, a second semiconductor layer 32, the light emitting layer 36, an electrode layer 37, and the insulating film 38.

The first semiconductor layer 31 may be an n-type semiconductor. For example, when the light emitting element ED is to emit light in a blue wavelength band, the first semiconductor layer 31 may include a semiconductor material having a chemical formula of $Al_xGa_yIn_{1-x-y}N$ (where $0 \leq x \leq 1$, $0 \leq y \leq 1$, $0 \leq x+y \leq 1$). The semiconductor material included in the first semiconductor layer 31 may be, for example, one or more selected from n-type doped AlGaInN, GaN, AlGaN, InGaN, AlN, and InN. The first semiconductor layer 31 may be doped with an n-type dopant, and the n-type dopant may be, for example, Si, Ge, and/or Sn. In some embodiments, the first semiconductor layer 31 may be n-GaN doped with n-type Si. A length of the first semiconductor layer 31 may be in the range of, but not limited to, about 1.5 to about 5 μm.

The second semiconductor layer 32 may be on the light emitting layer 36. The second semiconductor layer 32 may be a p-type semiconductor. For example, when the light emitting element ED is to emit light in a blue or green wavelength band, the second semiconductor layer 32 may include a semiconductor material having a chemical formula of $Al_xGa_yIn_{1-x-y}N$ (where $0 \leq x \leq 1$, $0 \leq y \leq 1$, $0 \leq x+y \leq 1$). The semiconductor material included in the second semiconductor layer 32 may be, for example, one or more selected from p-type doped AlGaInN, GaN, AlGaN, InGaN, AlN, and InN. The second semiconductor layer 32 may be doped with a p-type dopant, and the p-type dopant may be, for example, Mg, Zn, Ca, Se, and/or Ba. In some embodiments, the second semiconductor layer 32 may be p-GaN doped with p-type Mg. A length of the second semiconductor layer 32 may be in the range of, but not limited to, about 0.05 to about 0.10 μm.

Although each of the first semiconductor layer 31 and the second semiconductor layer 32 is composed of one layer in the drawing, the present disclosure is not limited thereto. According to embodiments, each of the first semiconductor layer 31 and the second semiconductor layer 32 may include more layers, for example, may further include a clad layer and/or a tensile strain barrier reducing (TSBR) layer, depending on the material of the light emitting layer 36.

The light emitting layer 36 may be between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to electrical signals received through the first semiconductor layer 31 and the second semiconductor layer 32. For example, when the light emitting layer 36 is to emit light in the blue wavelength band, it may include a material such as AlGaN and/or AlGaInN. In some embodiments, when the light emitting layer 36 has a multiple quantum well structure in which a quantum layer and a well layer are alternately stacked, the quantum layer may include a material such as AlGaN and/or AlGaInN, and the well layer may include a material such as GaN and/or AlInN. In some embodiments, the light emitting layer 36 may include AlGaInN as a quantum layer and AlInN as a well layer to emit blue light whose central wavelength band is in the range of about 450 to about 495 nm.

However, the present disclosure is not limited thereto, and the light emitting layer 36 may also have a structure in which a semiconductor material having a large band gap energy and a semiconductor material having a small band gap energy are alternately stacked, or may include different group 3 to 5 (Group III to V) semiconductor materials depending on the wavelength band of light that the light emitting layer 36 is to emit. Light emitted from the light emitting layer 36 is not limited to light in the blue wavelength band. In some embodiments, the light emitting layer 36 may emit light in a red or green wavelength band. A length of the light emitting layer 36 may be in the range of, but not limited to, about 0.05 to about 0.10 μm.

Light emitted from the light emitting layer 36 may be radiated not only through the longitudinal outer surface of the light emitting element ED but also through both side surfaces. The direction of light emitted from the light emitting layer 36 is not limited to one direction.

The electrode layer 37 may be an ohmic contact electrode. However, the present disclosure is not limited thereto, and the electrode layer 37 may also be a Schottky contact electrode. The light emitting element ED may include at least one electrode layer 37. Although the light emitting element ED includes one electrode layer 37 in FIG. 13, the present disclosure is not limited thereto. In some embodiments, the light emitting element ED may include more electrode layers 37, or the electrode layer 37 may be omitted. The following description of the light emitting element ED may be applied even if the light emitting element ED includes a different number of electrode layers 37 and/or further includes other structures.

When the light emitting element ED is electrically connected to an electrode or a contact electrode in the display device 10 according to some embodiments, the electrode layer 37 may reduce the resistance between the light emitting element ED and the electrode and/or the contact electrode. The electrode layer 37 may include a conductive metal. For example, the electrode layer 37 may include at least one selected from aluminum (Al), titanium (Ti), indium (In), gold (Au), silver (Ag), indium tin oxide (ITO), indium zinc oxide (IZO), and indium tin zinc oxide (ITZO). In some embodiments, the electrode layer 37 may include an n-type or p-type doped semiconductor material. The electrode layer 37 may include the same material or different materials, but the present disclosure is not limited thereto.

The insulating film 38 surrounds outer surfaces of a plurality of semiconductor layers and a plurality of electrode layers. In some embodiments, the insulating film 38 may surround an outer surface of at least the light emitting layer 36 and extend in the direction in which the light emitting element ED extends. The insulating film 38 may protect the above-described members (e.g., layers) of the light emitting element ED. For example, the insulating film 38 may surround side surfaces of the above-described members (e.g., layers) but may expose both ends of the light emitting element ED in a longitudinal direction.

In the drawing, the insulating film 38 extends in the longitudinal direction of the light emitting element ED to cover from a side surface of the first semiconductor layer 31 to a side surface of the electrode layer 37. However, the present disclosure is not limited thereto, and the insulating film 38 may also cover outer surfaces of only some semiconductor layers, as well as the light emitting layer 36, or may cover only a portion of an outer surface of the electrode layer 37 to partially expose the outer surface of each electrode layer 37. In some embodiments, an upper surface of the insulating film 38 may be rounded in cross section (e.g., may have a round cross section) in an area adjacent to at least one end of the light emitting element ED.

A thickness of the insulating film 38 may be in the range of, but not limited to, about 10 nm to about 1.0 μm. For example, the thickness of the insulating film 38 may be about 40 nm.

The insulating film 38 may include a material having insulating properties, such as silicon oxide (SiOx), silicon nitride (SiNx), silicon oxynitride (SiOxNy), aluminum nitride (AlNx), and/or aluminum oxide (AlOx). Accordingly, it can prevent or reduce an electrical short circuit that may occur when the light emitting layer 36 directly contacts an electrode that transmits an electrical signal to the light emitting element ED. In some embodiments, because the insulating film 38 protects the outer surface of the light emitting element ED including the light emitting layer 36, a reduction in luminous efficiency can be prevented or reduced.

In some embodiments, an outer surface of the insulating film 38 may be treated. The light emitting elements ED dispersed in a predetermined ink may be sprayed onto electrodes and then aligned. Here, the surface of the insulating film 38 may be hydrophobic or hydrophilic-treated so that the light emitting element ED is kept separate in the ink without being agglomerated with other adjacent light emitting elements ED.

A length h of the light emitting element ED may be in the range of about 1 to about 10 μm, or 2 to 6 μm, and may, for example, be in the range of about 3 to about 5 μm. In some embodiments, a diameter of the light emitting element ED may be in the range of about 30 to about 700 nm, and an aspect ratio of the light emitting element ED may be about 1.2 to about 100. However, the present disclosure is not limited thereto, and a plurality of light emitting elements ED included in the display device 10 may also have different diameters according to a difference in the composition of the light emitting layer 36. The diameter of the light emitting element ED may be, for example, about 500 nm.

A process of manufacturing the display device 10 according to some embodiments will now be described by further referring to other drawings.

Figure 14:
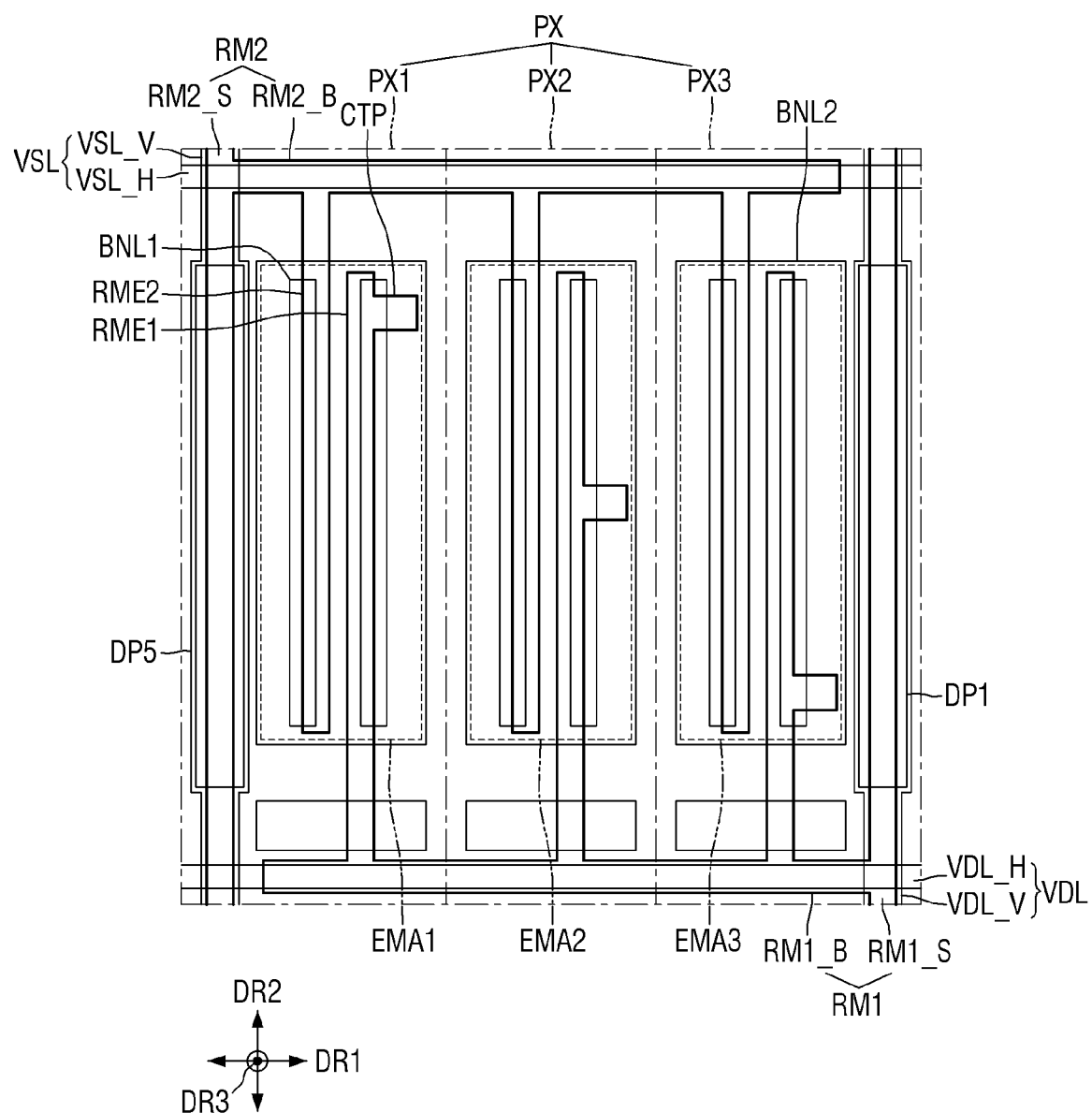
FIGS. 14 through 16 are plan views sequentially illustrating acts of a process of manufacturing the display device according to some embodiments.
Figure 15:
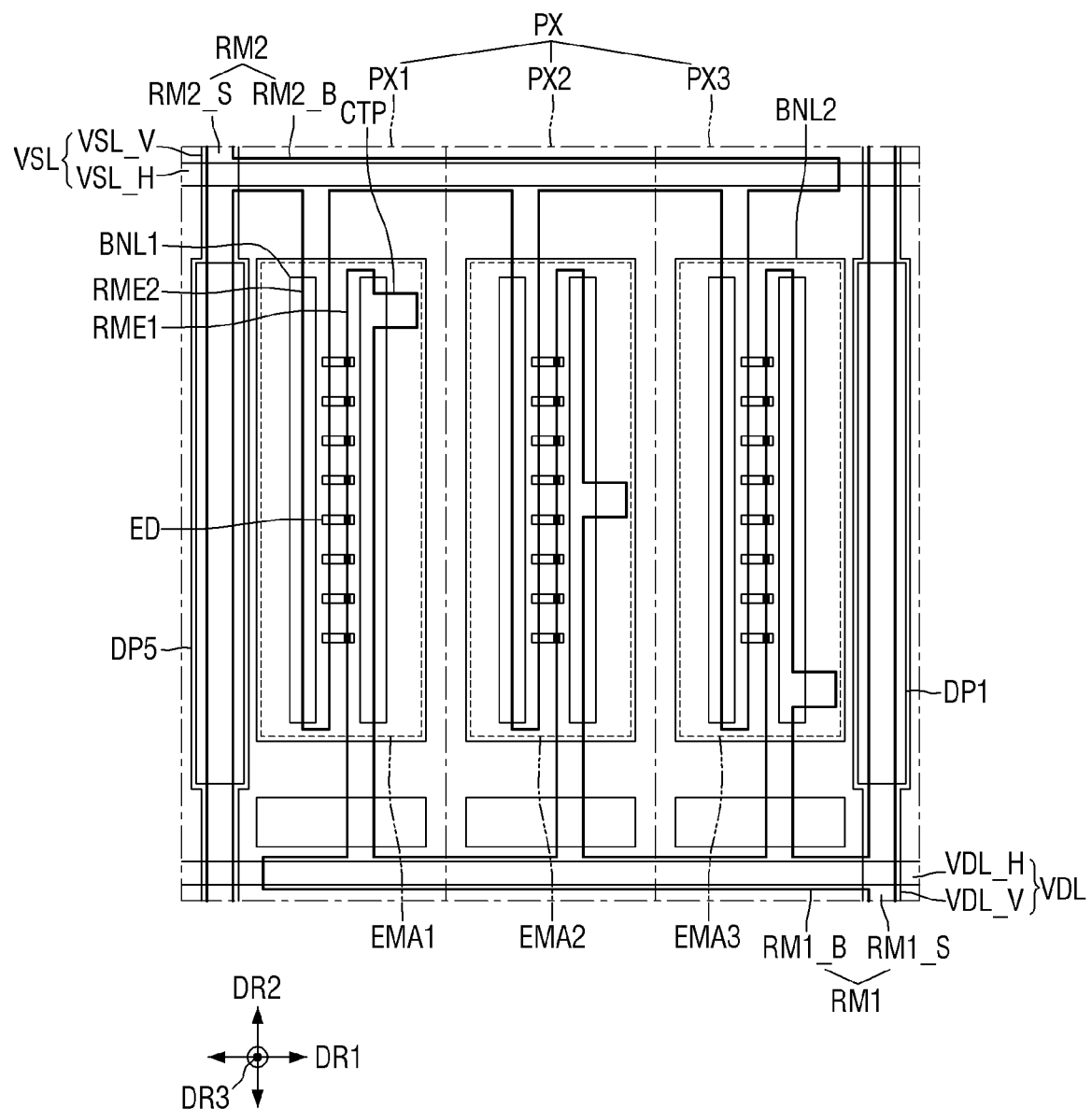
Figure 16:
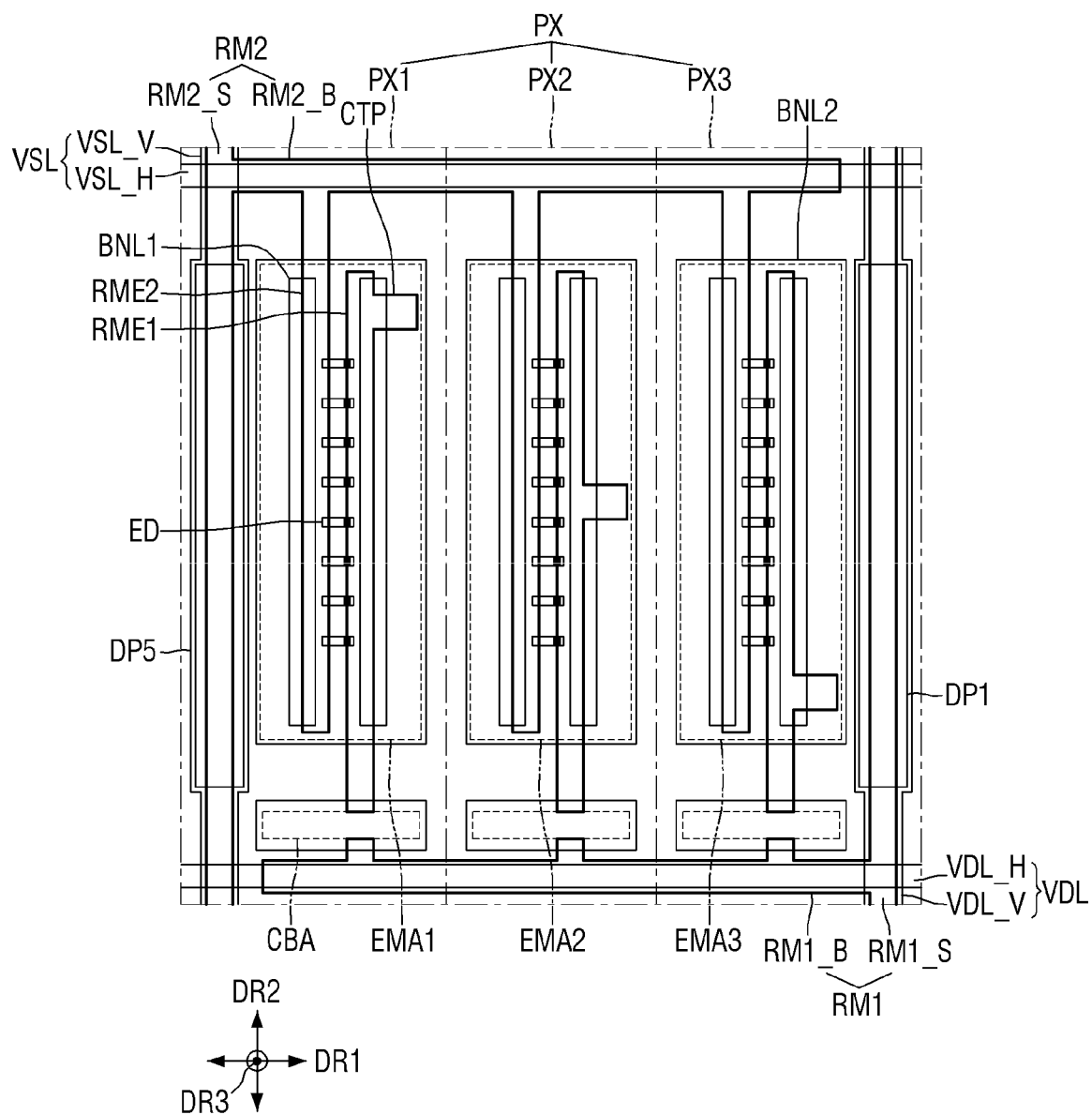

FIGS. 14 through 16 are plan views sequentially illustrating the process of manufacturing the display device 10 according to some embodiments. In FIGS. 14 through 16, a process of forming the electrode lines RM1 and RM2 and the electrodes RME1 and RME2, and then separating the electrode lines RM1 and RM2 from the electrodes RME1 and RME2 after aligning the light emitting elements ED, is illustrated.

First, referring to FIGS. 14 and 15, in the manufacturing process of the display device 10, the electrode lines RM1 and RM2 are formed, and signals are transmitted to the electrode lines RM1 and RM2 to align the light emitting elements ED in the emission area EMA1, EMA2 or EMA3 of each subpixel PXn. During the manufacturing process, the electrode branch portions RM1_B and RM2_B may be formed to be connected to the first electrodes RME1 and the second electrodes RME2, respectively. The first electrodes RME1 may extend in the direction DR2 beyond the cut areas CBA (see FIG. 16) and may be connected to the first electrode branch portion RM1_B outside the emission areas EMA1 through EMA3. The electrode stem portions RM1_S and RM2_S may extend in the second direction DR2 to the pad area PDA outside the display area DPA. The electrode stem portions RM1_S and RM2_S may be connected to the wiring pads of the pad area PDA to receive alignment signals from an external device.

In some embodiments, the light emitting elements ED dispersed in ink may be prepared and sprayed to the emission area EMA1, EMA2 or EMA3 of each subpixel PXn through an inkjet printing process. The second bank BNL2 may prevent or reduce the risk of the ink overflowing to the emission areas EMA1 through EMA3 of other neighboring subpixels PXn. When the ink is sprayed to the emission areas EMA1 through EMA3, alignment signals are transmitted to the first electrode line RM1 and the second electrode line RM2 to generate an electric field on the electrodes RME1 and RME2. The light emitting elements ED dispersed in the ink are changed in their position and orientation direction by an electrophoretic force due to the electric field. Thus, both ends of each light emitting element ED may be respectively on different electrodes RME1 and RME2. In some embodiments, once the light emitting elements ED are placed, the second insulating layer PAS2 is formed to fix the light emitting elements ED.

During the manufacturing process of the display device 10, alignment signals for aligning the light emitting elements ED may be transmitted to the first electrode line RM1 and the second electrode line RM2. The first electrodes RME1 and the second electrodes RME2 provided in a plurality of subpixels PXn may be connected to the same electrode lines RM1 and RM2, respectively, and the signals for aligning the light emitting elements ED may be substantially simultaneously (or concurrently) transmitted to the subpixels PXn.

In some embodiments, because the electrode lines RM1 and RM2 and the voltage wirings VDL and VSL are outside the emission areas EMA1 through EMA3 in each pixel PX, it is possible to prevent or reduce the generation of an electric field in an unwanted (or undesirable) area in the emission areas EMA1 through EMA3 by wirings that otherwise may be arranged under the electrodes RME1 and RME2. The light emitting elements ED sprayed to the emission areas EMA1 through EMA3 may be placed at a desired position by an electric field generated on the electrodes RME1 and RME2, and may be prevented (or protected) from being displaced to a position other than the position on the electrodes RME1 and RME2 by an electric field generated by the wirings that otherwise may be arranged under the electrodes RME1 and RME2.

In some embodiments, the first electrode line RM1 and the second electrode line RM2 may be connected to the first voltage wiring VDL and the second voltage wiring VSL, respectively, and the voltage wirings VDL and VSL and the electrode lines RM1 and RM2 may form an equipotential in response to alignment signals transmitted to the electrode lines RM1 and RM2. In the display device 10, because the voltage wirings VDL and VSL under the electrodes RME1 and RME2 have a different electric potential, it is possible to prevent or reduce a change in the direction and intensity of an electric field generated on the electrodes RME1 and RME2, and/or prevent or reduce an electric field from being generated in an unwanted (or undesirable) area by the wirings under the electrodes RME1 and RME2.

Next, referring to FIG. 16, the process of separating the first electrodes RME1 from the first electrode line RM1 in the cut areas CBA is performed. The separation process is achieved by removing a portion connecting the first electrode RME1 and the first electrode branch portion RM1_B from each cut area CBA. As the first electrodes RME1 are separated from the first electrode line RM1, they might not be directly connected to the first voltage wiring VDL, but may be connected to the first voltage wiring VDL through the first transistors T1. During the manufacturing process of the display device 10, an alignment signal is directly transmitted to the first electrodes RME1 through the first electrode line RM1. However, during the driving of the display device 10, the first power supply voltage applied to the first voltage wiring VDL may be transmitted to the first electrode RME1 through the first transistor T1 of each subpixel PXn. For example, while an alignment signal is substantially simultaneously (or concurrently) transmitted to the first electrodes RME1 in a plurality of subpixels PXn during the manufacturing process, each first electrode RME1 may be driven individually by the first transistor T1 of each subpixel PXn during the driving of the display device 10.

In some embodiments, the contact electrodes CNE1 and CNE2 are formed to contact the light emitting elements ED and the electrodes RME1 and RME2. Through the above processes, the display device 10 according to some embodiments may be manufactured. In the display device 10, the voltage wirings VDL and VSL may be placed outside the emission areas EMA1 through EMA3 in each pixel PX and may be connected to the electrode lines RM1 and RM2. Therefore, the placement of the light emitting elements ED in an unwanted area can be prevented or reduced.

Other embodiments of the display device 10 will now be described with reference to other drawings.

Figure 17:
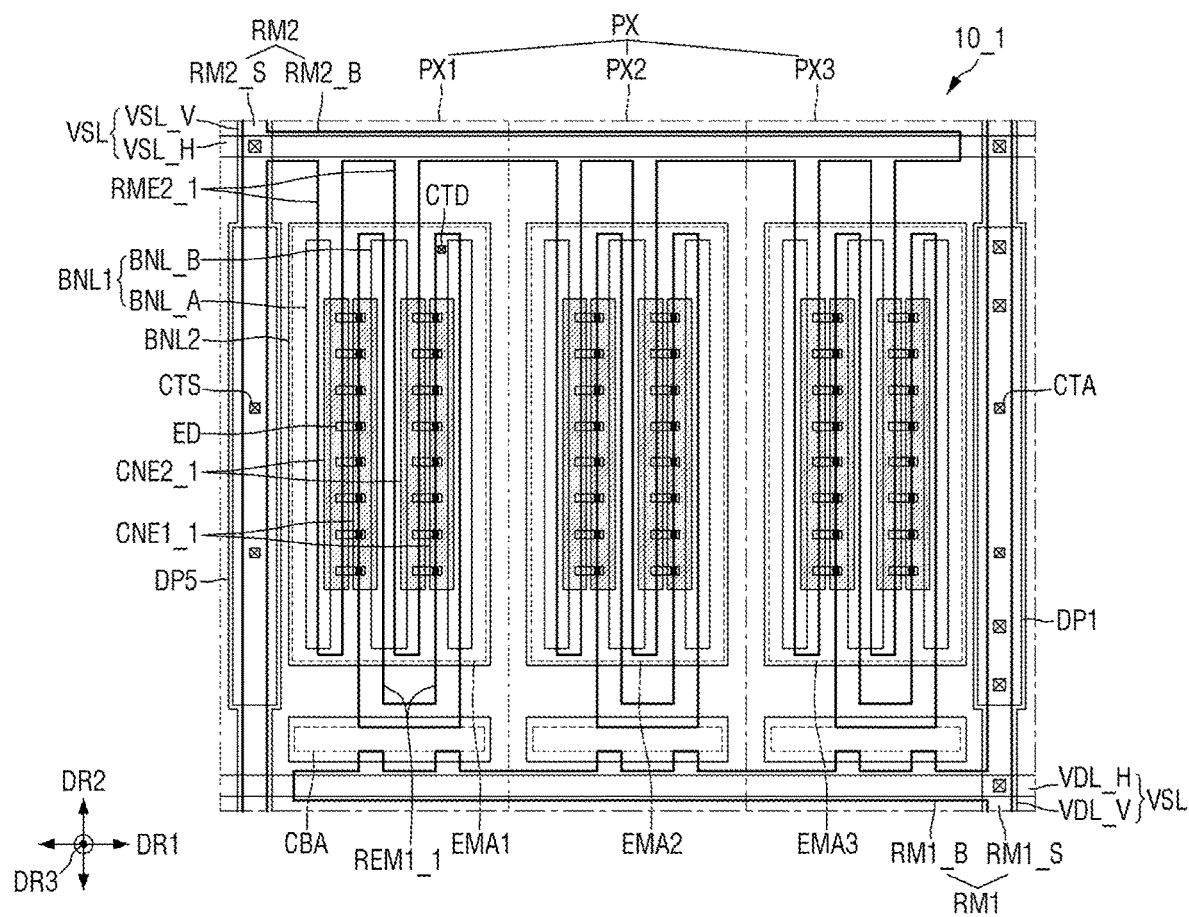
FIG. 17 is a schematic plan view of a plurality of electrodes and a plurality of banks included in one pixel of a display device according to some embodiments.
Figure 18:
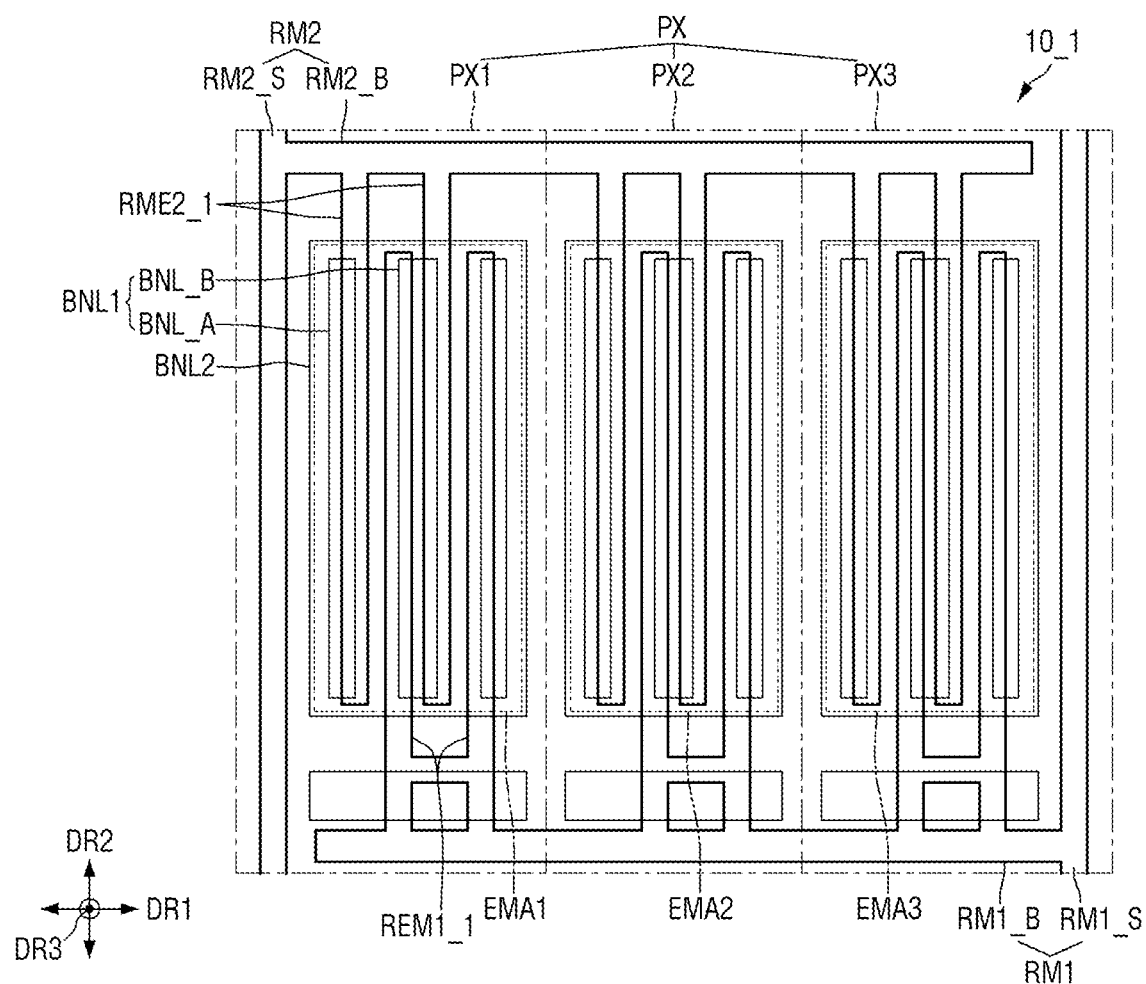
FIGS. 18 and 19 are plan views illustrating some acts of a process of manufacturing the display device of FIG. 17.
Figure 19:
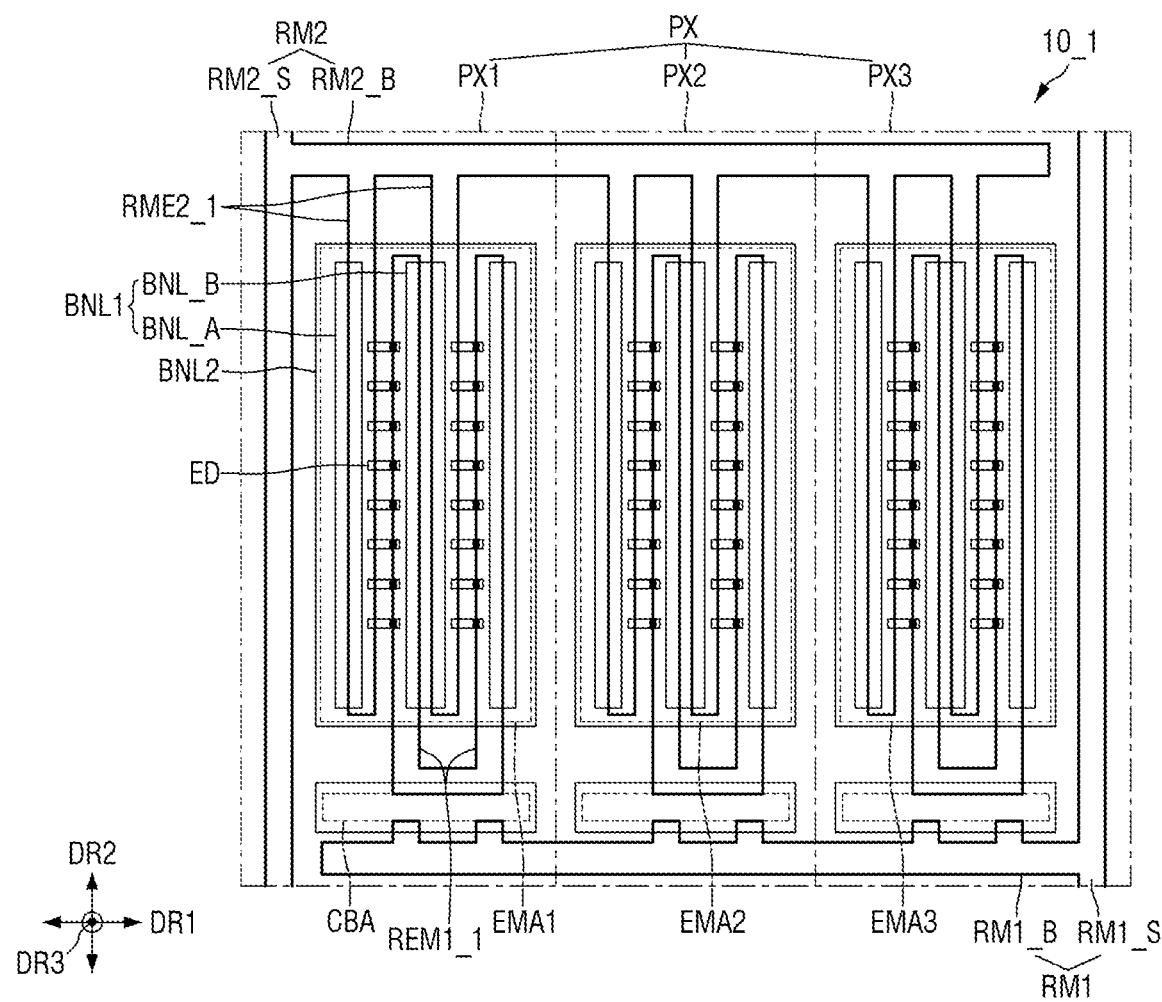

FIG. 17 is a schematic plan view of a plurality of electrodes and a plurality of banks included in one pixel PX of a display device 10_1 according to some embodiments. FIGS. 18 and 19 are plan views illustrating portion of a process of manufacturing the display device 10_1 of FIG. 17. In FIGS. 17 through 19, only voltage wirings VDL and VSL, electrode lines RM1 and RM2, and electrodes RME1_1 and RME2_1 are illustrated for ease of description.

Referring to FIGS. 17 through 19, the display device 10_1 according to some embodiments may include more electrodes RME1_1 and RME2_1 and more light emitting elements ED in each subpixel PXn. For example, each subpixel PXn may include two first electrodes RME1_1 and two second electrodes RME2_1 arranged alternately. The current example is different from the example of FIG. 7 in that more electrodes are provided in each subpixel PXn.

As more electrodes RME1_1 and RME2_1 are provided in each subpixel PXn, more first banks BNL1 may be provided. The first banks BNL1 may include a plurality of first sub banks BNL_A and a second sub bank BNL_B between them. The first sub banks BNL_A may extend in the second direction DR2, like the first banks BNL1 of FIG. 7, and the first and second electrodes RME1_1 and RME2_1 may be on the first sub banks BNL_A, respectively. The second sub bank BNL_B may be between the first sub banks BNL_A and may have a greater width than the first sub banks BNL_A. Different electrodes RME1_1 and RME2_1 may be on both sides of the second sub bank BNL_B in the first direction DR1 and may be spaced apart from each other on the second sub bank BNL_B. However, the present disclosure is not limited thereto, and the sub banks BNL_A and BNL_B may also have substantially the same width.

In each subpixel PXn, a plurality of first electrodes RME1_1 and a plurality of second electrodes RME2_1 may be provided. The first electrodes RME1_1 may extend in the second direction DR2 and may be connected to each other through a connection portion adjacent to a cut area CBA. Of the first electrodes RME1_1, any one first electrode RME1_1 may be electrically connected to a first transistor T1 under the first electrode RME1_1 through a first electrode contact hole CTD. Although the first electrode RME1_1 is illustrated in the drawings as not having an electrode contact portion CTP, the present disclosure is not limited thereto. The second electrodes RME2_1 may extend in the second direction DR2 and may be connected to a second electrode line RM2. The first electrodes RME1_1 and the second electrodes RME2_1 may be spaced apart from each other in the first direction DR1 and may be alternately arranged. Light emitting elements ED may be on each of the first electrodes RME1_1 and the second electrodes RME2_1. Because more light emitting elements ED are provided in each subpixel PXn, the amount of light emission per unit area may increase.

In some embodiments, in each subpixel PXn, a plurality of first contact electrodes CNE1_1 and a plurality of second contact electrodes CNE2_1 are provided. The first contact electrodes CNE1_1 may be on different first electrodes RME1_1, respectively, and the second contact electrodes CNE2_1 may be on different second electrodes RME2_1, respectively. The contact electrodes CNE1_1 and CNE2_1 are the same as those described above.

Because the first electrodes RME1_1 are connected to each other through the connection portion, and the second electrodes RME2_1 are connected to the second electrode line RM2, power supply voltages may be substantially simultaneously (or concurrently) applied to the electrodes RME1_1 and RME2_1, respectively. Accordingly, the light emitting elements ED arranged on different first electrodes RME1_1 and different second electrodes RME2_1 may be connected in parallel to each other.

A process of manufacturing the display device 10_1 according to the current example is substantially the same as that described above with reference to FIGS. 14 through 16. The first electrodes RME1_1 may be formed to be connected to a first electrode line RM1, and then may be separated from the first electrode line RM1 in the cut area CBA after the light emitting elements ED are placed. Here, if the first electrodes RME1_1 are separated from each other, a power supply voltage might not be applied to the light emitting elements ED on any one first electrode RME1_1. Therefore, the first electrodes RME1_1 separated in the cut area CBA may be connected to each other.

Figure 20:
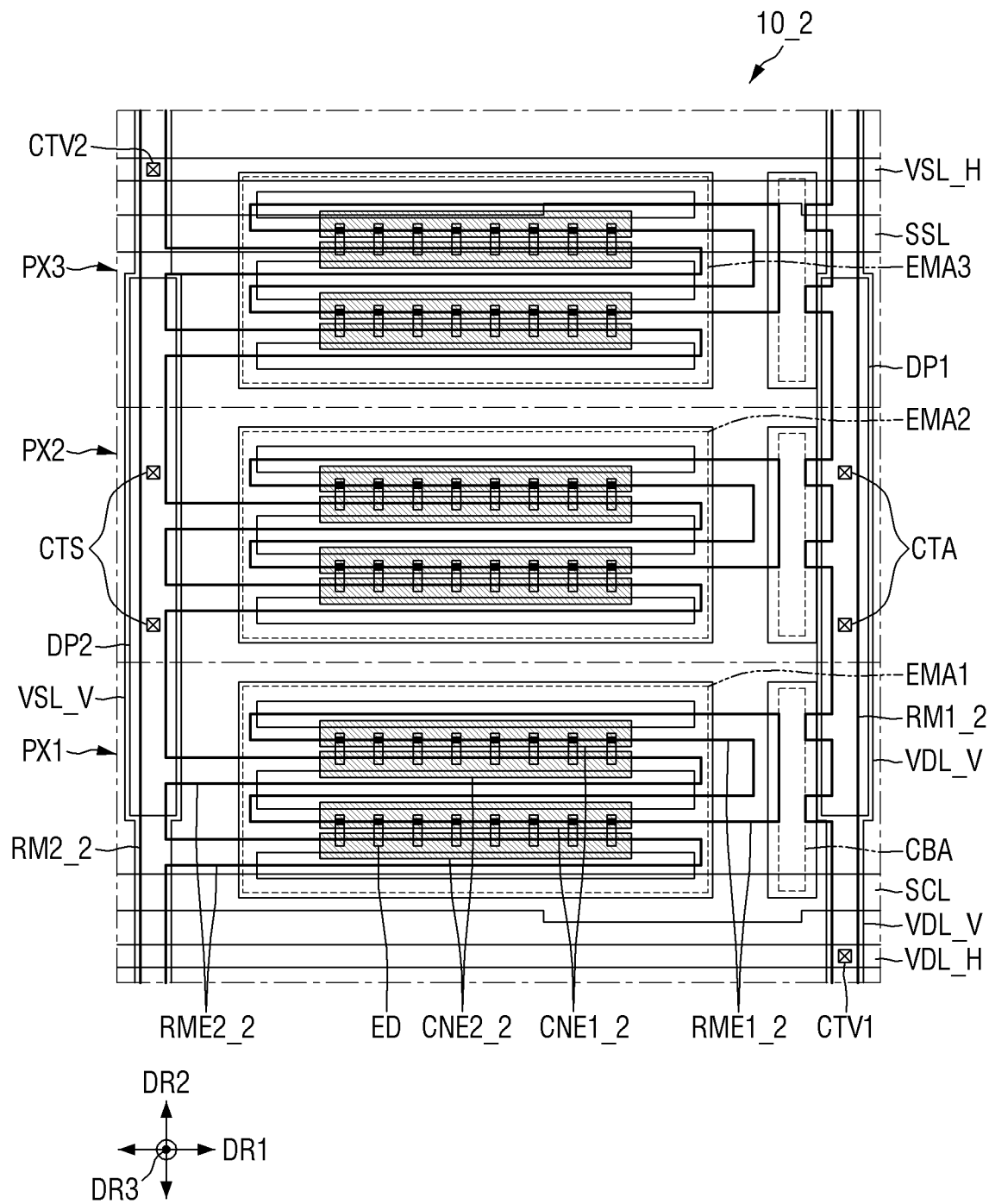
FIG. 20 is a schematic plan view of a plurality of electrodes and a plurality of banks included in one pixel of a display device according to some embodiments.

FIG. 20 is a schematic plan view of a plurality of electrodes and a plurality of banks included in one pixel PX of a display device 10_2 according to some embodiments.

Referring to FIG. 20, in the display device 10_2 according to some embodiments, electrodes RME1_2 and RME2_2 in each subpixel PXn may extend in the first direction DR1 and may be spaced apart from each other in the second direction DR2. Electrode lines RM1_2 and RM2_2 may omit electrode branch portions RM1_B and RM2_B, respectively, and may extend in the second direction DR2 in portions overlapping wiring vertical portions VDL_V and VSL_V. First electrodes RME1_2 may be separated in a cut area CBA from a first electrode line RM1_2 extending in the second direction DR2, and second electrodes RME2_2 may be directly connected to a second electrode line RM2_2 extending in the second direction DR2.

A plurality of voltage wirings VDL and VSL extend in the first direction DR1 and the second direction DR2, and the subpixels PXn in one pixel PX share the same voltage wirings VDL and VSL. Therefore, the direction and arrangement of each subpixel PXn can be variously suitably changed. The voltage wirings VDL and VSL may be on the periphery of one pixel PX to surround emission areas EMA1 through EMA3, and the emission areas EMA1 through EMA3 may be arranged in various directions in the pixel PX. The current example is different from the example of FIG. 17 in that the electrodes RME1_2 and RME2_2 extend in the first direction DR1 because the subpixels PXn in each pixel PX are arranged in the second direction DR2. Because the electrode lines RM1_2 and RM2_2 are connected to the voltage wirings VDL and VSL through a first conductive pattern DP1 and a fifth conductive pattern DP5 in portions extending in the second direction DR2, they may be connected in the same way as in the above example even if the arrangement of the subpixels PX is changed. Other details are the same as those described above, and thus a redundant description thereof is not provided.

Figure 21:
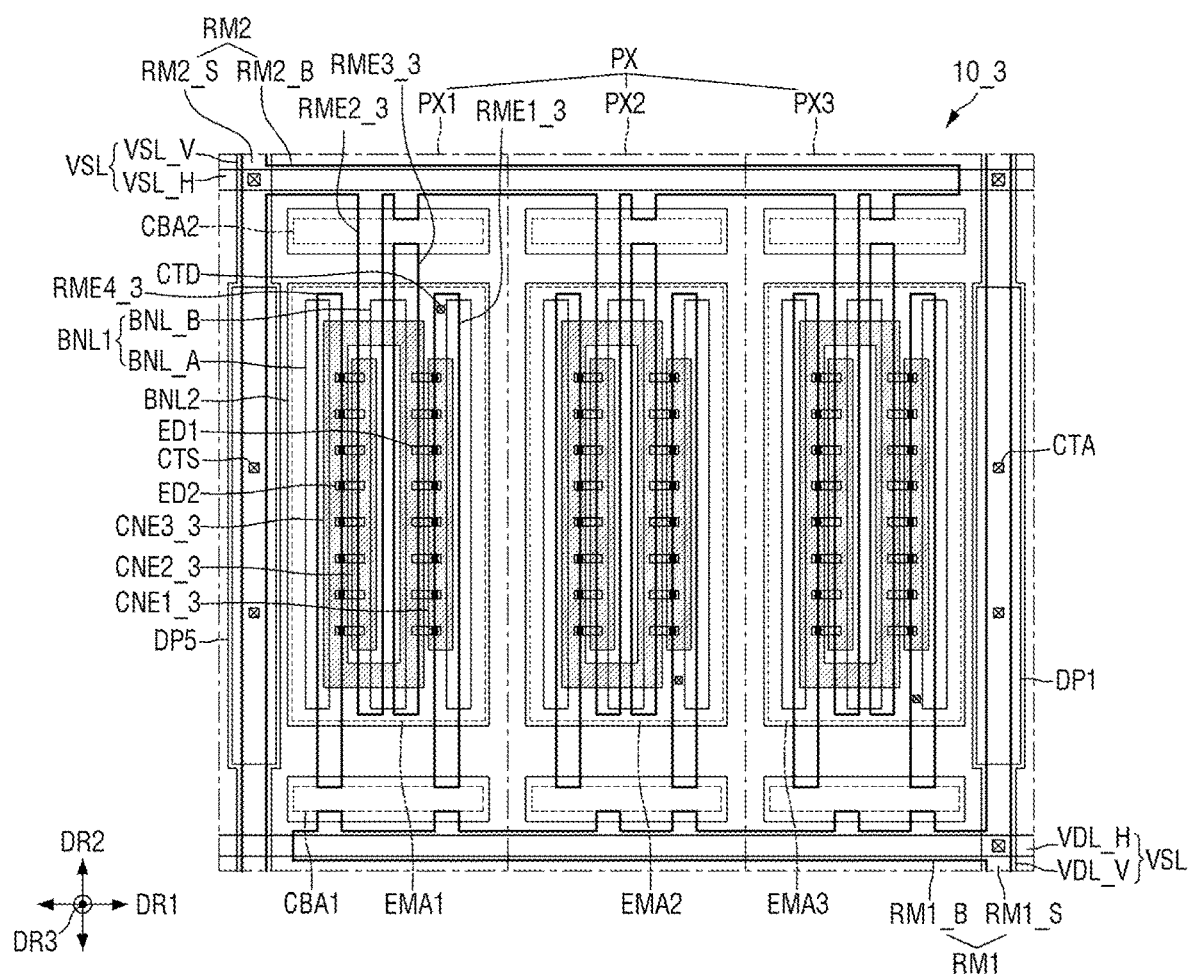
FIG. 21 is a schematic plan view of a plurality of electrodes and a plurality of banks included in one pixel of a display device according to some embodiments.

FIG. 21 is a schematic plan view of a plurality of electrodes and a plurality of banks included in one pixel PX of a display device 10_3 according to some embodiments.

Referring to FIG. 21, the display device 10_3 according to some embodiments may include electrodes RME1_3 through RME4_3 arranged in each subpixel PXn and separated from each other. Each subpixel PXn may include a third electrode RME3_3 between a first electrode RME1_3 and a second electrode RME2_3, and a fourth electrode RME4_3 spaced apart from the third electrode RME3_3 with the second electrode RME2_3 interposed between them. The first electrode RME1_3 may be connected to a first transistor T1 through a first electrode contact hole CTD, and the second electrode RME2_3 may be connected to a second electrode line RM2. The third electrode RME3_3 and the fourth electrode RME4_3 might not be connected to a circuit layer under them. The current example is different from the example of FIG. 7 in that it further includes other electrodes separated from the first electrode RME1_3 and the second electrode RME2_3.

For example, the first electrode RME1_3 may be on a first sub bank BNL_A, and the second electrode RME2_3 may be on a side of a second sub bank BNL_B. The third electrode RME3_3 may be on the other side of the second sub bank BNL_B, and the fourth electrode RME4_3 may be on another first sub bank BNL_A. The electrodes RME1_3 through RME4_3 may extend in the second direction DR2 but may be spaced apart from each other in the first direction DR1, and light emitting elements ED may be provided on them.

The first electrode RME1_3 and the fourth electrode RME4_3 may be connected to a first electrode line RM1 and then separated from the first electrode line RM1 after an alignment process of the light emitting elements ED. Similarly, the third electrode RME3_3 may be connected to the second electrode line RM2 and then separated from the second electrode line RM2 in a subsequent process. According to some embodiments, each subpixel PXn may include a first cut area CBA1 and a second cut area CBA2 respectively positioned on both sides of an emission area EMA in the second direction DR2. The first electrode RME1_3 and the fourth electrode RME4_3 may be separated from the first electrode line RM1 in the first cut area CBA1, and the third electrode RME3_3 may be separated from the second electrode line RM2 in the second cut area CBA2. Accordingly, the third electrode RME3_3 and the fourth electrode RME4_3 might not be directly connected to the circuit layer under them, except for the first electrode RME1_3 having the first electrode contact hole CTD.

The light emitting elements ED may include first light emitting elements ED1 having first ends on the first electrode RME1_3 and second ends on the third electrode RME3_3, and second light emitting elements ED2 having first ends on the fourth electrode RME4_3 and second ends on the second electrode RME2_3. The first ends of the first light emitting elements ED1 and the first ends of the second light emitting elements ED2 may face in opposite directions.

Because the display device 10 includes more electrodes RME1_3 through RME4_3, it may include more contact electrodes CNE1_3 through CNE3_3.

In some embodiments, the contact electrodes CNE1_3 through CNE3_3 may include a first contact electrode CNE1_3 on the first electrode RME1_3, a second contact electrode CNE2_3 on the second electrode RME2_3, and a third contact electrode CNE3_3 on the third electrode RME3_3 and the fourth electrode RME4_3 to surround the second contact electrode CNE2_3.

The first contact electrode CNE1_3 is on the first electrode RME1_3 to contact the first ends of the first light emitting elements ED1. The second contact electrode CNE2_3 is on the second electrode RME2_3 to contact the second ends of the second light emitting elements ED2. The first contact electrode CNE1_3 and the second contact electrode CNE2_3 may respectively contact the electrodes RME1_3 and RME2_3 connected to the first transistor T1 and a second voltage wiring VSL.

In each subpixel PXn, the electrodes RME3_3 and RME4_3 not having the first and second electrode contact holes CTD and CTS are further provided. They may substantially be electrodes to which an electrical signal is not directly transmitted from the first transistor T1 or the second voltage wiring VSL. However, the third contact electrode CNE3_3 may be on the electrodes RME3_3 and RME4_3, and electrical signals transmitted to the light emitting elements ED1 and ED2 may flow through the third contact electrode CNE3_3.

The third contact electrode CNE3_3 may be on the third electrode RME3_3 and the fourth electrode RME4_3 and may surround the second contact electrode CNE2_3. The third contact electrode CNE3_3 may include portions extending in the second direction DR2 and a portion connecting these portions and extending in the first direction DR1 so as to surround the second contact electrode CNE2_3. The portions of the third contact electrode CNE3_3 extending in the second direction DR2 may contact the third electrode RME3_3 and the fourth electrode RME4_3, respectively. For example, of the third contact electrode CNE3_3, a portion on the third electrode RME3_3 may contact the second ends of the first light emitting elements ED1, and a portion on the fourth electrode RME4_3 may contact the first ends of the second light emitting elements ED2. In some embodiments, the third contact electrode CNE3_3 may contact each of the third electrode RME3_3 and the fourth electrode RME4_3, and a floating state of the third and fourth electrodes RME3_3 and RME4_3 may be prevented or reduced, even if the third and fourth electrodes RME3_3 and RME4_3 are not connected to a third conductive layer.

An electrical signal transmitted from the first contact electrode CNE1_3 to the first ends of the first light emitting elements ED1 is transmitted to the third contact electrode CNE3_3 that contacts the second ends of the first light emitting elements ED1. The third contact electrode CNE3_3 may transmit the electrical signal to the first ends of the second light emitting elements ED2, and the electrical signal may be transmitted to the second electrode RME2_3 through the second contact electrode CNE2_3. Accordingly, the electrical signal for light emission of the light emitting elements ED may be transmitted only to one first electrode RME1_3 and one second electrode RME2_3, and the first light emitting elements ED1 and the second light emitting elements ED2 may be connected in series to each other through the third contact electrode CNE3_3.

Although a case where the voltage wirings VDL and VSL and the electrode lines RM1 and RM2 are in each pixel PX has been described in the above embodiments, the present disclosure is not limited thereto. According to some embodiments, in the display device 10, some of the voltage wirings VDL and VSL and the electrode lines RM1 and RM2 might not be repeatedly arranged on a pixel-by-pixel basis, but may be alternately arranged. In some embodiments, pixels PX sharing one voltage wiring VDL and/or VSL, and/or one electrode line RM1 and/or RM2, may be included.

FIGS. 22 through 25 are schematic views illustrating the arrangement of voltage wirings VDL and VSL and electrode lines RM1 and RM2 in a plurality of pixels PX of display devices 10_4 through 10_7 according to embodiments. FIGS. 22 through 25 schematically illustrate the pixels PX separated by the voltage wirings VDL and VSL and the electrode lines RM1 and RM2 and the arrangement of electrodes RME1 and RME2 and light emitting elements ED in subpixels PXn of each pixel PX.

Figure 22:
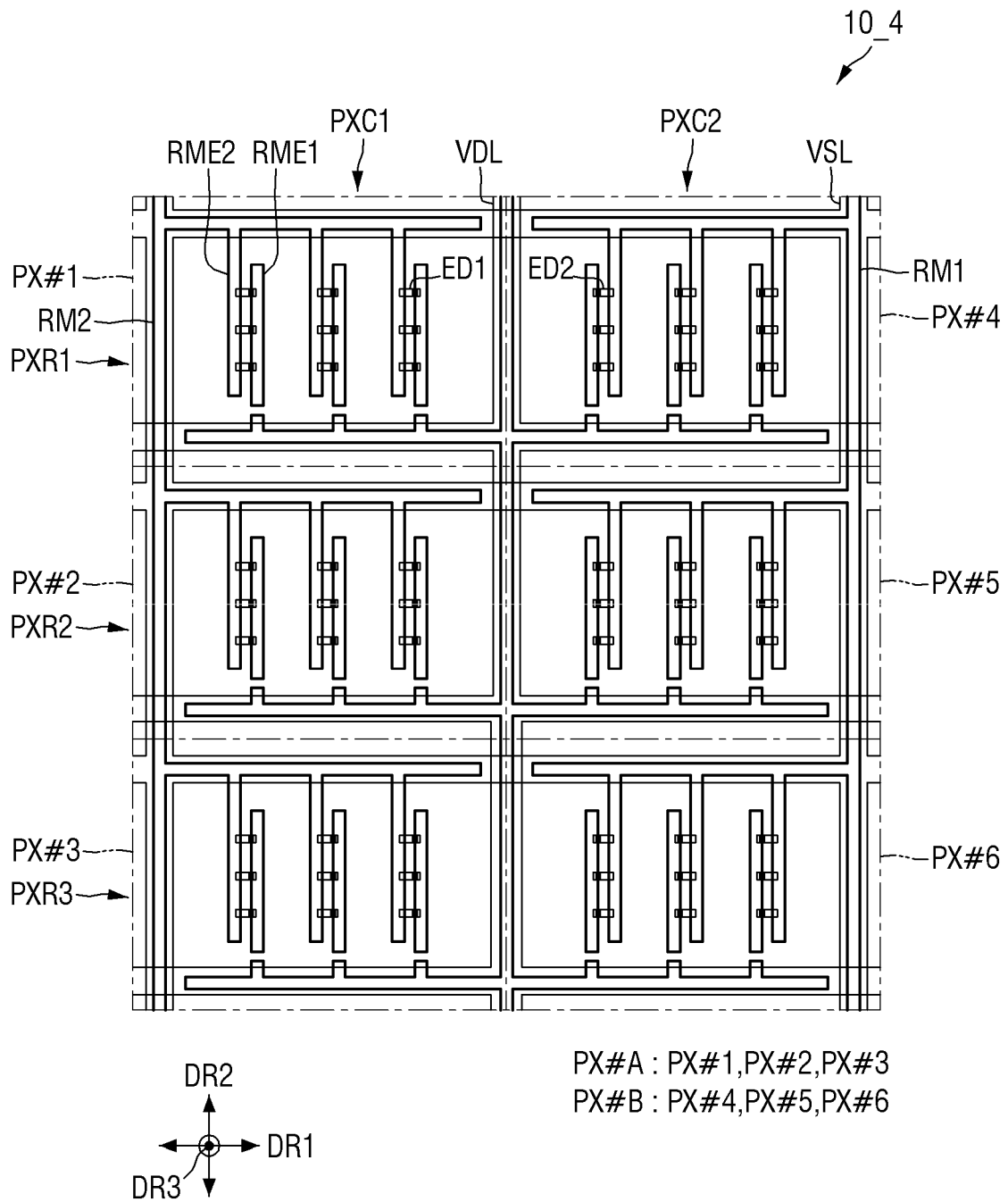
FIGS. 22 through 25 are schematic views illustrating the arrangement of voltage wirings and electrode lines in a plurality of pixels of display devices according to embodiments.

First, referring to FIG. 22, in the display device 10_4 according to some embodiments, pixels PX in a first pixel column PXC1 and a second pixel column PXC2 may share the same voltage wiring VDL or VSL. Because the pixels PX of the first pixel column PXC1 and the second pixel column PXC2 adjacent in the first direction DR1 share one voltage wiring VDL or VSL, only one wiring vertical portion VDL_V or VSL_V may be placed between them.

In FIG. 22, one first wiring vertical portion VDL_V is between the pixels PX of the first pixel column PXC1 and the second pixel column PXC2. In some embodiments, only one second wiring vertical portion VSL_V may be between different pixel columns PXC. A portion where a first voltage wiring VDL is shared will be described below as an example.

Unlike in the example of FIG. 12, the first wiring vertical portion VDL_V and the second wiring vertical portion VSL_V may be alternately arranged along the first direction DR1 on a pixel-by-pixel basis. For example, only the first wiring vertical portion VDL_V may be between the first pixel column PXC1 and the second pixel column PXC2, and only the second wiring vertical portion VSL_V may be between the second pixel column PXC2 and another pixel column PXC adjacent to the second pixel column PXC2 in the first direction DR1. The current example is different from the example of FIG. 12 in that pixels PX of pixel columns PXC adjacent in the first direction DR1 share the first wiring vertical portion VDL_V.

As in the example of FIG. 12, pixels PX in the same pixel row PXR may share the same wiring horizontal portions VDL_H and VSL_H. However, in the current example, pixels PX in different pixel columns PXC may share the same wiring vertical portion VDL_V or VSL_V. Because in FIG. 22, the pixels PX of the first pixel column PXC1 and the second pixel column PXC2 share the first wiring vertical portion VDL_V, a first electrode line RM1 overlapping the first wiring vertical portion VDL_V in the thickness direction may also be shared by the pixels PX of the first pixel column PXC1 and the second pixel column PXC2. One first electrode stem portion RM1_S or one second electrode stem portion RM2_S may be between the first pixel column PXC1 and the second pixel column PXC2, and pixels PX of different pixel columns PXC adjacent in the first direction DR1 may share the same electrode stem portion RM1_S or RM2_S. In the pixels PX in the same pixel row PXR, different electrode branch portions RM1_B or RM2_B branching from the same electrode stem portion RM1_S or RM2_S may be provided. In each pixel PX in the first pixel column PXC1, a first electrode branch portion RM1_B branching toward the second side of the first direction DR1 and a second electrode branch portion RM2_B branching toward the first side of the first direction DR1 may be provided. In each pixel PX in the second pixel column PXC2, a first electrode branch portion RM1_B branching toward the first side of the first direction DR1 and a second electrode branch portion RM2_B branching toward the second side of the first direction DR1 may be provided. Because the electrode branch portions RM1_B and RM2_B in different pixel columns PXC extend in different directions, positions of the electrodes RME1 and RME2 may also be different in each subpixel PXn.

For example, in first through third pixels PX #1 through PX #3, which are pixels PX in the first pixel column PXC1, a second electrode RME2 may be on a left side of a center of each subpixel PXn, and a first electrode RME1 may be on a right side of the center of each subpixel PXn, as in the example of FIG. 12. Light emitting elements ED in the subpixels PXn of the first through third pixels PX #1 through PX #3 may be first light emitting elements ED1 whose first ends face the first side of the first direction DR1. On the other hand, in fourth through sixth pixels PX #4 through PX #6, which are pixels PX in the second pixel column PXC2, a first electrode RME1 may be on a left side of a center of each subpixel PXn, and a second electrode RME2 may be on a right side of the center of each subpixel PXn. Light emitting elements ED in the subpixels PXn of the fourth through sixth pixels PX #4 through PX #6 may be second light emitting elements ED2 whose first ends face the second side of the first direction DR1. In the display device 10_4 according to some embodiments, because pixels PX of neighboring pixel columns PXC share the voltage wiring VDL or VSL and the electrode line RM1 or RM2, they may include different types of pixels PX #A and PX #B in which the arrangement of the electrodes RME1 and RME2 and the light emitting elements ED of each subpixel PXn is different. For example, the first through third pixels PX #1 through PX #3 may be first type pixels PX #A, in which the first ends of the light emitting elements ED face the first side of the first direction DR1, and the fourth through sixth pixels PX #4 through PX #6 may be second type pixels PX #B, in which the first ends of the light emitting elements ED face the second side of the first direction DR1. The first type pixels PX #A and the second type pixels PX #B may be symmetrical to each other in the arrangement of the light emitting elements ED and the electrodes RME1 and RME2 with respect to an imaginary line extending in the second direction DR2 between the first type pixels PX #A and the second type pixels PX #B.

In the current example, because the voltage wirings VDL and VSL and the electrode lines RM1 and RM2 are not repeatedly arranged on a pixel-by-pixel basis, but are alternately arranged, neighboring pixels PX may share the voltage wiring VDL or VSL and the electrode line RM1 or RM2. Accordingly, the number of wirings per unit area can be reduced, which is advantageous in implementing an ultra-high resolution display device. Furthermore, because the voltage wirings VDL and VSL and the electrode lines RM1 and RM2 are alternately arranged, the display device 10_4 may include different types of pixels PX #A and PX #B based on the arrangement of the light emitting elements ED and the electrodes RME1 and RME2.

Figure 23:
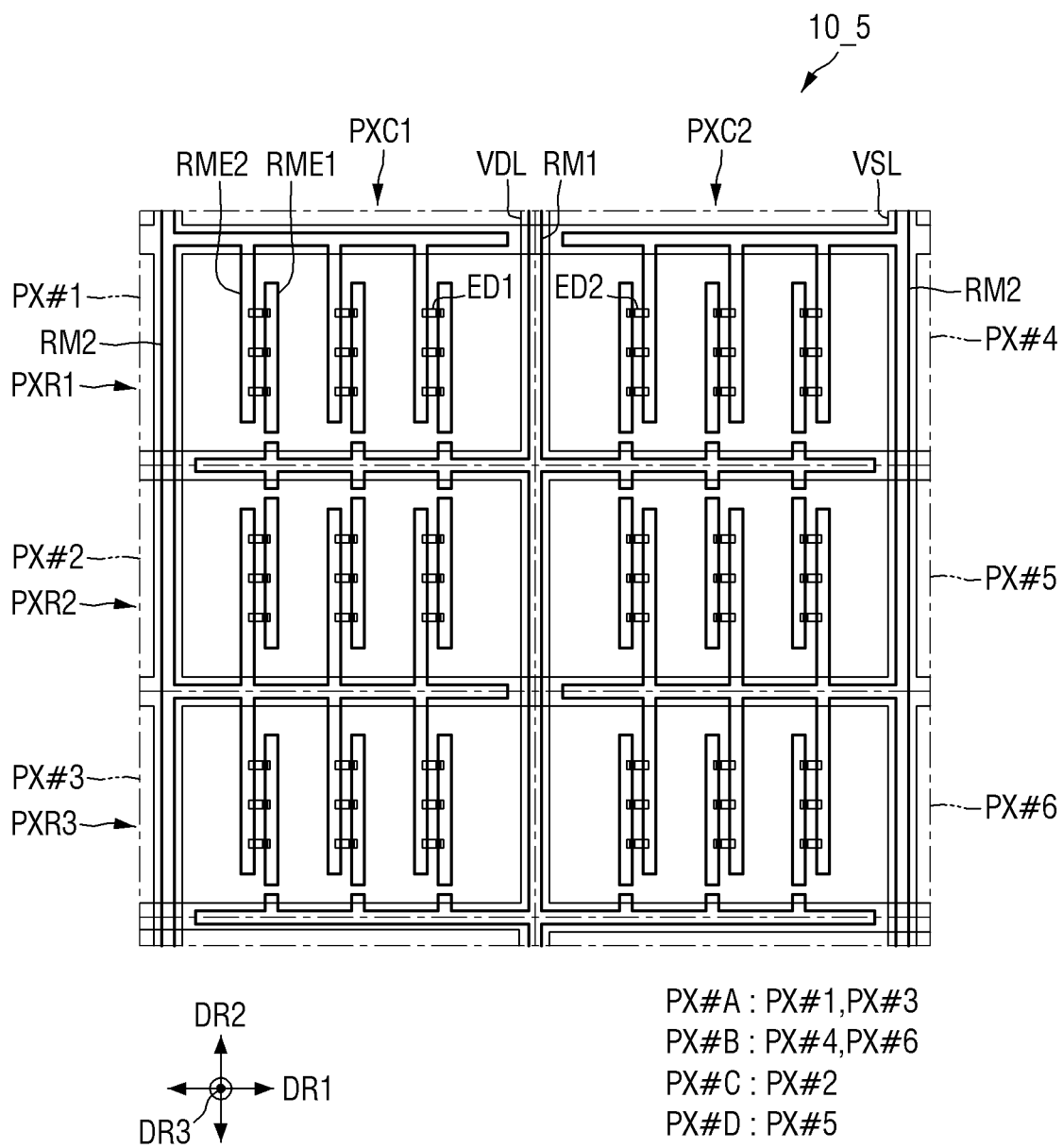
Figure 24:
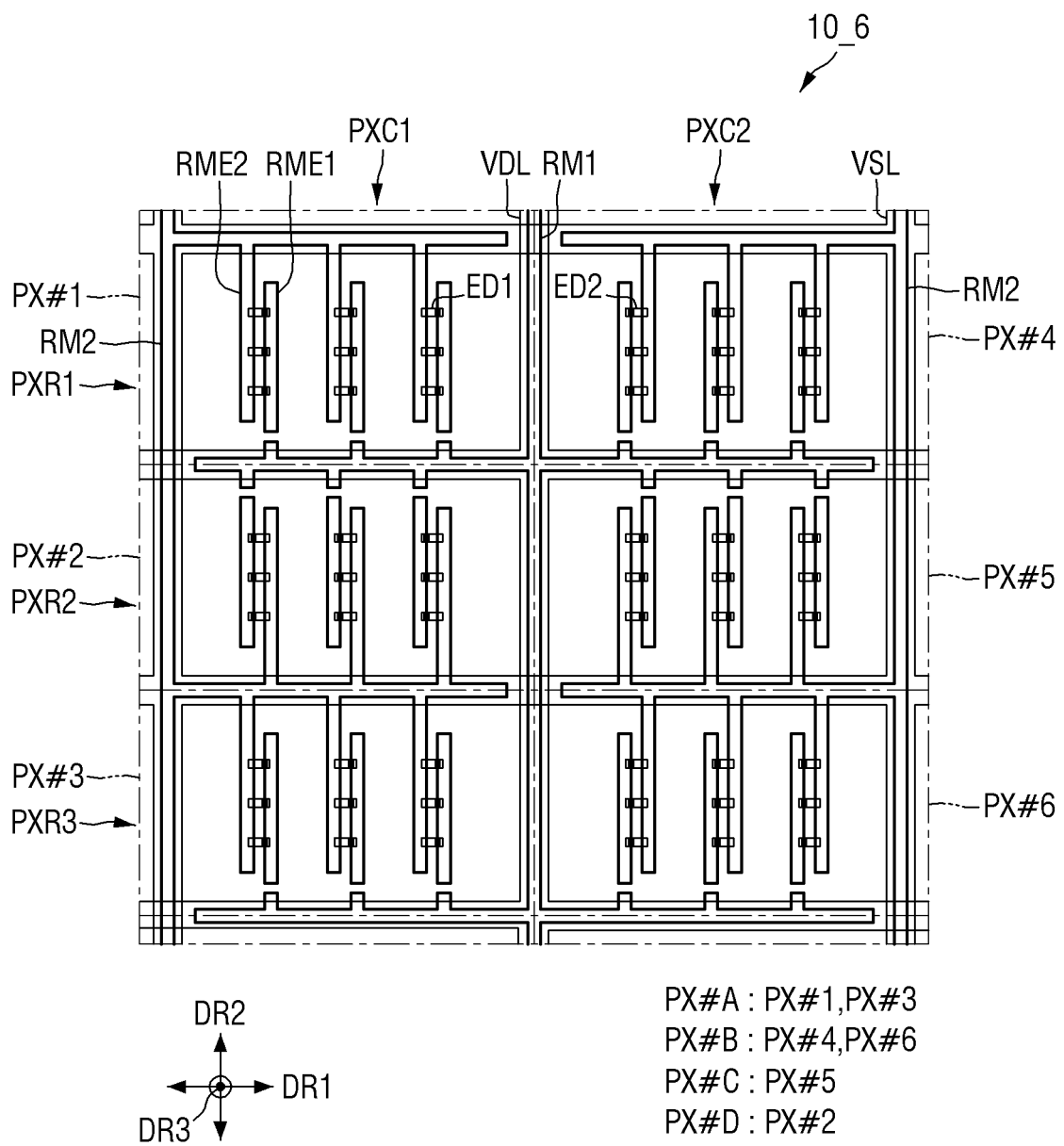
Figure 25:
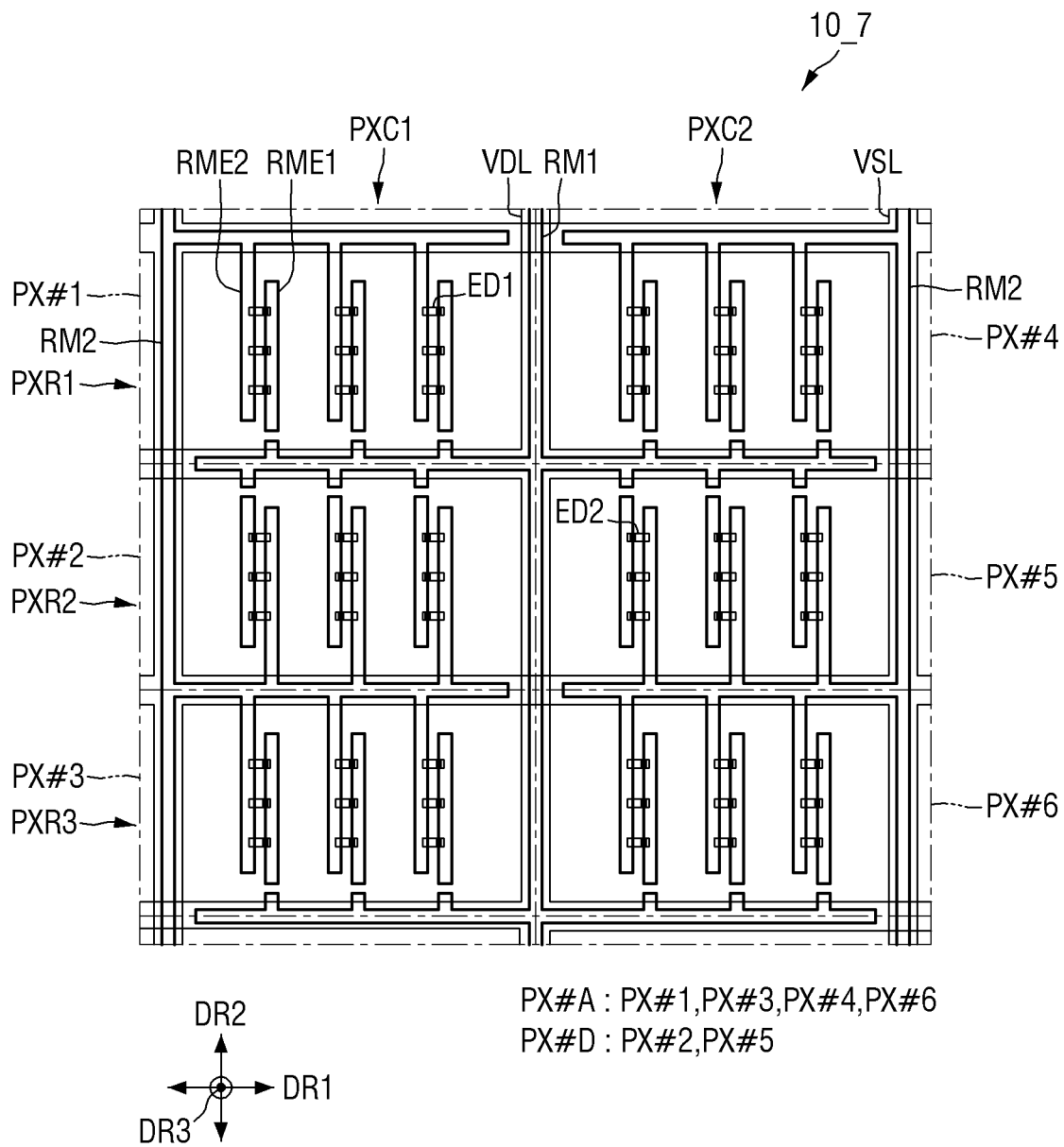

Next, referring to FIGS. 23 through 25, in the display devices 10_5 through 10_7 according to some embodiments, pixels PX in neighboring pixel rows PXR may share the same voltage wiring VDL or VSL and the same electrode line RM1 or RM2. One wiring horizontal portion VDL_H or VDL_H and one electrode branch portion RM1_B or RM2_B may be shared by pixels PX in a first pixel row PXR1 and a second pixel row PXR2 adjacent in the second direction DR2, and by pixels PX in the second pixel row PXR2 and a third pixel row PXR3 adjacent in the second direction DR2. Therefore, one wiring horizontal portion VDL_H or VDL_H and one electrode branch portion RM1_B or RM2_B may be provided between them. The embodiments of FIGS. 23 through 25 are different from the example of FIG. 22 in that neighboring pixel rows PXR are also to share the voltage wiring VDL or VSL and the electrode line RM1 or RM2.

Unlike in the example of FIG. 22, a first wiring horizontal portion VDL_H and a second wiring horizontal portion VDL_H may be alternately arranged along the second direction DR2 on a pixel-by-pixel basis. For example, only the first wiring horizontal portion VDL_H may be between the first pixel row PXR1 and the second pixel row PXR2, and only the second wiring horizontal portion VSL_H may be between the second pixel row PXR2 and the third pixel row PXR3. Because pixels PX of different pixel rows PXR share the wiring horizontal portion VDL_H or VSL_H, they may also share the electrode line RM1 or RM2 overlapping the wiring horizontal portion VDL_H or VSL_H in the thickness direction.

For example, one first electrode branch portion RM1_B may be between the first pixel row PXR1 and the second pixel row PXR2 of each pixel column PXC, and one second electrode branch portion RM2_B may be between the second pixel row PXR2 and the third pixel row PXR3. Pixels PX of different pixel rows PXR adjacent in the second direction DR2 may share the same electrode branch portion RM1_B or RM2_B. However, as in the example of FIG. 22, different electrode branch portions RM1_B or RM2_B branching from the same electrode stem portion RM1_S or RM2_S may be provided in pixels PX in the same pixel row PXR.

Because pixels PX neighboring in the second direction DR2 share the electrode branch portion RM1_B or RM2_B, positions of electrodes RME1 and RME2 may be different in each subpixel PXn.

First, in the display device 10_5 according to some embodiments of FIG. 23, electrodes RME1 or RME2 connected to one electrode branch portion RM1_B or RM2_B and in different pixels PX may be side by side in the second direction DR2. For example, first electrodes RME1 in a first pixel row PXR1 of a first pixel column PXC1 and first electrodes RME1 in a second pixel row PXR2 of the first pixel column PXC1 may lie on the same lines in the second direction DR2. Accordingly, the first electrodes RME1 of a first pixel PX #1 and a second pixel PX #2 may be side by side. Similarly, second electrodes RME2 in the second pixel row PXR2 of the first pixel column PXC1 and second electrodes RME2 in a third pixel row PXR3 of the first pixel column PXC1 may lie on the same lines in the second direction DR2, and the second electrodes RME2 of the second pixel PX #2 and the third pixel PX #3 may be side by side. Electrodes RME1 and RME2 of fourth through sixth pixels PX #4 through PX #6 may also be arranged in a similar way to the above.

The first pixel PX #1 and the third pixel PX #3 may be first type pixels PX #A, and the fourth pixel PX #4 and the sixth pixel PX #6 may be second type pixels PX #B, as in the example of FIG. 22. However, the second pixel PX #2 may be different from a first type pixel PX #A. This is because while the first electrodes RME1 are on a right side and the second electrodes RME2 are on a left side in the second pixel PX #2 so that first ends of light emitting elements ED face the first side of the first direction DR1, the first electrode RME1 is separated from a first electrode line RM1 on an upper side of each subpixel PXn, and the second electrode RME2 is connected to a second electrode line RM2 on a lower side of each subpixel PXn. In some embodiments, the fifth pixel PX #5 may be different from a second type pixel PX #B. This is because while the first electrodes RME1 are on the left side and the second electrodes RME2 are on the right side in the fifth pixel PX #5 so that the first ends of the light emitting elements ED face the second side of the first direction DR1, the first electrode RME1 is separated from the first electrode line RM1 on the upper side of each subpixel PXn, and the second electrode RME2 is connected to the second electrode line RM2 on the lower side of each subpixel PXn.

The display device 10_5 may further include different types of pixels according to the arrangement of the electrode lines RM1 and RM2 from or to which the electrodes RME1 and RME2 are separated or connected, in addition to the direction in which the first ends of the light emitting elements ED face and the arrangement of the electrodes RME1 and RME2. In some embodiments, the second pixel PX #2 may be a third type pixel PX #C, and the fifth pixel PX #5 may be a fourth type pixel PX #D. A third type pixel PX #C may be symmetrical to a first type pixel PX #A in the arrangement of the light emitting elements ED and the electrodes RME1 and RME2 with respect to an imaginary line extending in the first direction DR1 between the third type pixel PX #C and the first type pixel PX #A. In some embodiments, a fourth type pixel PX #D may be symmetrical to a second type pixel PX #B in the arrangement of the light emitting elements ED and the electrodes RME1 and RME2 with respect to an imaginary line extending in the first direction DR1 between the fourth type pixel PX #D and the second type pixel PX #B.

However, the present disclosure is not limited thereto. Even if the electrodes RME1 or RME2 are separated from or connected to the same electrode line RM1 or RM2, they may also be staggered instead of being arranged side by side.

Referring to FIG. 24, in the display device 10_6, electrodes RME1 or RME2 connected to one electrode branch portion RM1_B or RM2_B and in different pixels PX may be staggered in the second direction DR2. For example, first electrodes RME1 in a first pixel row PXR1 of a first pixel column PXC1 may be staggered with respect to first electrodes RME1 in a second pixel row PXR2 of the first pixel column PXC1 in the second direction DR2, and may lie on the same lines as second electrodes RME2 in the second direction DR2. Accordingly, the first electrodes RME1 of a first pixel PX #1 and the second electrodes RME2 of a second pixel PX #2 may be arranged side by side. Similarly, the second electrodes RME2 of the second pixel PX #2 and first electrodes RME1 of a third pixel PX #3 may be arranged side by side. Electrodes RME1 and RME2 of fourth through sixth pixels PX #4 through PX #6 may also be arranged in a similar way to the above.

The first and third pixels PX #1 and PX #3 and the fourth and sixth pixels PX #4 and PX #6 may respectively be first type pixels PX #A and second type pixels PX #B as in the example of FIG. 23. However, the second pixel PX #2 may be a fourth type pixel PX #D, like the fifth pixel PX #5 of FIG. 23, and the fifth pixel PX #5 may be a third type pixel PX #C, like the second pixel PX #2 of FIG. 23. The current example is different from the example of FIG. 23 in the arrangement of the electrodes RME1 and RME2 separated from or connected to electrode lines RM1 and RM2.

Separation and connection positions of the electrodes RME1 and RME2 in neighboring pixel rows PXR are different, even if different electrode branch portions RM1_B and RM2_B are in neighboring pixel columns PXC, and the arrangement of the electrodes RME1 and RME2 separated from or connected to the electrode branch portions RM1_B and RM2_B may be the same.

Referring to FIG. 25, in the display device 10_7, the arrangement of first and second electrodes RME1 and RME2 of each subpixel PXn in plan view may be the same in pixels PX in a first pixel column PXC1 and pixels PX in a second pixel column PXC2. In this case, pixels PX in the same pixel row PXR may be the same type of pixels even if they are in different pixel columns PXC. For example, a first pixel PX #1 and a fourth pixel PX #4 in a first pixel row PXR1 may be first type pixels PX #A. A second pixel PX #2 and a fifth pixel PX #5 in a second pixel row PXR2 may be fourth type pixels PX #D, and a third pixel PX #3 and a sixth pixel PX #6 in a third pixel row PXR3 may be first type pixels PX #A.

In the display device 10 according to some embodiments, the arrangement of voltage wirings VDL and VSL and electrode lines RM1 and RM2 in a mesh structure may be modified so that neighboring pixels PX can share the same wiring or line, and different types of pixels PX in which the arrangement of light emitting elements ED and the electrodes RME1 and RME2 is different may be included.

Figure 26:
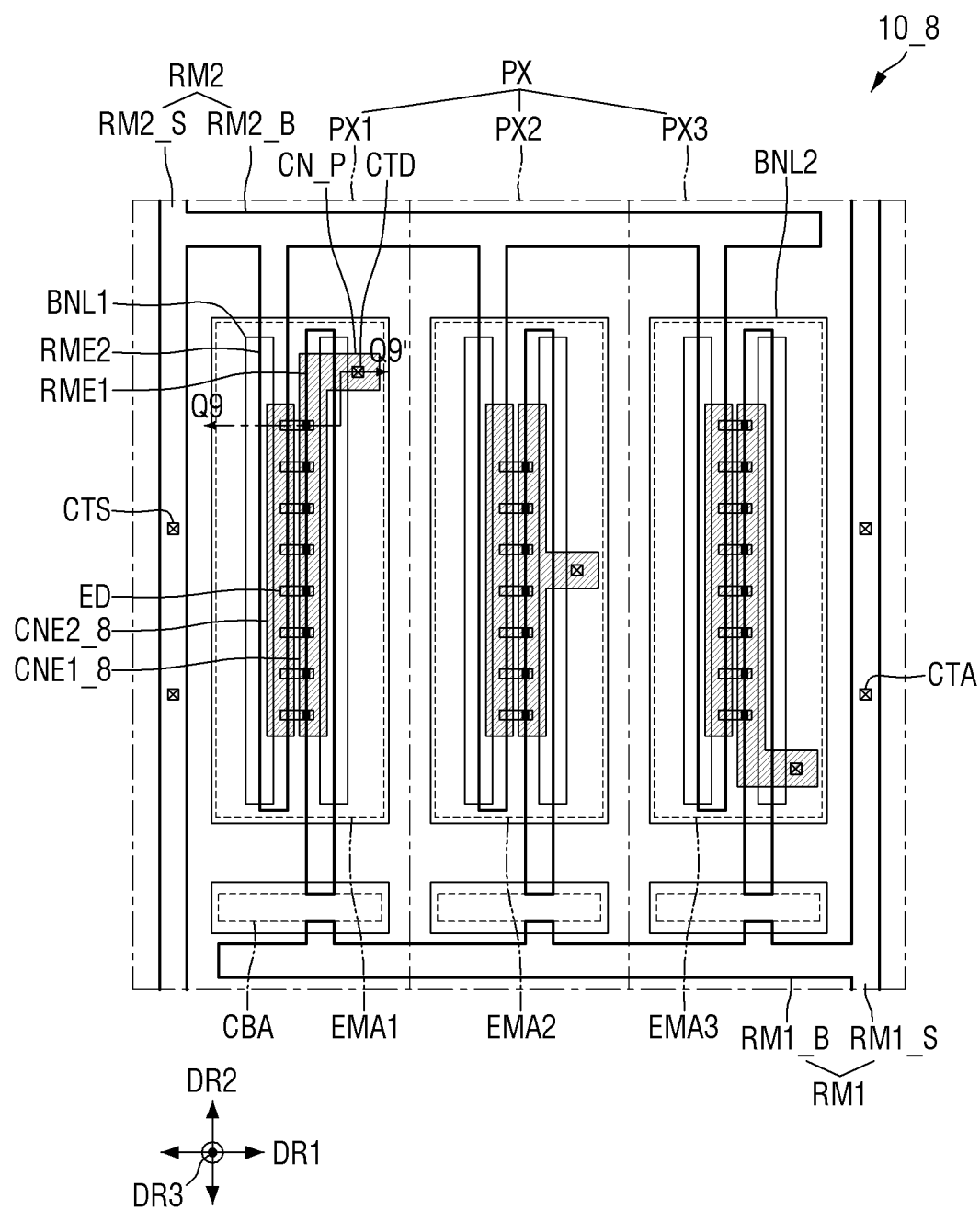
FIG. 26 is a schematic plan view of a plurality of electrodes and a plurality of banks included in one pixel of a display device according to some embodiments.
Figure 27:
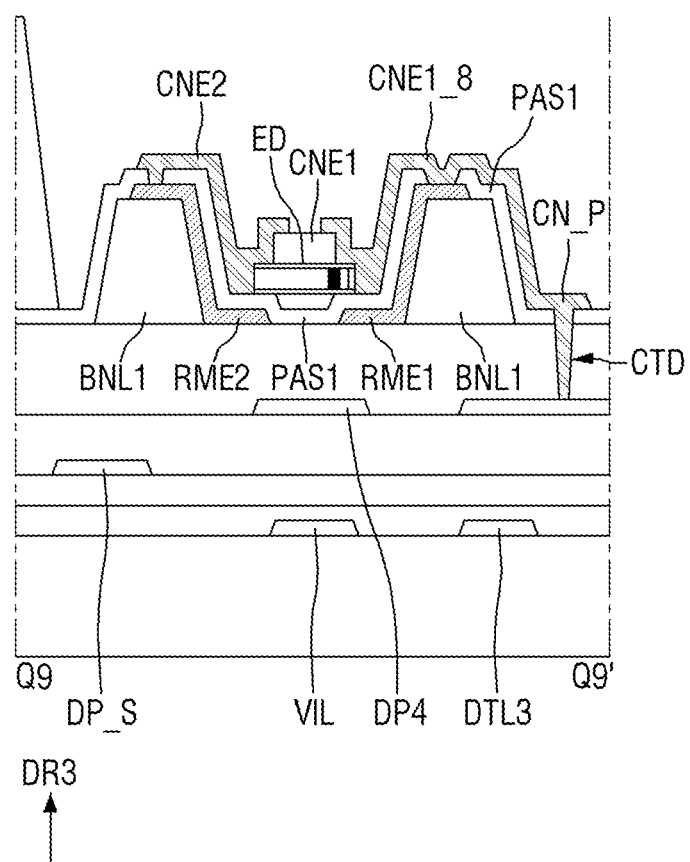
FIG. 27 is a cross-sectional view taken along line Q9-Q9' of FIG. 26.

FIG. 26 is a schematic plan view of a plurality of electrodes and a plurality of banks included in one pixel PX of a display device 10_8 according to some embodiments. FIG. 27 is a cross-sectional view taken along line Q9-Q9' of FIG. 26.

Referring to FIGS. 26 and 27, in the display device 10_8 according to some embodiments, a first contact electrode CNE1_8 may be directly connected to a second capacitive electrode CSE2 or a connected extension electrode portion EP. A first electrode RME1 may omit an electrode contact portion CTP, and the first contact electrode CNE1_8 may include a contact electrode contact portion CN_P. The contact electrode contact portion CN_P may directly contact the extension electrode portion EP or the second capacitive electrode CSE2 through a first electrode contact hole CTD formed in each subpixel PXn. The current example is different from the example of FIGS. 7 and 8 in that the first electrode RME1 and the first contact electrode CNE1_8 are electrically connected to a first transistor T1 through the contact electrode contact portion CN_P. Other details are the same as those described above, and thus a redundant description thereof is not provided.

In a display device according to some embodiments, voltage wirings and electrode lines are outside of emission areas. Therefore, the electrode lines, and the voltage wirings under the electrode lines, may form an equipotential during a manufacturing process, thereby preventing or reducing the risk of light emitting elements being moved out of place. In some embodiments, in the display device, because a pair of voltage wirings are provided in each pixel, a plurality of subpixels can share the same voltage wirings, and the number of wirings per unit area can be reduced, which is advantageous in implementing an ultra-high resolution display device.

In concluding the detailed description, those skilled in the art will appreciate that many variations and modifications can be made to the disclosed embodiments without substantially departing from the principles of the present disclosure as defined by the following claims and equivalents thereof. Therefore, the disclosed embodiments of the present disclosure are used in a generic and descriptive sense only and not for purposes of limitation.

What is claimed is:

1. A display device comprising:
a pixel comprising emission areas;
a first voltage wiring and a second voltage wiring outside the emission areas of the pixel, and extending both in a first direction and in a second direction crossing the first direction;
first electrodes and second electrodes in the emission areas and extending in one direction;
light emitting elements on the first electrodes and the second electrodes;
first contact electrodes contacting the first electrodes and the light emitting elements;
second contact electrodes contacting the second electrodes and the light emitting elements;
a first electrode line overlapping the first voltage wiring and being outside the emission areas; and
a second electrode line overlapping the second voltage wiring and being outside the emission areas,
wherein the first electrodes and the first electrode line are electrically connected to the first voltage wiring, and
wherein the second electrodes and the second electrode line are electrically connected to the second voltage wiring.

2. The display device of claim 1, wherein the first voltage wiring comprises a first wiring horizontal portion extending in the first direction, and a first wiring vertical portion extending in the second direction, and
wherein the second voltage wiring comprises a second wiring horizontal portion extending in the first direction, and a second wiring vertical portion extending in the second direction.

3. The display device of claim 2, wherein the first wiring vertical portion is on a different conductive layer than the first wiring horizontal portion, and
wherein the second wiring vertical portion is on a different conductive layer than the second wiring horizontal portion.

4. The display device of claim 3, further comprising:
a first wiring contact hole at an intersection of the first wiring horizontal portion and the first wiring vertical portion; and
a second wiring contact hole at an intersection of the second wiring horizontal portion and the second wiring vertical portion.

5. The display device of claim 2, wherein the first wiring vertical portion is on a side of the emission areas in the first direction,
wherein the second wiring vertical portion is on another side of the emission areas in the first direction,
wherein the second wiring horizontal portion is on a side of the emission areas in the second direction, and
wherein the first wiring horizontal portion is on another side of the emission areas in the second direction.

6. The display device of claim 2, wherein the first electrode line overlaps the first wiring vertical portion in a thickness direction of the display device,
wherein the second electrode line overlaps the second wiring vertical portion in the thickness direction, and
wherein the second electrodes are directly connected to the second electrode line.

7. The display device of claim 6, wherein the first electrodes and the second electrodes extend in the first direction, and
wherein the first electrodes are spaced apart from the first electrode line, and are electrically connected to the first voltage wiring through a first electrode contact hole.

8. The display device of claim 6, further comprising:
a first conductive pattern overlapping the first wiring vertical portion and connected to the first wiring vertical portion; and
a second conductive pattern overlapping the second wiring vertical portion and connected to the second wiring vertical portion,
wherein the second electrode line contacts the second conductive pattern through a second electrode contact hole overlapping the second conductive pattern, and
wherein the first electrode line contacts the first conductive pattern through a third electrode contact hole overlapping the first conductive pattern.

9. The display device of claim 6, wherein the first electrode line comprises a first electrode stem portion extending in the second direction, and a first electrode branch portion branching from the first electrode stem portion in the first direction, wherein the second electrode line comprises a second electrode stem portion extending in the second direction, and a second electrode branch portion branching from the second electrode stem portion in the first direction, and wherein the first electrode branch portion and the second electrode branch portion respectively overlap the first wiring horizontal portion and the second wiring horizontal portion in the thickness direction.

10. The display device of claim 9, wherein the first electrodes and the second electrodes extend in the second direction, wherein the second electrodes are directly connected to the second electrode branch portion, and wherein the first electrodes are spaced apart from the first electrode branch portion.

11. The display device of claim 1, further comprising cut areas spaced apart from the emission areas in the one direction in which the first electrodes and the second electrodes extend, wherein the first electrodes and the first electrode line are spaced apart with the cut areas therebetween.

12. The display device of claim 1, further comprising:

first banks in the emission areas and extending in the one direction in which the first electrodes and the second electrodes extend; and a second bank surrounding the emission areas, wherein the first voltage wiring and the second voltage wiring overlap the second bank in a thickness direction of the display device.

13. The display device of claim 1, wherein the emission areas comprise a first emission area, a second emission area, and a third emission area spaced apart from each other, wherein the first electrodes and the second electrodes are respectively in the first emission area, the second emission area, and the third emission area, and wherein the second electrodes that are respectively in the emission areas are directly connected to the second electrode line.

14. A display device comprising:

pixels arranged in a first direction in pixel rows, and in a second direction in pixel columns, the second direction crossing the first direction, the pixels comprising emission areas;

a first voltage wiring and a second voltage wiring between the pixel columns and the pixel rows, and extending in the first direction and the second direction;

a first electrode line overlapping the first voltage wiring and connected to the first voltage wiring;

a second electrode line overlapping the second voltage wiring and connected to the second voltage wiring;

first electrodes and second electrodes in the emission areas of the pixels and extending in one direction; and light emitting elements comprising first ends respectively on the first electrodes, and second ends respectively on the second electrodes, wherein the first electrodes are spaced apart from the first electrode line, wherein the second electrodes are connected to the second electrode line, wherein the pixels comprise first type pixels in which the first ends of the light emitting elements face a first side of the first direction, and wherein the first electrodes are spaced apart from the second electrodes in the first direction.

15. The display device of claim 14, wherein the first type pixels are in the second direction in a first pixel column, and wherein the pixels further comprise second type pixels in a second pixel column, in which the first ends of the light emitting elements face a second side of the first direction, the second side facing oppositely away from the first side of the first direction, the second type pixels being symmetrical to the first type pixels in arrangement of the first electrodes and the second electrodes with respect to a first imaginary line extending in the second direction.

16. The display device of claim 15, wherein the pixels further comprise:

third type pixels in which the first ends of the light emitting elements face the first side of the first direction, the third type pixels being symmetrical to the first type pixels in arrangement of the first electrodes and the second electrodes with respect to a second imaginary line extending in the first direction; and fourth type pixels in which the first ends of the light emitting elements face the second side of the first direction, the fourth type pixels being symmetrical to the second type pixels in arrangement of the first electrodes and the second electrodes with respect to the second imaginary line extending in the first direction.

17. The display device of claim 16, wherein the first electrodes of the first type pixels and of the second type pixels are respectively side by side in the second direction with the first electrodes of the third type pixels and of the fourth type pixels.

18. The display device of claim 16, wherein the first type pixels and the third type pixels alternate along the second direction in the first pixel column, and wherein the second type pixels and the fourth type pixels are alternating along the second direction in the second pixel column.

19. The display device of claim 16, wherein the first type pixels and the fourth type pixels alternate along the second direction in the first pixel column, and wherein the second type pixels and the third type pixels alternate along the second direction in the second pixel column.

20. The display device of claim 16, wherein the first type pixels and the fourth type pixels alternate along the second direction in the first pixel column and the second pixel column.

* * * * *